US011646283B2

(12) United States Patent
Hou et al.

(10) Patent No.: US 11,646,283 B2
(45) Date of Patent: May 9, 2023

(54) BONDED ASSEMBLY CONTAINING LOW DIELECTRIC CONSTANT BONDING DIELECTRIC MATERIAL

(71) Applicant: SANDISK TECHNOLOGIES LLC, Addison, TX (US)

(72) Inventors: Lin Hou, Leuven (BE); Peter Rabkin, Cupertino, CA (US); Masaaki Higashitani, Cupertino, CA (US); Ramy Nashed Bassely Said, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/357,120

(22) Filed: Jun. 24, 2021

(65) Prior Publication Data

US 2021/0327838 A1 Oct. 21, 2021

Related U.S. Application Data

(63) Continuation-in-part of application No. 16/774,446, filed on Jan. 28, 2020, now Pat. No. 11,171,097.

(51) Int. Cl.
*H01L 23/00* (2006.01)

(52) U.S. Cl.
CPC .............. *H01L 24/08* (2013.01); *H01L 24/03* (2013.01); *H01L 24/05* (2013.01); *H01L 24/80* (2013.01); *H01L 2224/036* (2013.01); *H01L 2224/05073* (2013.01); *H01L 2224/05561* (2013.01); *H01L 2224/08145* (2013.01); *H01L 2224/80895* (2013.01)

(58) Field of Classification Search
CPC .................... H01L 24/08; H01L 24/83; H01L 2224/05647; H01L 2224/08145
See application file for complete search history.

(56) References Cited

U.S. PATENT DOCUMENTS

| | | | |
|---|---|---|---|
| 5,915,167 | A | 6/1999 | Leedy |
| 10,115,681 | B1 | 10/2018 | Ariyoshi |
| 10,283,493 | B1 | 5/2019 | Nishida |
| 10,354,980 | B1 | 7/2019 | Mushiga et al. |
| 10,354,987 | B1 | 7/2019 | Mushiga et al. |
| 10,381,322 | B1 | 8/2019 | Azuma et al. |

(Continued)

OTHER PUBLICATIONS

Hendon, C.H., et al. "Engineering the optical response of the titanium-MIL-125 metal-organic framework through ligand functionalization." *Journal of the American Chemical Society* 135. 30 (2013): 10942-10945.

(Continued)

*Primary Examiner* — Didarul A Mazumder
(74) *Attorney, Agent, or Firm* — The Marbury Law Group PLLC

(57) ABSTRACT

A first metal layer can be deposited over first dielectric material layers of a first substrate, and can be patterned into first bonding pads. A first low-k material layer can be formed over the first bonding pads. The first low-k material layer includes a low-k dielectric material such as a MOF dielectric material or organosilicate glass. A second semiconductor die including second bonding pads can be provided. The first bonding pads are bonded to the second bonding pads to form a bonded assembly.

10 Claims, 50 Drawing Sheets

(56) References Cited

U.S. PATENT DOCUMENTS

| | | | | |
|---|---|---|---|---|
| 10,381,362 | B1 | 8/2019 | Cui et al. | |
| 10,510,738 | B2 | 12/2019 | Kim et al. | |
| 10,629,616 | B1 | 4/2020 | Kai et al. | |
| 10,665,580 | B1 | 5/2020 | Hosoda et al. | |
| 10,665,581 | B1 | 5/2020 | Zhou et al. | |
| 10,707,228 | B2 | 7/2020 | Yu et al. | |
| 10,714,497 | B1 | 7/2020 | Nishida et al. | |
| 10,727,216 | B1 | 7/2020 | Kai et al. | |
| 10,741,535 | B1 | 8/2020 | Nishikawa et al. | |
| 10,790,296 | B1 | 9/2020 | Yamaha et al. | |
| 10,797,035 | B1 | 10/2020 | Sano et al. | |
| 10,797,062 | B1 | 10/2020 | Nishikawa et al. | |
| 10,804,202 | B2 | 10/2020 | Nishida | |
| 10,811,058 | B2 | 10/2020 | Zhang et al. | |
| 10,854,573 | B2 | 12/2020 | Ji et al. | |
| 10,879,260 | B2 | 12/2020 | Uryu et al. | |
| 10,910,272 | B1 | 2/2021 | Zhou et al. | |
| 10,957,680 | B2 | 3/2021 | Yada et al. | |
| 10,957,705 | B2 | 3/2021 | Totoki et al. | |
| 10,985,169 | B2 | 4/2021 | Kai et al. | |
| 11,004,773 | B2 | 5/2021 | Wu et al. | |
| 11,037,908 | B2 | 6/2021 | Wu et al. | |
| 2014/0353828 | A1* | 12/2014 | Edelstein | H01L 24/03 257/751 |
| 2015/0108644 | A1* | 4/2015 | Kuang | H01L 25/50 257/777 |
| 2016/0079164 | A1* | 3/2016 | Fukuzumi | H01L 27/11582 438/107 |
| 2016/0336619 | A1* | 11/2016 | Choi | H01M 10/052 |
| 2018/0286846 | A1 | 10/2018 | Lin | |
| 2019/0221557 | A1 | 7/2019 | Kim et al. | |
| 2019/0252361 | A1 | 8/2019 | Nishida | |
| 2020/0066745 | A1 | 2/2020 | Yu et al. | |
| 2020/0286815 | A1 | 9/2020 | Moriyama et al. | |
| 2020/0286875 | A1 | 9/2020 | Nishida et al. | |
| 2020/0343161 | A1 | 10/2020 | Wu et al. | |
| 2020/0395350 | A1 | 12/2020 | Wu et al. | |
| 2021/0028148 | A1 | 1/2021 | Wu et al. | |
| 2021/0028149 | A1 | 1/2021 | Makala et al. | |
| 2021/0066317 | A1 | 3/2021 | Wu et al. | |
| 2021/0098029 | A1 | 4/2021 | Kim et al. | |
| 2021/0126008 | A1 | 4/2021 | Tanabe et al. | |
| 2021/0134819 | A1 | 5/2021 | Zhang et al. | |

OTHER PUBLICATIONS

Kramer, M. et al., "Synthesis and properties of the metal-organic framework Mo 3 (BTC) 2 (TUDMOF-1)," *Journal of Materials Chemistry*, vol. 16, No. 23 (2006): pp. 2245-2248.

Krishtab, M. et al., "Vapor-Deposited Zeolitic Imidazolate Frameworks as Gap-Filling Ultra-Low-k Dielectrics," Nature Communications, pp. 1-9, (2019) 10:3729 | https://doi.org/10.1038/s41467-019-11703-x | www.nature.com/naturecommunications.

Liu, C. et al., "Fluxless Soldering of Copper Substrates Using Self-Assembled Monolayers for Preservation," *IEEE Trans on Comp. & Packaging Tech.*, vol. 29, No. 3, pp. 512-521 (2006).

Park, S.J. et al., "A mechanistic study of SF6/O2 reactive ion etching of molybdenum," Citation: Journal of Vacuum Science & Technology B: Microelectronics Processing and Phenomena, vol. 5, pp. 1372-1373, (1987); doi: 10.1116/1.583618 1372-1373.

Perez, E. V. et al., "Origins and Evolution of Inorganic-Based and MOF-Based Mixed-Matrix Membranes for Gas Separations," Processes 2016, vol. 4, No. 32, pp. 1-68; (2016) doi:10.3390/pr4030032, www.mdpi.com/journal/processes.

Ryder, M.0R., et al. "Understanding and controlling the dielectric response of metal-organic frameworks," *ChemPlusChem*, vol. 83.4, pp. 308-316, (2018).

Stassin, T. et al., "Vapour-Phase Deposition of Oriented Copper Dicarboxylate Metal-Organic Framework Thin Films," *Chemical Communications* 55.68 (2019): 10056-10059.

Notification of Transmittal of the International Search Report and Written Opinion of the International Search Authority for International Patent Application No. PCT/US2020/035566, dated Oct. 4, 2020, 9 pages.

Gu, Z.G. et al., "Epitaxial Growth of MOF Thin Film for Modifying the Dielectric Layer in Organic Field-Effect Transistors," (Abstract) ACS Appl. Mater. Interfaces 2017, 9, 8, 7259-7264, Publication Date:Feb. 9, 2017, https://doi.org/10.1021/acsami.6b14541.

Seo, J., "A review on chemical and mechanical phenomena at the wafer interface during chemical mechanical planarization," *Journal of Materials Research*, vol. 36, pp. 235-257 (2021), https://doi.org/10.1557/s43578-020-00060-x.

Banerjee, G. et al., "Chemical Mechanical Planarization: Historical Review and Future Direction," ECS Transactions, vol. 13, No. 4, pp. 1-19 (2008), https://doi.org/10.1149/1.2912973.

Inoue, F. et al., "Fine-pitch bonding technology with surface-planarized solder micro-bump/polymer hybrid for 3D integration," Japanese Journal of Applied Physics, vol. 60, No. 2, pp. 026502 (2021), https://doi.org/10.35848/1347-4065/abd69c.

Messemaeker, J. et al., "Electromigration Behavior of Cu/SiCN to Cu/SiCN Hybrid Bonds for 3D Integrated Circuits," Extended Abstracts of the 2018 International Conference on Solid State Devices and Materials, Tokyo, pp. 449-450, (2018), https://confit.atlas.jp/guide/event-img/ssdm2018/G-1-04/public/pdf_archive?type=in.

He, W. et al., "Cu Barrier Seed Innovation for EM Improvement," ECS Transactions, vol. 60, No. 1, pp. 471-476 (2014), https://doi.org.10.1149/06001.0471ecst.

U.S. Appl. No. 16/682,848, filed Nov. 13, 2019, SanDisk Technologies LLC.

U.S. Appl. No. 16/694,340, filed Nov. 25, 2019, SanDisk Technologies LLC.

U.S. Appl. No. 16/694,400, filed Nov. 25, 2019, SanDisk Technologies LLC.

U.S. Appl. No. 16/694,438, filed Nov. 25, 2019, SanDisk Technologies LLC.

U.S. Appl. No. 16/722,745, filed Dec. 20, 2019, SanDisk Technologies LLC.

U.S. Appl. No. 16/722,824, filed Dec. 20, 2019, SanDisk Technologies LLC.

U.S. Appl. No. 16/728,327, filed Dec. 27, 2019, SanDisk Technologies LLC.

U.S. Appl. No. 16/742,213, filed Jan. 14, 2020, SanDisk Technologies LLC.

U.S. Appl. No. 16/747,943, filed Jan. 21, 2020, SanDisk Technologies LLC.

U.S. Appl. No. 16/774,446, filed Jan. 28, 2020, SanDisk Technologies LLC.

U.S. Appl. No. 16/851,839, filed Apr. 17, 2020, SanDisk Technologies LLC.

U.S. Appl. No. 16/851,908, filed Apr. 17, 2020, SanDisk Technologies LLC.

U.S. Appl. No. 16/825,304, filed Mar. 20, 2020, SanDisk Technologies LLC.

U.S. Appl. No. 16/825,397, filed Mar. 20, 2020, SanDisk Technologies LLC.

U.S. Appl. No. 17/357,040, filed Jun. 24, 2021, SanDisk Technologies LLC.

* cited by examiner

BONDED ASSEMBLY CONTAINING LOW DIELECTRIC CONSTANT BONDING DIELECTRIC MATERIAL

RELATED APPLICATIONS

This application is a continuation-in-part (CIP) application of U.S. application Ser. No. 16/774,446 filed on Jan. 28, 2020, the entire contents of which are incorporated herein by reference.

FIELD

The present disclosure relates generally to the field of semiconductor devices, and particularly to a bonded assembly of semiconductor devices containing a low dielectric constant bonding dielectric and methods for forming the same.

BACKGROUND

A semiconductor memory device may include a memory array and driver circuit located on the same substrate. However, the driver circuit takes up valuable space on the substrate, thus reducing the space available for the memory array.

SUMMARY

According to an aspect of the present disclosure, a bonded assembly comprises a first semiconductor die comprising a first substrate, first semiconductor devices, and first bonding pads that are electrically connected to a respective node of the first semiconductor devices and laterally surrounded by a first pad-level dielectric layer, wherein the first pad-level dielectric layer comprises a first low-k dielectric layer comprising a dielectric material having a dielectric constant of 2.6 or less; and a second semiconductor die comprising a second substrate, second semiconductor devices, and second bonding pads that are electrically connected to a respective node of the second semiconductor devices and laterally surrounded by a second pad-level dielectric layer, wherein each of the second bonding pads is bonded to a respective one of the first bonding pads.

According to another aspect of the present disclosure, a method of forming a bonded assembly includes providing a first semiconductor die comprising a first substrate, first semiconductor devices, and first dielectric material layers embedding first metal interconnect structures; forming a first metal layer over the first dielectric material layers; forming first bonding pads by patterning the first metal layer into first metallic plates that are electrically connected to a respective node of the first semiconductor devices through the first metal interconnect structures; forming a first low-k dielectric layer comprising a first low-k dielectric material having a dielectric constant of 2.6 or less over the first bonding pads; providing a second semiconductor die comprising a second substrate, second semiconductor devices, and second bonding pads that are electrically connected to a respective node of the second semiconductor devices and laterally surrounded by a second pad-level dielectric layer; and bonding the first bonding pads to the second bonding pads.

DETAILED DESCRIPTION

Figure 1A:
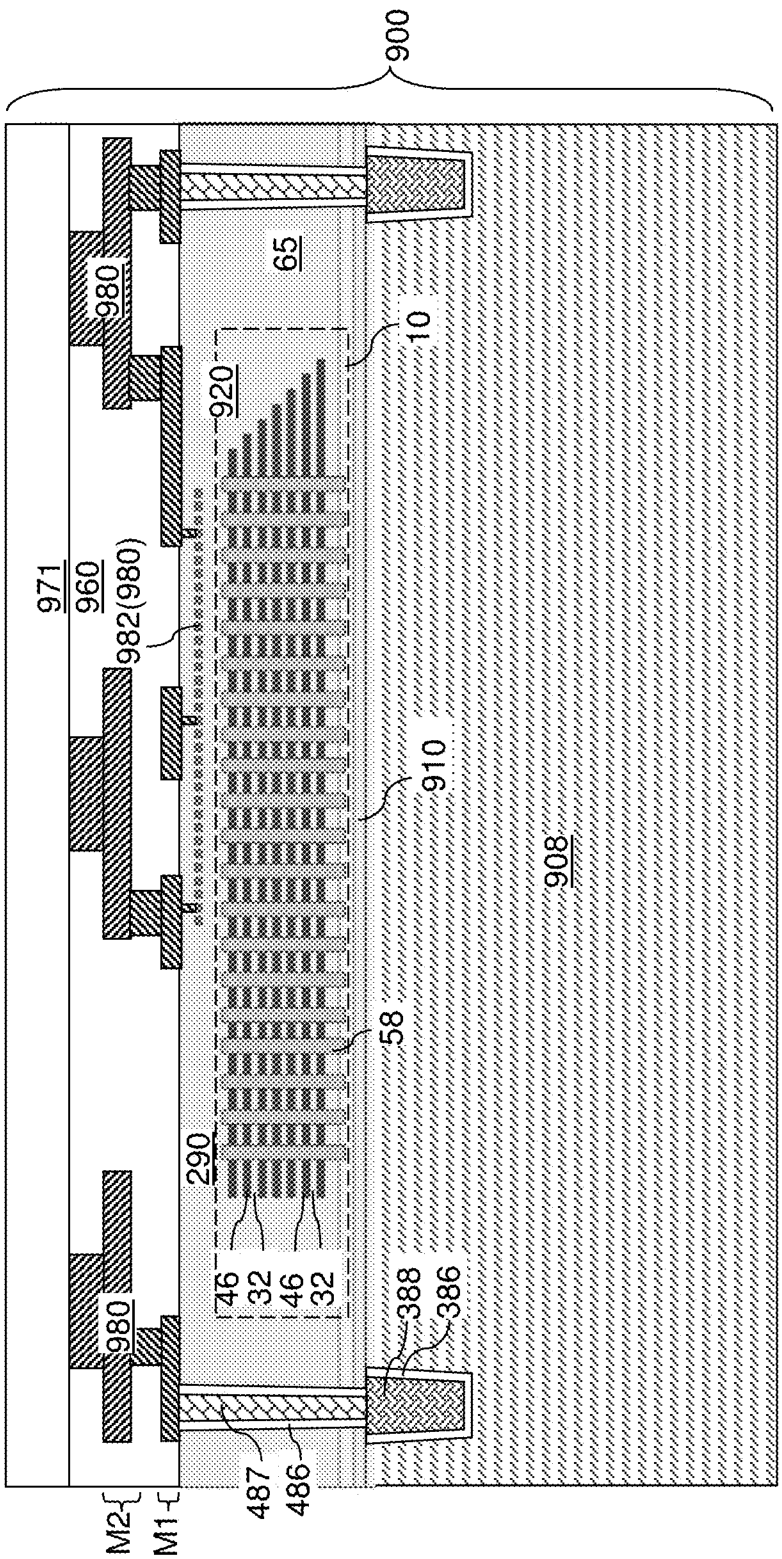
FIG. 1A is a schematic vertical cross-sectional view of a first semiconductor die after formation of a first pad-level dielectric layer according to an embodiment of the present disclosure.

A bonded assembly of a memory die and a logic die can be employed to provide a high performance three-dimensional memory device with improved memory array density and easier interconnection between the memory array located in the memory die and the driver circuit located in the logic die. An embodiment of the present disclosure is directed to a bonded assembly containing metal-organic framework (MOF) bonding dielectric and methods for forming the same, the various aspects of which are described in detail herebelow. The MOF bonding dielectric reduces the signal delay between the bonded semiconductor dies to provide a higher operation speed for the bonded assembly. Furthermore, the MOF bonding dielectric reduces or eliminates bonding pad metal diffusion into the bonding dielectric and formation of voids at the bonding interface.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1A, a first semiconductor die 900 according to an embodiment of the present disclosure is illustrated. The first semiconductor die 900 includes a first substrate 908, first semiconductor devices 920 overlying the first substrate 908, first dielectric material layers (290, 960, 971) overlying the first semiconductor devices, and first metal interconnect structures 980 embedded in the first dielectric material layers (290, 960, 971). In one embodiment, the first substrate 908 may be a commercially available silicon wafer having a thickness in a range from 500 microns to 1 mm.

Discrete substrate recess cavities can be formed in an upper portion of the first substrate 908 by applying a photoresist layer over the top surface of the first substrate 908, lithographically patterning the photoresist layer to form an array of discrete openings, and transferring the pattern of the array of discrete openings into the upper portion of the first substrate by performing an anisotropic etch process. The photoresist layer can be subsequently removed, for example, by ashing. The depth of each discrete substrate recess cavity can be in a range from 500 nm to 10,000 nm, although lesser and greater depths can also be employed. A through-substrate liner 386 and a through-substrate via structure 388 can be formed within each discrete substrate recess cavity.

Generally, the first semiconductor devices 920 may comprise any semiconductor device known in the art. In one embodiment, the first semiconductor die 900 comprises a memory die, and may include memory devices, such as a three-dimensional NAND memory device. In an illustrative example, the first semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

Through-memory-level via cavities can be formed through the dielectric material portions 65, the optional dielectric spacer layer 910, and the horizontal semiconductor channel layer 10. An optional through-memory-level dielectric liner 486 and a through-memory-level via structure 487 can be formed within each through-memory-level via cavity. Each through-memory-level dielectric liner 486 includes a dielectric material such as silicon oxide. Each through-memory-level via structure 487 can be formed directly on a respective one of the through-substrate via structure 388.

The first dielectric material layers (290, 960, 971) may include first contact-level dielectric layers 290 embedding contact via structures and bit lines 982, first interconnect-level dielectric layers 960 that embed a subset of the first metal interconnect structures 980 located above the first contact-level dielectric layers 290, and a first pad-level dielectric layer 971 that is formed above the first interconnect-level dielectric layer 960. The bit lines 982 are a subset of the first metal interconnect structures 980 and may electrically contact drain regions located above the semiconductor channel at the top of the memory opening fill structures 58. The contact via structures contact various nodes of the first semiconductor devices or the through-memory-level via structure 487. Interconnect metal lines and interconnect metal via structures, which are subsets of the first metal interconnect structures 980) may be embedded in the first interconnect-level dielectric layers 960. The first metal interconnect structures 980 can be located within the first interconnect-level dielectric layers 960. In an illustrative example, the first metal interconnect structures 980 may include a first memory-side metal level M0 including memory-side first-level metal lines, and a second memory-side metal level M1 including memory-side second-level metal lines.

Each of the first contact-level dielectric layers 290 and the first interconnect-level dielectric layers 960 may include a dielectric material such as undoped silicate glass, a doped silicate glass, organosilicate glass, silicon nitride, a dielectric metal oxide, or a combination thereof. A topmost layer of the first interconnect-level dielectric layers 960 may be a dielectric diffusion barrier layer (not expressly shown), which may be a silicon nitride layer having a thickness in a range from 10 nm to 300 nm.

The first pad-level dielectric layer 971 may include, and/or consist essentially of, undoped silicate glass, a doped silicate glass, organosilicate glass, silicon nitride, or a dielectric metal oxide. The thickness of the first pad-level dielectric layer 971 may be in a range from 100 nm to 3,000 nm, although lesser and greater thicknesses may also be employed. The first pad-level dielectric layer 971 may have a planar top surface, which may be provided, for example, by a planarization process such as a chemical mechanical polishing (CMP) process.

Figure 1B:
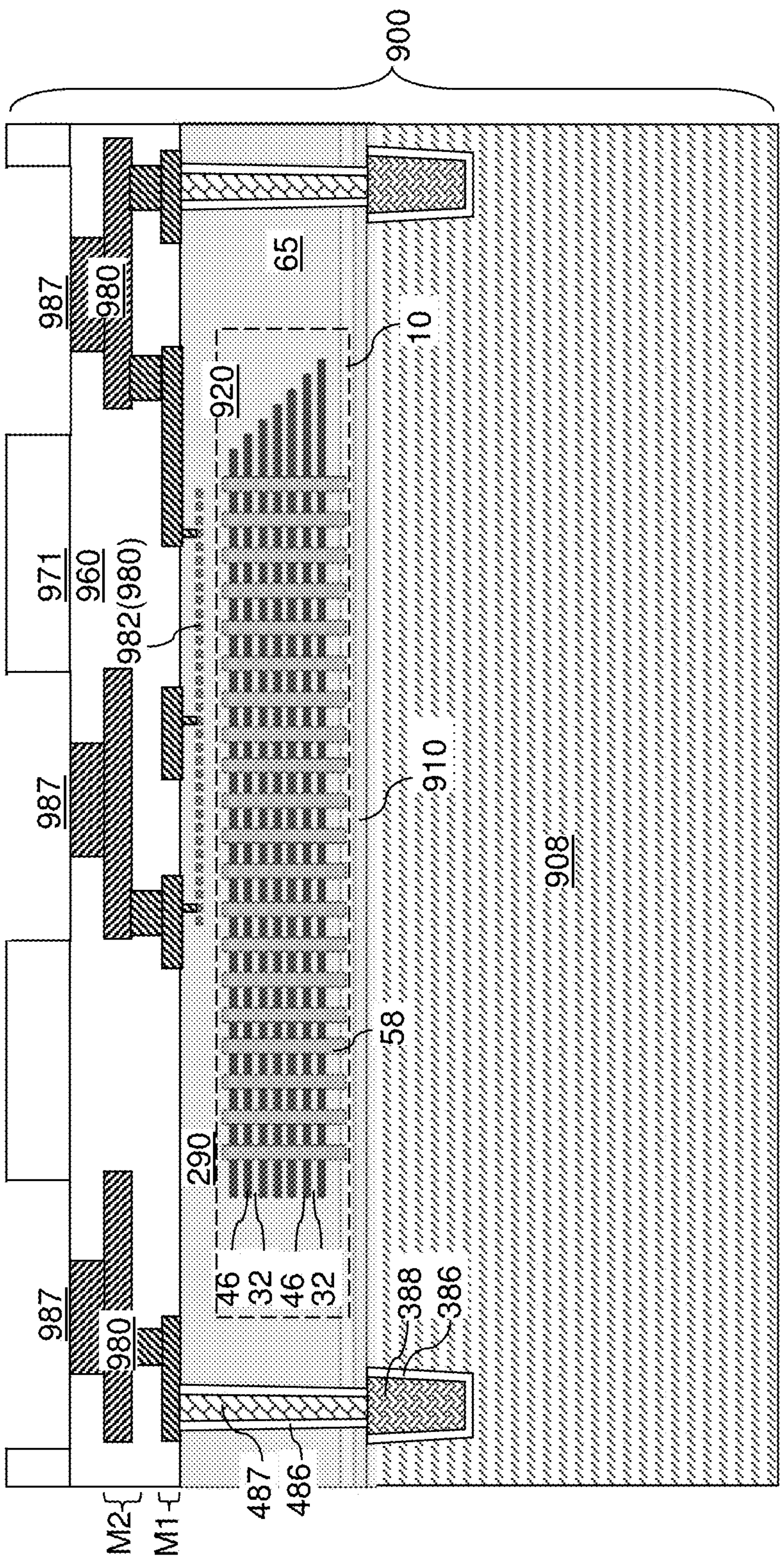
FIG. 1B is a schematic vertical cross-sectional view of the first semiconductor die after formation of first pad cavities according to an embodiment of the present disclosure.

Referring to FIG. 1B, a photoresist layer (not shown) can be applied over the first pad-level dielectric layer 971, and can be lithographically patterned to form discrete openings in areas that overlie topmost via structures of the first metal interconnect structures 980. An anisotropic etch process can be performed to transfer the pattern of the openings in the photoresist layer through the first pad-level dielectric layer 971. First pad cavities 987 are formed through the first pad-level dielectric layer 971. A top surface of a topmost via structure of the first interconnect structures 980 can be physically exposed at the bottom of each first pad cavity 987.

Figure 1C:
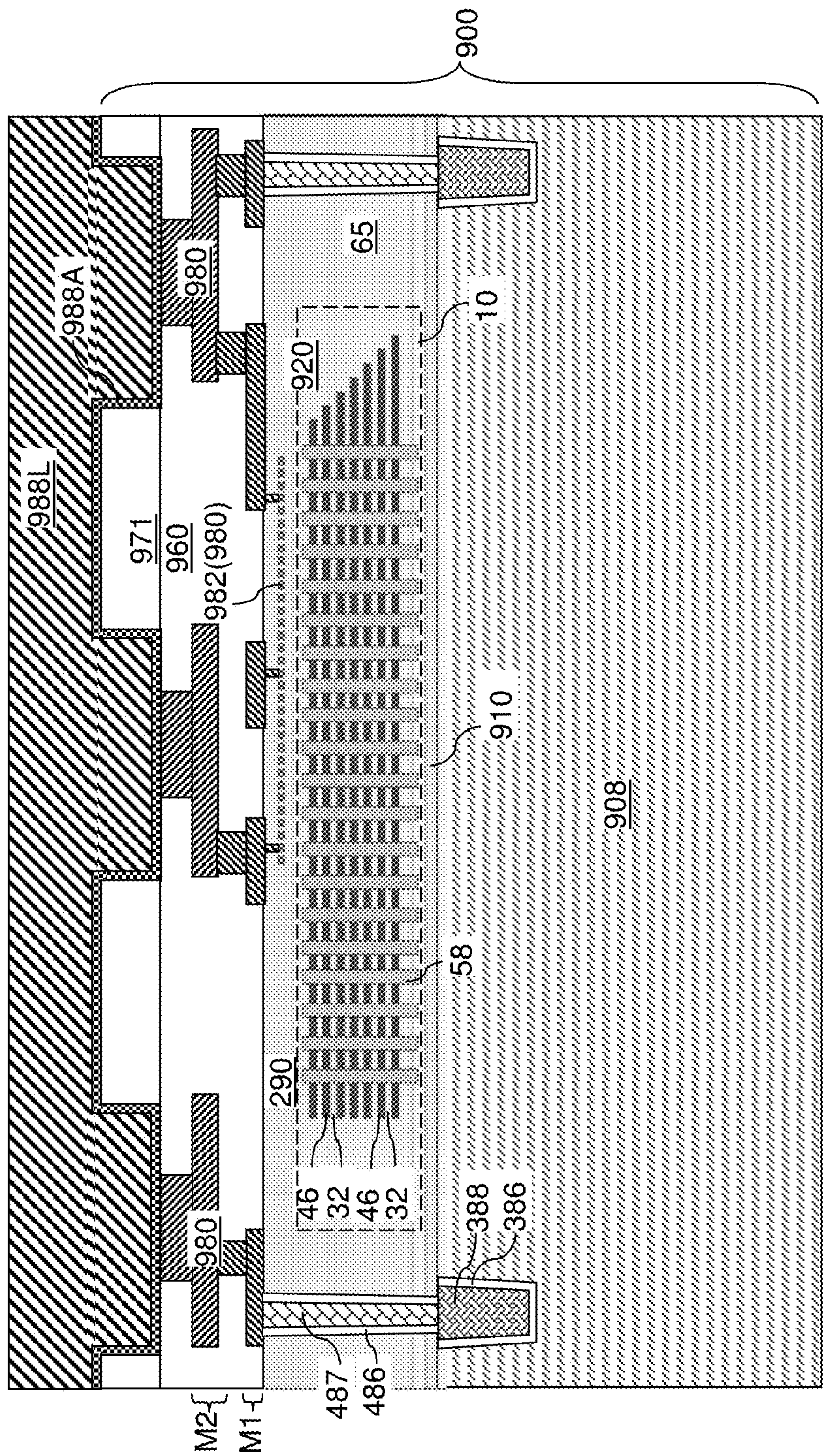
FIG. 1C is a schematic vertical cross-sectional view of the first semiconductor die after formation of a first metallic liner and a first metallic fill material layer according to an embodiment of the present disclosure.

Referring to FIG. 1C, a first metallic liner 988A and a first metallic fill material layer 988L can be deposited in the first pad cavities 987 and over the first pad-level dielectric layer 971. The first metallic liner 988A includes a metallic liner material such as TiN, TaN, WN, TiC, TaC, WC, or a stack thereof. The first metallic liner 988A can be deposited by physical vapor deposition or chemical vapor deposition. The thickness of horizontal portions of the first metallic liner 988A can be in a range from 5 nm to 50 nm, although lesser and greater thicknesses can also be employed. The first metallic fill material layer 988L includes a metallic material that can be bonded by metal-to-metal bonding. For example, the first metallic fill material layer 988L can include copper or a copper-containing alloy. The first metallic fill material layer 988L can be deposited, for example, by a sputtering, CVD, ALD, electroless plating and/or electroplating.

Figure 1D:
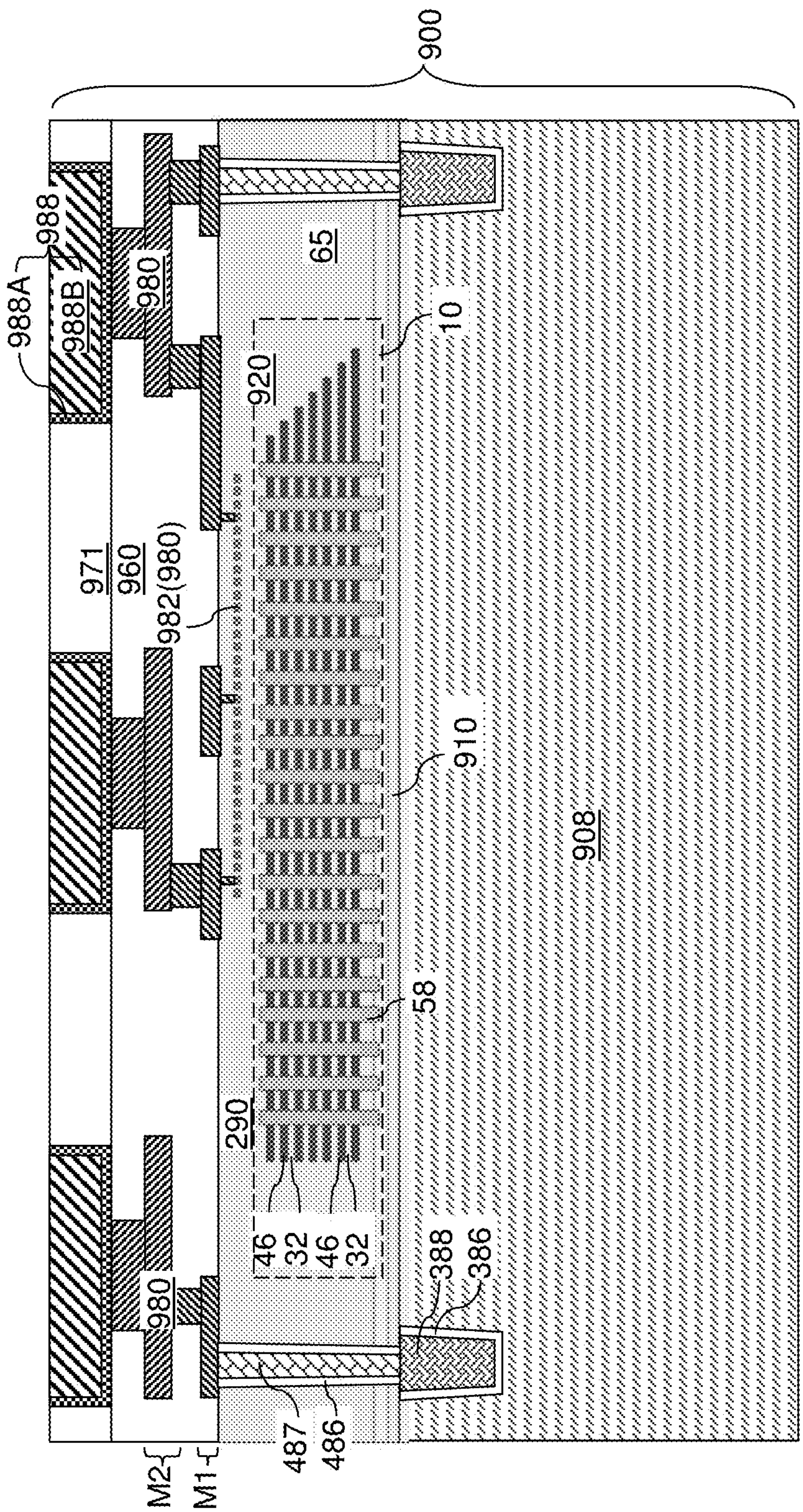
FIG. 1D is a schematic vertical cross-sectional view of the first semiconductor die after formation of first bonding pads according to an embodiment of the present disclosure.

Referring to FIG. 1D, a planarization process can be performed to remove horizontal portions of the first metallic fill material layer 988L and the first metallic liner 988A from above the horizontal plane including the top surface of the first pad-level dielectric layer 971. For example, a chemical mechanical planarization (CMP) process can be performed to remove excess portions of the first metallic fill material layer 988L and the first metallic liner 988A from above the horizontal plane including the top surface of the first pad-level dielectric layer 971. The first metallic liner 988A is divided into multiple portions located within a respective one of the first pad cavities 987. Each remaining portion of the first metallic fill material layer 988L located within a respective first pad cavity 987 constitutes a first metallic fill material portion 988B. Each contiguous set of the first metallic liner 988A and a first metallic fill material portion 988B constitutes a first bonding pad 988. Each first bonding pad 988 can have a horizontal cross-sectional shape of a rectangle or a rounded rectangle. Each first bonding pad 988 can have a lengthwise maximum dimension in a range from 2 microns to 60 microns, and a widthwise maximum dimension in a range from 2 microns to 60 microns, although lesser and greater dimensions may also be employed.

Generally, the first semiconductor die 900 can comprise a first substrate 908, first semiconductor devices 920, and first bonding pads 988 that are embedded in a first pad-level dielectric layer 971 and electrically connected to a respective node of the first semiconductor devices 920. Each first bonding pad 988 comprises a first metallic liner 988A contacting the first pad-level dielectric layer 971, and a first metallic fill material portion 988B that is laterally surrounded by the first metallic liner 988A and laterally spaced from the first pad-level dielectric layer 971. The first metallic liners 988A may comprise a metallic nitride material, and the first metallic fill material portions 988B may comprise copper.

Figure 1E:
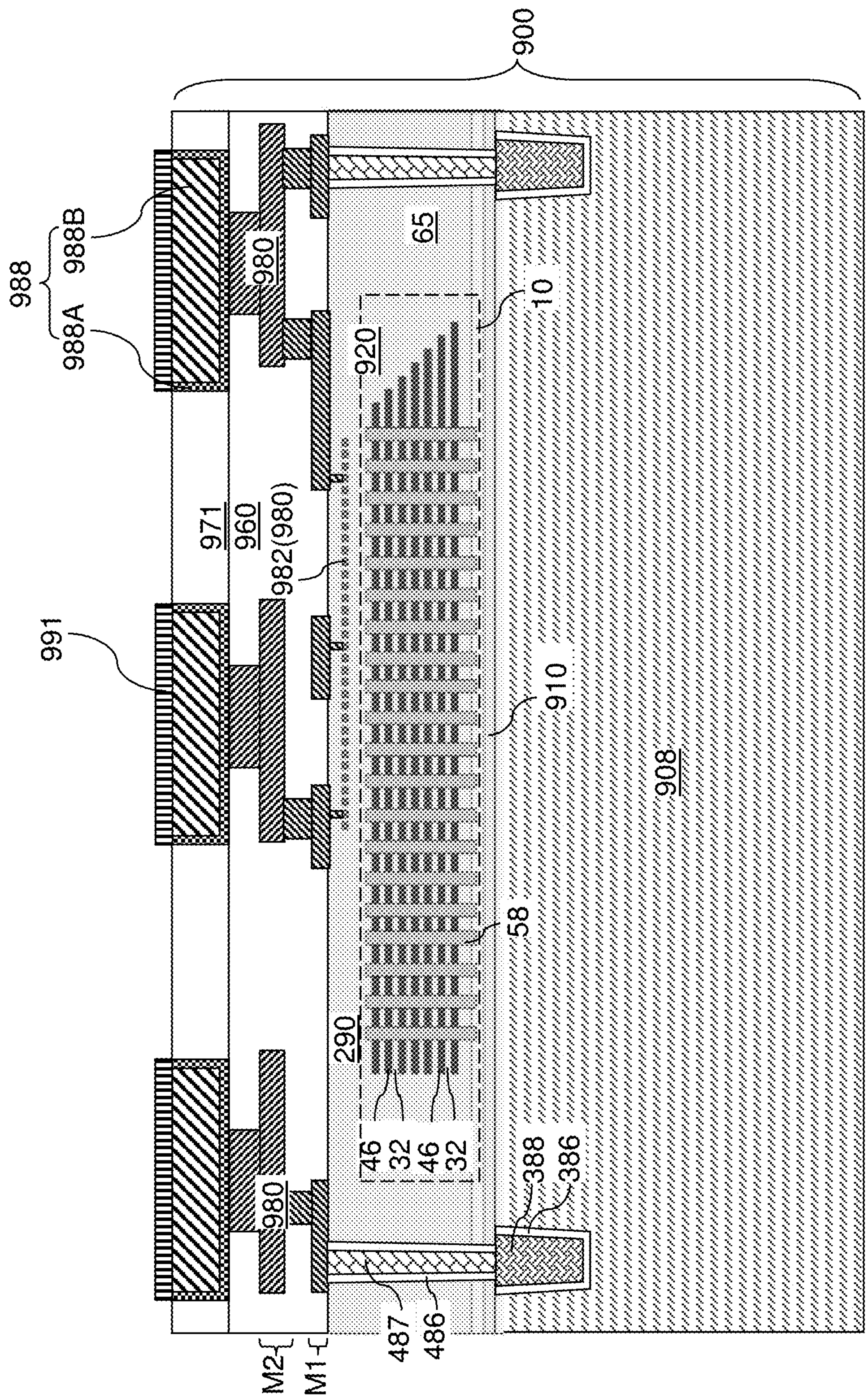
FIG. 1E is a schematic vertical cross-sectional view of the first semiconductor die after formation of first self-assembly material layers according to an embodiment of the present disclosure.

Referring to FIG. 1E, a first self-assembly monolayer (SAM) layer 991 can be selectively deposited on each physically exposed horizontal surface of the first bonding pads 988. The first SAM layer 991 can include a self-assembled monolayer of organic molecules. The first SAM layer 991 can be formed by a coating process in which the molecules of the first SAM layer 991 are chemically bonded to the physically exposed surfaces of the first bonding pads 988 without being attached to the physically exposed surfaces of the first pad-level dielectric layer 971. Thus, the first SAM layers 991 can be formed selectively on the physically exposed surfaces of the first bonding pads 988 without deposition on physically exposed surfaces of the first pad-level dielectric layer 971.

In one embodiment, the self-assembly material may include a thiol with a SH head group, such as an alkane thiol precursor compound having a first end with affinity to the metallic material(s) of the first bonding pads 988 and without affinity to the material of the first pad-level dielectric layer 971 (such as silicon oxide). Thus, the SAM may be self-assembled onto the physically exposed surfaces of the first bonding pads 988 without being attached to the first pad-level dielectric layer 971. In one embodiment, the first SAM layer 991 may include a first self-assembly material having a first end having a first head group (e.g., SH group) attached to the first bonding pads 988, and a second end having a first terminal (also known as tail or functional) group. The first terminal group can be selected to prevent deposition of a first metal-containing precursor layer for subsequent conversion into a metal-organic framework (MOF) material. Generally, any tail group that suppresses deposition of a metal oxide material can be employed for the first terminal group.

Figure 1F:
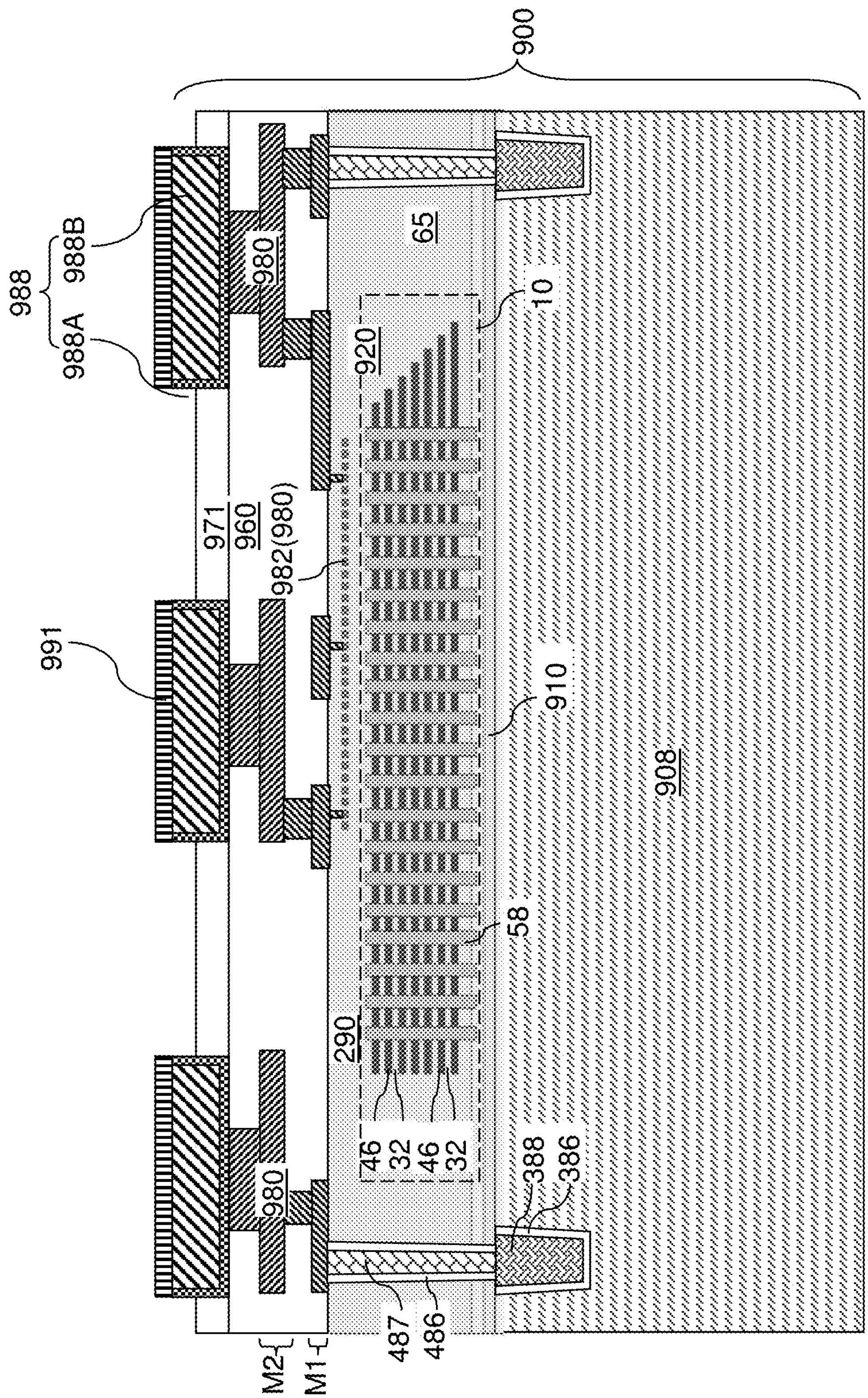
FIG. 1F is a schematic vertical cross-sectional view of the first semiconductor die after vertically recessing the first pad-level dielectric layer according to an embodiment of the present disclosure.

Referring to FIG. 1F, the first pad-level dielectric layer 971 can be vertically recessed by performing an etch process that selectively etches the dielectric material of the first pad-level dielectric layer 971 without etching the metallic materials of the first bonding pads 988 and without etching the first SAM layer 991. For example, if the first pad-level dielectric layer 971 includes undoped silicate glass (e.g., silicon oxide) or a doped silicate glass, a wet etch process employing dilute hydrofluoric acid can be performed to vertically recess the first pad-level dielectric layer 971 relative to the first bonding pads 988. The remaining portion of the first pad-level dielectric layer 971 can have a first recessed dielectric surface that is vertically recessed from the horizontal plane including the top surfaces of the first bonding pads 988 by a vertical recess distance that is less than the initial thickness of the first pad-level dielectric layer 971. The vertical recess distance may be in a range from 10% to 90%, such as from 25% to 75%, of the initial thickness of the first pad-level dielectric layer 971. Portions of the sidewalls of the first bonding pads 988 that are distal from the first substrate 908 are herein referred to as distal portions of sidewalls of the first bonding pads 988. Portions of the sidewalls of the first bonding pads 988 that are proximal to the first substrate 908 are herein referred to as proximal portions of sidewalls of the first bonding pads 988. The distal portions of sidewalls of the first bonding pads 988 can be physically exposed by the recess etch process. In one embodiment, the distal portions of sidewalls of the first bonding pads 988 can be physically exposed after formation of the first SAM layers 991 while the first SAM layers 991 are present on the horizontal surfaces of the first bonding pads 988.

In an alternative embodiment, the order of the processing steps of FIGS. 1E and 1F may be reversed. In this case, the physically exposed horizontal surface of the first pad-level dielectric layer 971 may be vertically recessed after the processing steps of FIG. 1D by performing an etch process that selectively etches the dielectric material of the first pad-level dielectric layer 971 without etching the metallic materials of the first bonding pads 988. The vertical recess distance may be a range from 10% to 90%, such as from 25% to 75%, of the initial thickness of the first pad-level dielectric layer 971. Subsequently, the processing steps of FIG. 1E may be performed to form the first SAM layers 991 on the physically exposed horizontal (i.e., top) and vertical (i.e., sidewall) surfaces of the first bonding pads 988.

Figure 1G:
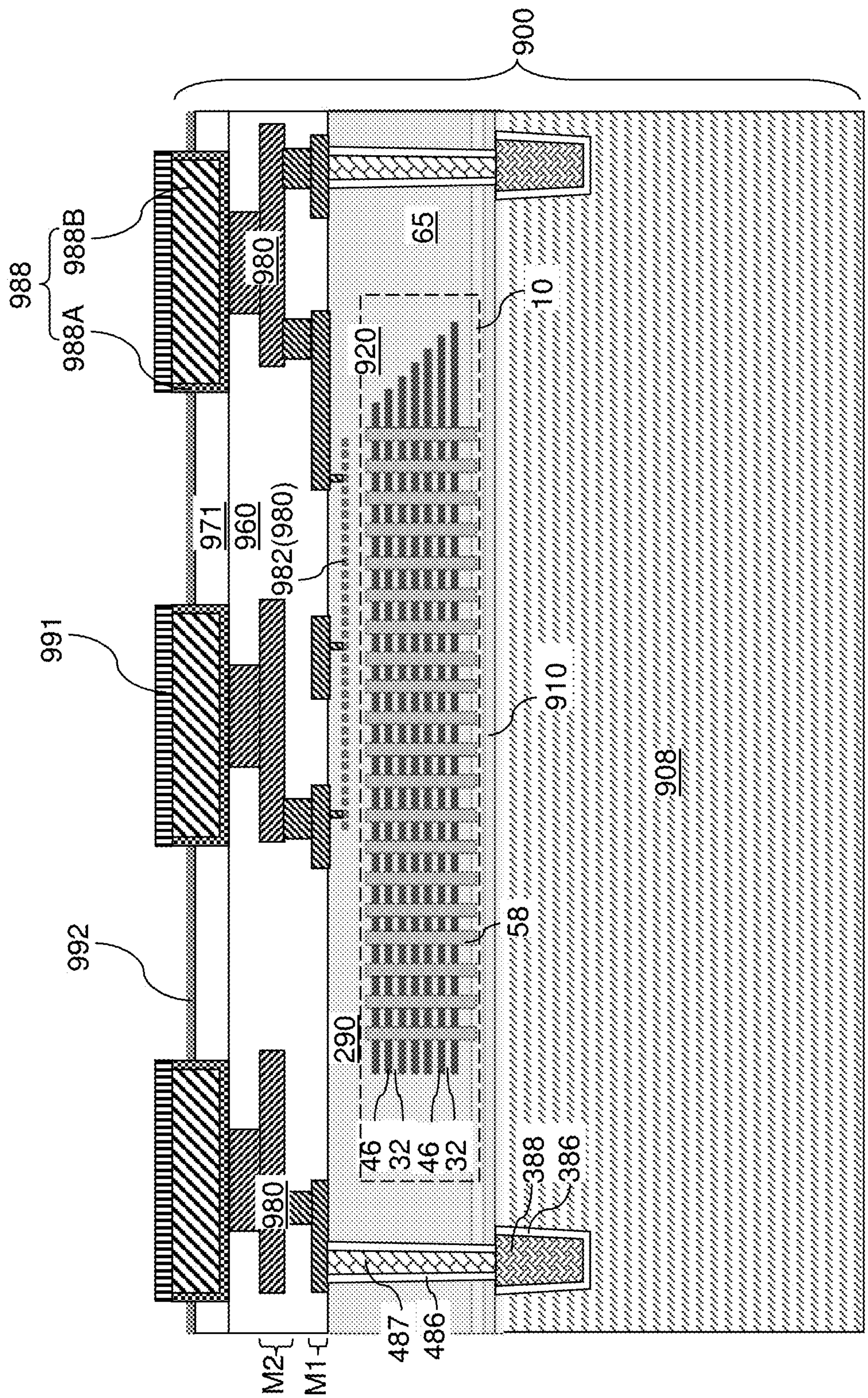
FIG. 1G is a schematic vertical cross-sectional view of the first semiconductor die after formation of a first metal-containing precursor layer according to an embodiment of the present disclosure.

Referring to FIG. 1G, a first metal-containing precursor layer 992 can be formed on the first recessed dielectric surface of the first pad-level dielectric layer 971. The first metal-containing precursor layer 992 may, or may not, be formed on the sidewalls of the first bonding pads 988 depending on whether the first SAM layers 991 are present on the sidewalls of the first bonding pads 988 or not. The first metal-containing precursor layer 992 is not formed on the first SAM layers 991. Thus, the first metal-containing precursor layer 992 is not formed over the horizontal surfaces of the first bonding pads 988.

The first metal-containing precursor layer 992 includes a metal-containing precursor material that forms a metal-organic framework (MOF) material upon exposure to a vapor of a linking compound (i.e., a linker precursor). The first metal-containing precursor layer 992 can be formed by selective conformal deposition of the metal-containing precursor material. The first SAM layers 991 prevent deposition of the metal-containing precursor material thereupon. For example, a chemical vapor deposition process or an atomic layer deposition process can be employed to deposit the first metal-containing precursor layer 992.

Metal-organic frameworks (MOF's) are porous crystalline materials that are formed by linking inorganic and organic units with strong bonds in a structure that forms a cavity having dimensions greater than the size of an individual atom. MOF's can be coordination polymers that include metal ions or clusters that are coordinated to organic ligands to form a porous three-dimensional structure. Each metal ion or cluster is connected to at least a bidentate organic ligand (i.e., two or more ligands). The organic ligands form a coordination network containing voids around the metal ions or clusters. Over 20,000 different types of MOF's have been reported. MOF's are dielectric materials and typically have a low dielectric constant, which may be in a range from 1.7 to 2.6.

Methods for forming MOF's have been disclosed in recently published articles such as M. Krishtab et al., Vapor-deposited zeolitic imidazolate frameworks as gap filling ultra-low-k dielectrics, Nature Communications, 10:3729 (2019); T. Stassin, Vapour-phase deposition of oriented copper dicarboxylate metal-organic framework thin films, Chem Commun, 2019 Sep. 4; 55(68):10056-10059; and E. Perez, Origins and Evolution of Inorganic-Based and MOF-Based Mixed-Matrix Membranes for Gas Separations, Processes 4(3):32, September 2016, the entire contents of which are incorporated herein by reference. In such methods, a metal-containing precursor material is deposited and is subsequently converted into a MOF material upon reaction with a linker precursor vapor.

For example, the first metal-containing precursor layer 992 can include, and/or can consist essentially of, an elemental metal, a metal oxide material, a metal nitride material, or a metal carbide material. In case the first metal-containing precursor layer 992 includes an elemental metal, the first metal-containing precursor layer 992 can include, and/or can consist essentially of, any metal that can form a MOF, such as titanium, molybdenum, copper, cobalt, zirconium, zinc, manganese, or ruthenium. In case the first metal-containing precursor layer 992 includes a metal oxide material, the first metal-containing precursor layer 992 can include, and/or can consist essentially of, titanium oxide, molybdenum oxide, copper oxide, cobalt oxide, zirconium oxide, zinc oxide, manganese oxide, or ruthenium oxide. In case the first metal-containing precursor layer 992 includes a metal nitride material, the first metal-containing precursor layer 992 can include, and/or can consist essentially of, titanium nitride, molybdenum nitride, copper nitride, cobalt nitride, zirconium nitride, zinc nitride, manganese nitride, or ruthenium nitride. In case the first metal-containing precursor layer 992 includes a metal carbide material, the first metal-containing precursor layer 992 can include, and/or can consist essentially of, titanium carbide, molybdenum carbide, copper carbide, cobalt carbide, zirconium carbide, zinc carbide, manganese carbide, or ruthenium carbide. The thickness of the first metal-containing precursor layer 992 can be in a range from 5% to 40%, such as from 10% to 20% of the vertical recess distance by which the planar top surface of the first pad-level dielectric layer 971 is vertically recessed. Generally, the thickness of the first metal-containing precursor layer 992 can be selected to subsequently generate an amount of a MOF material that is sufficient to fill the entire recess volume by which the volume of the first pad-level dielectric layer 971 shrunk during the etch process of FIG. 1F. For example, the thickness of the first metal-containing precursor layer 992 can be in a range from 10 nm to 100 nm, such as from 20 nm to 50 nm. In one embodiment, the first metal-containing precursor layer 992 may comprise at least one metal element that is not present in the first bonding pads 988 and in the second bonding pads to be subsequently formed in a second semiconductor die.

Figure 1H:
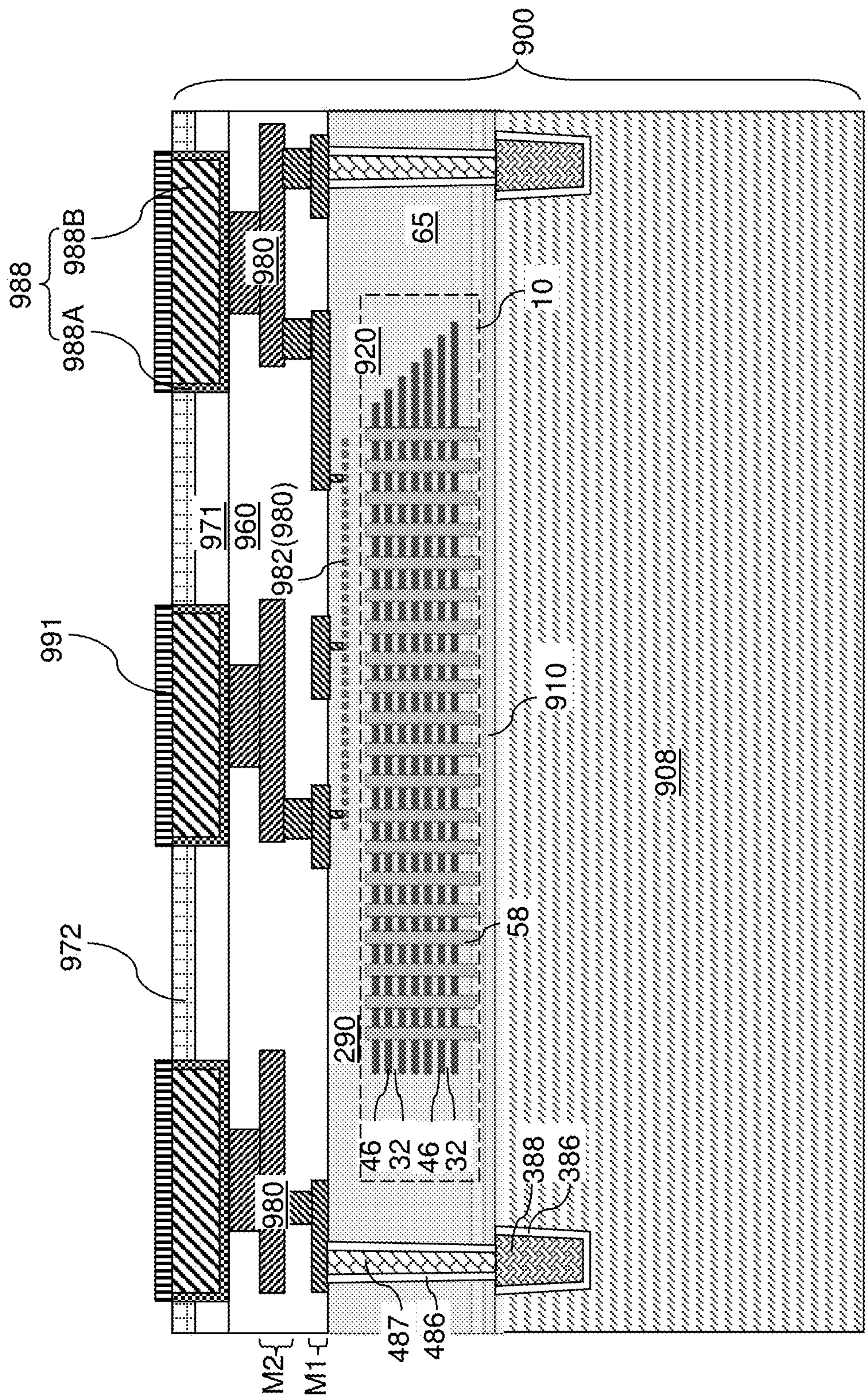
FIG. 1H is a schematic vertical cross-sectional view of the first semiconductor die after formation of a first metal-organic framework (MOF) dielectric layer according to an embodiment of the present disclosure.

Referring to FIG. 1H, a first metal-organic framework (MOF) dielectric layer 972 can be formed by reacting the first metal-containing precursor layer 992 with a first vapor of a first linking compound. The first MOF dielectric layer 972 can laterally surround the first bonding pads 988. For example, the first semiconductor die 900 can be placed in a vacuum-tight reaction chamber. An oxidation process can be performed to convert the material of the first metal-containing precursor layer 992 into a metal oxide material in case the first metal-containing precursor layer 992 includes an elemental metal, a metal nitride, or a metal carbide. In case the first metal-containing precursor layer 992 includes a metal oxide material, the oxidation process may be omitted.

The metal oxide material of the first metal-containing precursor layer 992, or the metal oxide material derived from the first metal-containing precursor layer 992, is exposed to the first vapor of the first linking compound (e.g., organic linking compound) that forms a metal-organic framework (MOF) material upon reaction. Any combination of a metallic material for the first metal-containing precursor layer 992 and the first vapor of the first linking compound that is known to form a MOF material may be employed. Generally, the molecular species for the first vapor of the first linking compound can be selected based on the metallic material in the first metal-containing precursor layer 992. For example, if the first metal-containing precursor layer 992 includes zinc, a vapor of 1,4-benzodicarboxylate (e.g., 1,4-benzodicarboxylic acid) can be employed as the organic linker to form MOF-5, which includes $ZnO_4$ nodes and 1,4-benzodicarboxylic acid organic linkers that form the framework, that contains large pores between the structure of the framework. For example, if the first metal-containing precursor layer 992 includes titanium (e.g., titanium dioxide), a vapor of 1,4-benzodicarboxylate (e.g., 1,4-benzodicarboxylic acid) can be employed as the organic linker to form MOF MIL-125, which includes titanium containing nodes and 1,4-benzodicarboxylic acid organic linkers that form the framework, that contains large pores between the structure of the framework.

The first MOF dielectric layer 972 can be formed by reaction of the first metal-containing precursor layer 992 and the first vapor of the first linking compound. The first metal-containing precursor layer 992 can be completely consumed during the optional oxidation process and subsequent conversion into the first MOF dielectric layer 972. Various MOF materials can be formed depending on the composition of the first metal-containing precursor layer 992. For example, if the first metal-containing precursor layer 992 includes titanium, a titanium-based MOF, such as MIL-125 can be formed. If the first metal-containing precursor layer 992 includes molybdenum, a molybdenum-based MOF, such as TUDMOF-1 can be formed. The composition of the MOF material portions depends on the composition of the first metal-containing precursor layer 992 and the composition of the linking compound.

The first MOF dielectric layer 972 includes metal-organic framework (MOF) material portions that are formed by reacting the first metal-containing precursor layer 992 with the first vapor of the first linking compound. The MOF material portions comprise a metal-organic framework material including metal ions or clusters and organic ligands located between neighboring pairs of the metal ions or clusters. Each metal ion or cluster is connected to at least two organic ligands (i.e., organic linkers). In one embodiment, the thickness of the first metal-containing precursor layer 992 can be selected such that the first MOF dielectric layer 972 fills the entirety of the recess volume formed by vertical recessing of the first pad-level dielectric layer 971. The top surface of the first MOF dielectric layer 972 may be at, the height of the top surfaces of the first bonding pads 988 or may be offset from the top surfaces of the first bonding pads 988 by less than 50 nm.

Figure 2A:
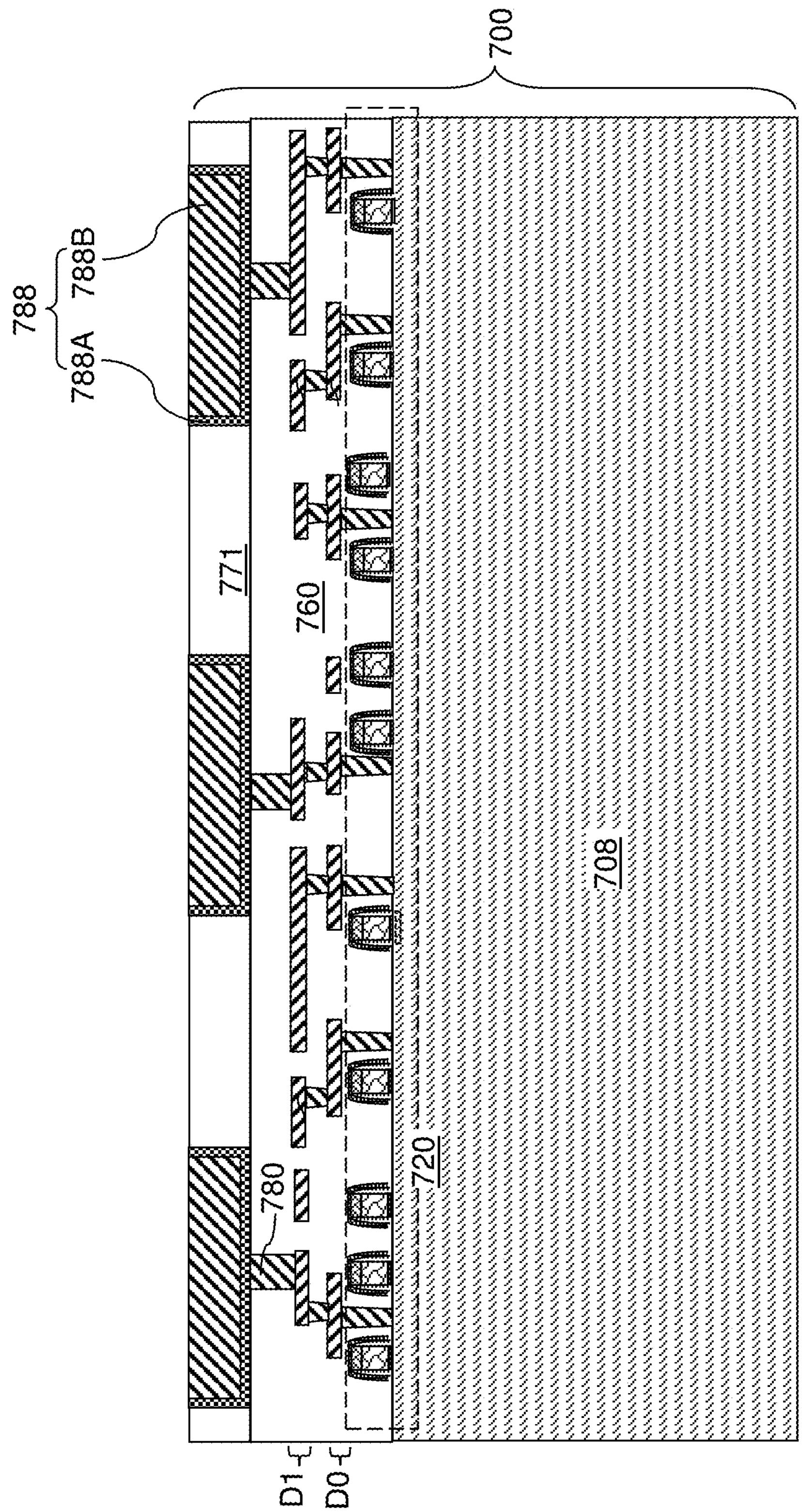
FIG. 2A is a schematic vertical cross-sectional view of a second semiconductor die after formation of second bonding pads according to an embodiment of the present disclosure.

Referring to FIG. 2A, a second semiconductor die 700 is illustrated. The second semiconductor die 700 includes a second substrate 708, second semiconductor devices 720 overlying the second substrate 708, second dielectric material layers (760, 771) overlying the second semiconductor devices 720, and second metal interconnect structures 780 embedded in the second dielectric material layers (760, 771). In one embodiment, the second semiconductor devices 720 may include at least one complementary metal oxide semiconductor (CMOS) circuitry including field effect transistors. In one embodiment, the second substrate 708 may be a commercially available silicon substrate having a thickness in a range from 500 microns to 1 mm.

Generally, the second semiconductor devices may comprise any semiconductor device that may be operated in conjunction with the first semiconductor devices in the first semiconductor die 900 to provide enhanced functionality. In one embodiment, the first semiconductor die 900 comprises a memory die and the second semiconductor die 700 comprises a logic die that includes a support circuitry (i.e., a peripheral circuitry) for operation of memory devices (such as a three-dimensional array of memory elements) within the memory die. In one embodiment, the first semiconductor die 900 may include a three-dimensional memory device including a three-dimensional array of memory elements, word lines (that may comprise a subset of the electrically conductive layers 46), and bit lines 982, the second semiconductor devices 720 of the second semiconductor die 700 may include a peripheral circuitry for operation of the three-dimensional array of memory elements. The peripheral circuitry may include one or more word line driver circuits that drive the word lines of the three-dimensional array of memory elements of the first semiconductor die 900, one or more bit line driver circuits that drive the bit lines 982 of the first semiconductor die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor die 900, a source power supply circuit that provides power to the horizontal semiconductor channel layer 10 in the first semiconductor die 900, a data buffer and/or latch, and/or any other semiconductor circuit that may be used to operate three-dimensional memory device of the first semiconductor die 900.

The second dielectric material layers (760, 771) can include second interconnect-level dielectric layers 760 embedding the second metal interconnect structures 780, and a second pad-level dielectric layer 771 that is formed above the second interconnect-level dielectric layers 760. The second interconnect-level dielectric layers 760 may include a dielectric material such as undoped silicate glass (e.g., silicon oxide), a doped silicate glass, organosilicate glass, silicon nitride, a dielectric metal oxide, or a combination thereof. In an illustrative example, the second metal interconnect structures 780 may include a first logic-side metal level DO including logic-side first-level metal lines, and a second logic-side metal level D1 including logic-side second-level metal lines.

The second pad-level dielectric layer 771 may comprise, or consist essentially of, undoped silicate glass, a doped silicate glass, organosilicate glass, silicon nitride, or a dielectric metal oxide. The thickness of the second pad-level dielectric layer 771 may be in a range from 100 nm to 3,000 nm, although lesser and greater thicknesses may also be employed. The second pad-level dielectric layer 771 may have a planar top surface, which may be provided, for example, by a planarization process such as a chemical mechanical polishing (CMP) process.

Second pad cavities are formed through the second pad-level dielectric layer 771 by performing the processing steps of FIG. 1B. Second bonding pads 788 can be formed in each second pad cavity by performing the processing steps of FIGS. 1C and 1D. Each second bonding pad 788 can include a second metallic liner 788A and a second metallic fill material portion 788B. Each second metallic liner 788A can include a metallic liner material such as TiN, TaN, WN, TiC, TaC, WC, or a stack thereof. The thickness of horizontal portions of the second metallic liners 788A can be in a range from 5 nm to 50 nm, although lesser and greater thicknesses can also be employed. The second metallic fill material portions 788B can include a metallic material that can be bonded by metal-to-metal bonding. For example, the second metallic fill material portions 788B can include copper or a copper-containing alloy.

Each second bonding pad 788 can have a horizontal cross-sectional shape of a rectangle or a rounded rectangle. Each second bonding pad 788 can have a lengthwise maximum dimension in a range from 2 microns to 60 microns, and a widthwise maximum dimension in a range from 2 microns to 60 microns, although lesser and greater dimensions may also be employed. The pattern of the second bonding pads 788 can be a mirror image pattern of the pattern of the first bonding pads 988. The second bonding pads 788 may have the same size as the first bonding pads 988, may have a greater size than the first bonding pads 988, or may have a smaller size than the first bonding pads 988.

Generally, the second semiconductor die 700 can comprise a second substrate 708, second semiconductor devices 720, and second bonding pads 788 that are embedded in a second pad-level dielectric layer 771 and electrically connected to a respective node of the second semiconductor devices 720. Each second bonding pads 788 comprises a second metallic liner 788A contacting the second pad-level dielectric layer 771, and a second metallic fill material portion 788B that is laterally surrounded by the second metallic liner 788A and laterally spaced from the second pad-level dielectric layer 771. The second metallic liners 788A comprise a metallic nitride material, and the second metallic fill material portions 788B comprise copper.

Figure 2B:
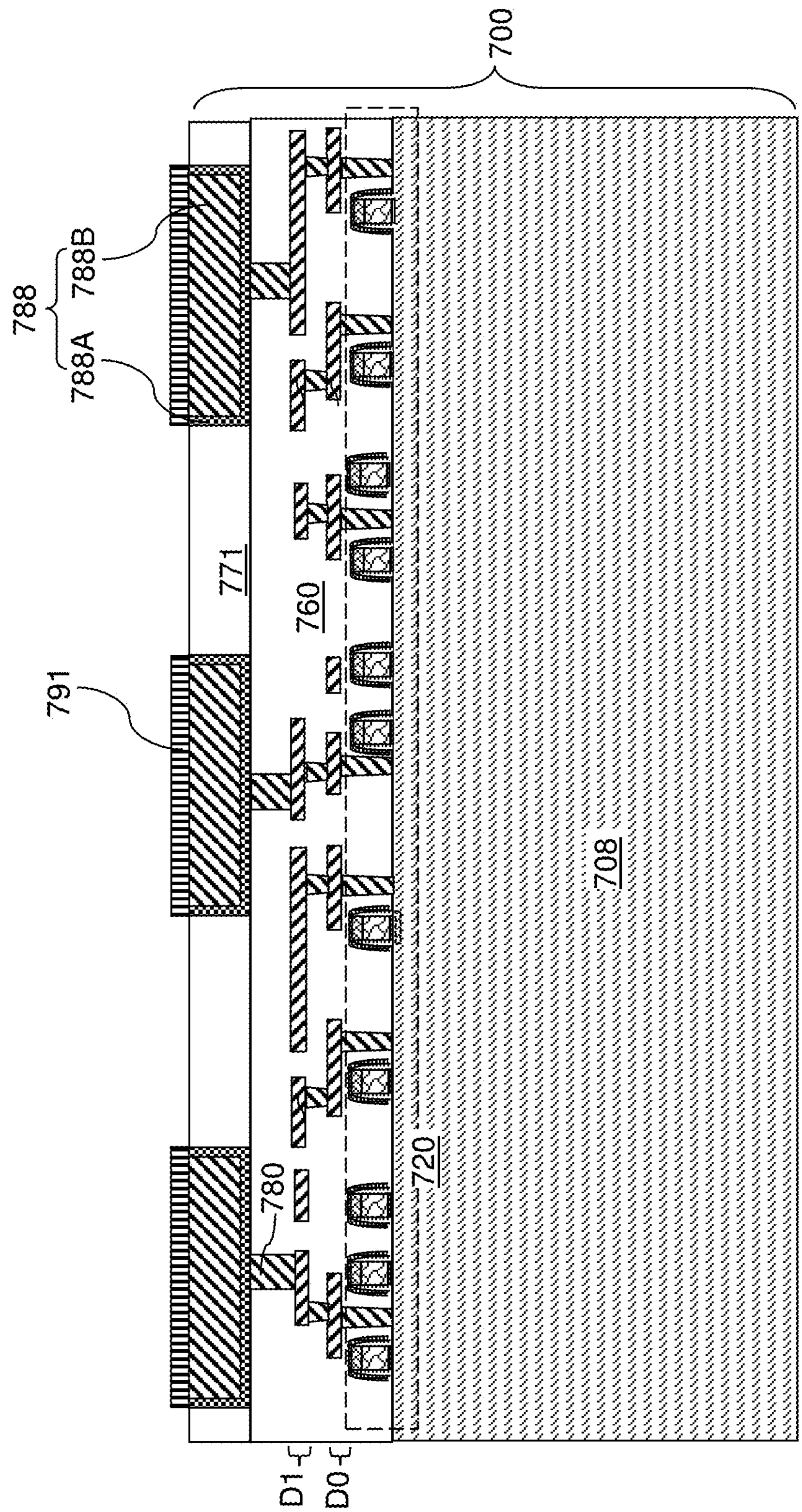
FIG. 2B is a schematic vertical cross-sectional view of the second semiconductor die after formation of first self-assembly material layers according to an embodiment of the present disclosure.

Referring to FIG. 2B, a second self-assembly monolayer (SAM) layer 791 can be selectively deposited on each physically exposed horizontal surface of the second bonding pads 788. The second SAM layer 791 can include a self-assembled monolayer of organic molecules. The second SAM layer 791 can be formed by a coating process in which the molecules of the second SAM layer 791 are chemically bonded to the physically exposed surfaces of the second bonding pads 788 without being attached to the physically exposed surfaces of the second pad-level dielectric layer 771. Thus, the second SAM layers 791 can be formed selectively on the physically exposed surfaces of the second bonding pads 788 without deposition on physically exposed surfaces of the second pad-level dielectric layer 771. Any SAM material that may be employed for the first SAM layer 991 can be employed as the SAM material of the second SAM layer 791. The SAMs of the first SAM layer 991 and the second SAM layer 771 may be the same or different from each other, as will be described in more detail with respect to FIG. 3B below.

Figure 2C:
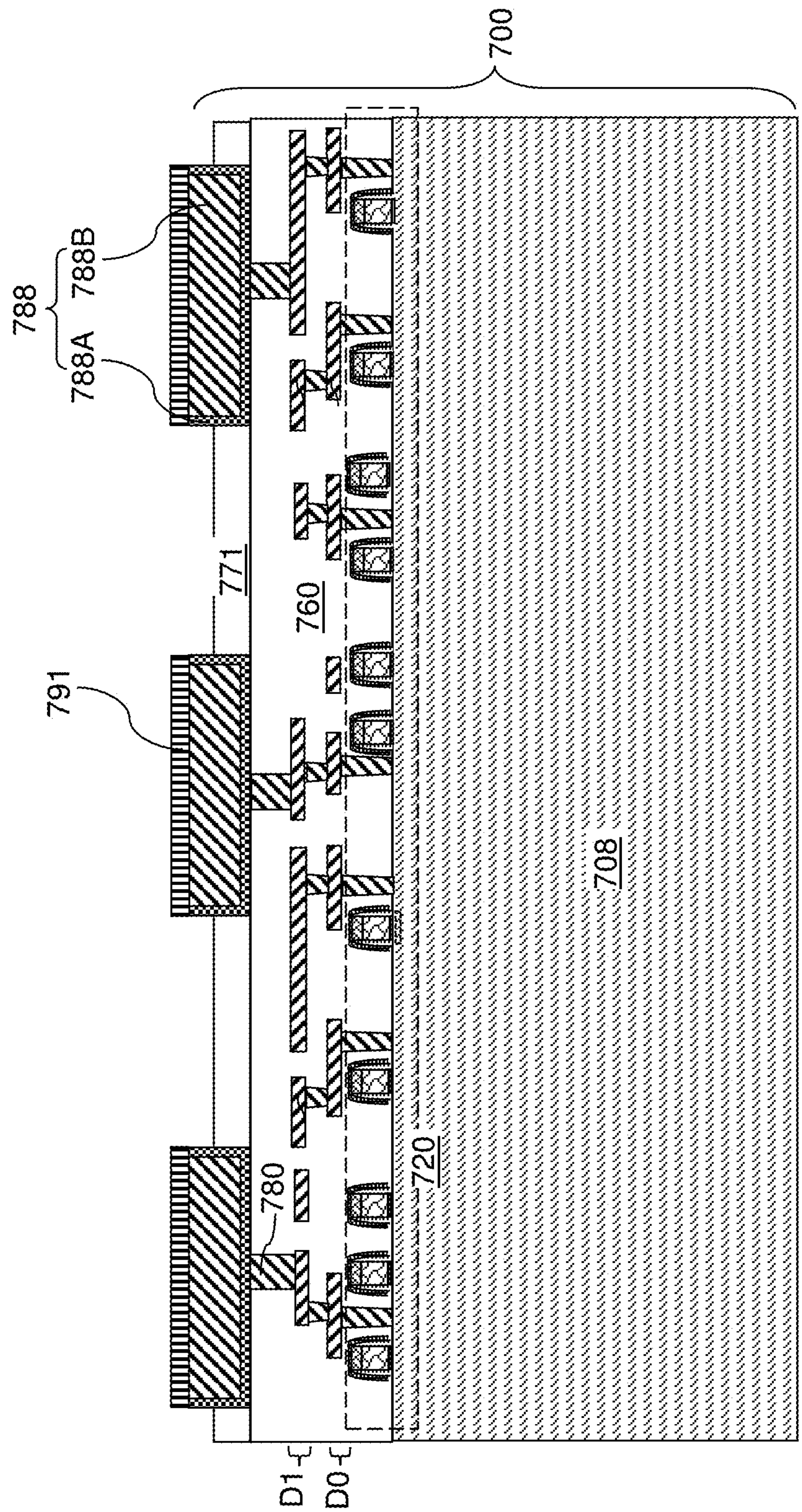
FIG. 2C is a schematic vertical cross-sectional view of the second semiconductor die after vertically recessing the second pad-level dielectric layer according to an embodiment of the present disclosure.

Referring to FIG. 2C, the second pad-level dielectric layer 771 can be vertically recessed by performing an etch process that selectively etches the dielectric material of the second pad-level dielectric layer 771 without etching the metallic materials of the second bonding pads 788 and without etching the second SAM layer 791. For example, if the second pad-level dielectric layer 771 includes undoped silicate glass (i.e., silicon oxide) or a doped silicate glass, a wet etch process employing dilute hydrofluoric acid can be performed to vertically recess the second pad-level dielectric layer 771 relative to the second bonding pads 788. The remaining portion of the second pad-level dielectric layer 771 can have a second recessed dielectric surface that is vertically recessed from the horizontal plane including the top surfaces of the second bonding pads 788 by a vertical recess distance that is less than the initial thickness of the second pad-level dielectric layer 771. The vertical recess distance may be in a range from 10% to 90%, such as from 25% to 75%, of the initial thickness of the second pad-level dielectric layer 771. Portions of the sidewalls of the second bonding pads 788 that are distal from the second substrate 708 are herein referred to as distal portions of sidewalls of the second bonding pads 788. Portions of the sidewalls of the second bonding pads 788 that are proximal to the second substrate 708 are herein referred to as proximal portions of sidewalls of the second bonding pads 788. The distal portions of sidewalls of the second bonding pads 788 can be physically exposed by the recess etch process. In one embodiment, the distal portions of sidewalls of the second bonding pads 788 can be physically exposed after formation of the second SAM layers 791 while the second SAM layers 791 are present on the horizontal surfaces of the second bonding pads 788.

In an alternative embodiment, the physically exposed horizontal surface of the second pad-level dielectric layer 771 may be vertically recessed after the processing steps of FIG. 2A by performing an etch process that selectively etches the dielectric material of the second pad-level dielectric layer 771 without etching the metallic materials of the second bonding pads 788. The vertical recess distance may be a range from 10% to 90%, such as from 25% to 75%, of the initial thickness of the second pad-level dielectric layer 771. Subsequently, the processing steps of FIG. 2B may be performed to form the second SAM layers 791 on the physically exposed horizontal (i.e., top) and vertical (i.e., sidewall) surfaces of the second bonding pads 788.

Figure 2D:
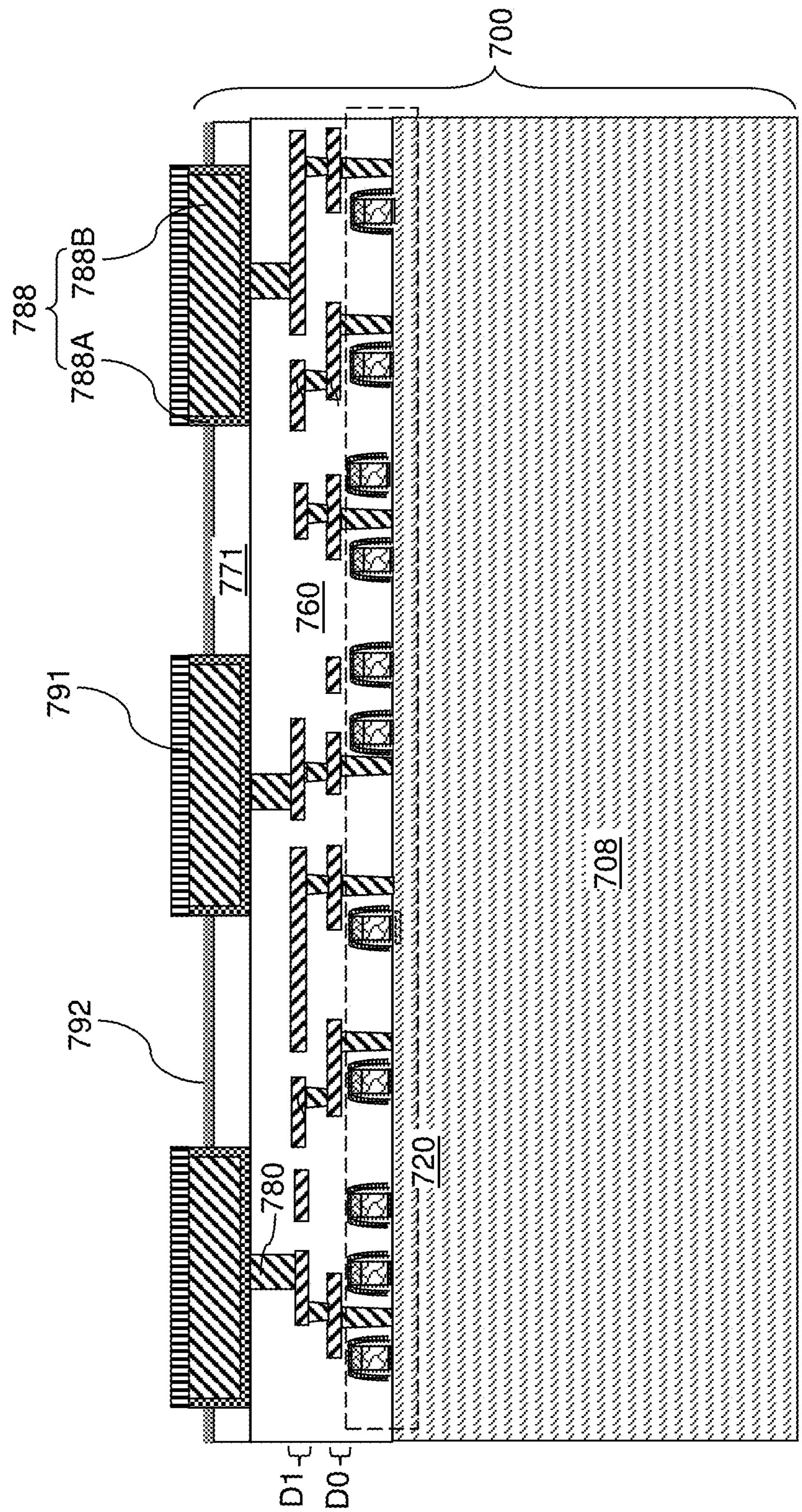
FIG. 2D is a schematic vertical cross-sectional view of the second semiconductor die after formation of a second metal-containing precursor layer according to an embodiment of the present disclosure.

Referring to FIG. 2D, a second metal-containing precursor layer 792 can be formed on the second recessed dielectric surface of the second pad-level dielectric layer 771. The second metal-containing precursor layer 792 may, or may not, be formed on the sidewalls of the second bonding pads 788 depending on whether the second SAM layers 791 are present on the sidewalls of the second bonding pads 788 or not. The second metal-containing precursor layer 792 is not formed on the second SAM layers 791. Thus, the second metal-containing precursor layer 792 is not formed over the horizontal surfaces of the second bonding pads 788.

The second metal-containing precursor layer 792 includes a metal-containing precursor material that forms a metal-organic framework (MOF) material upon exposure to a vapor of a linking compound (i.e., a linker precursor). The second metal-containing precursor layer 792 can be formed by selective conformal deposition of the metal-containing precursor material. The second SAM layers 791 prevent deposition of the metal-containing precursor material thereupon. For example, a chemical vapor deposition process or an atomic layer deposition process can be employed to deposit the second metal-containing precursor layer 792. Any material that may be employed for the first metal-containing precursor layer 992 can be employed for the second metal-containing precursor layer 792. As such, the second metal-containing precursor layer 792 can include, and/or can consist essentially of, an elemental metal, a metal oxide material, a metal nitride material, or a metal carbide material.

The thickness of the second metal-containing precursor layer 792 can be in a range from 5% to 40%, such as from 10% to 20% of the vertical recess distance by which the planar top surface of the second pad-level dielectric layer 771 is vertically recessed. Generally, the thickness of the second metal-containing precursor layer 792 can be selected to subsequently generate an amount of a MOF material that is sufficient to fill the entire recess volume by which the volume of the second pad-level dielectric layer 771 shrunk during the etch process of FIG. 2C. For example, the thickness of the second metal-containing precursor layer 792 can be in a range from 10 nm to 100 nm, such as from 20 nm to 50 nm. In one embodiment, the second metal-containing precursor layer 792 may comprise at least one metallic element that is not present in the second bonding pads 788 and in the second bonding pads to be subsequently formed in a second semiconductor die.

Figure 2E:
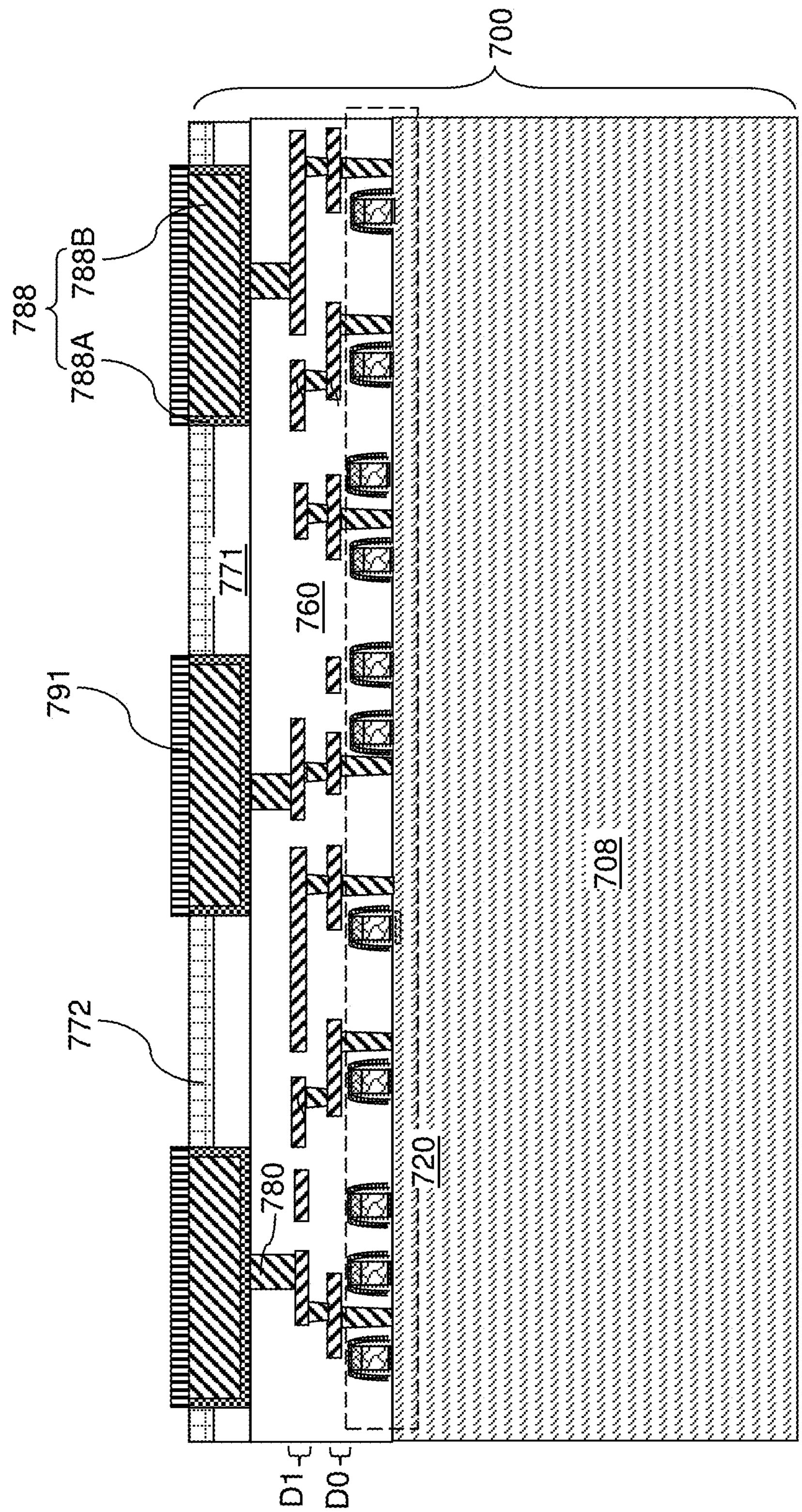
FIG. 2E is a schematic vertical cross-sectional view of the second semiconductor die after formation of a second metal-organic framework (MOF) dielectric layer according to an embodiment of the present disclosure.

Referring to FIG. 2E, a second metal-organic framework (MOF) dielectric layer 772 can be formed by reacting the second metal-containing precursor layer 792 with a second vapor of a second linking compound. The second MOF dielectric layer 772 can laterally surround the second bonding pads 788. For example, the second semiconductor die 700 can be placed in a vacuum-tight reaction chamber. An oxidation process can be performed to convert the material of the second metal-containing precursor layer 792 into a metal oxide material in case the second metal-containing precursor layer 792 includes an elemental metal, a metal nitride, or a metal carbide. In case the second metal-containing precursor layer 792 includes a metal oxide material, the oxidation process may be omitted.

The metal oxide material of the second metal-containing precursor layer 792, or the metal oxide material derived from the second metal-containing precursor layer 792, is exposed to the second vapor of the second linking compound (e.g., organic linking compound) that forms a metal-organic framework (MOF) material upon reaction. Any combination of a metallic material for the second metal-containing precursor layer 792 and the second vapor of the second linking compound that is known to form a MOF material may be employed. Generally, the molecular species for the second vapor of the second linking compound can be selected based on the metallic material in the second metal-containing precursor layer 792. The second MOF dielectric layer 772 can be formed by reaction of the second metal-containing precursor layer 792 and the second vapor of the second linking compound. The second metal-containing precursor layer 792 can be completely consumed during the optional oxidation process and subsequent conversion into the second MOF dielectric layer 772. Various MOF materials can be formed depending on the composition of the second metal-containing precursor layer 792.

The second MOF dielectric layer 772 includes metal-organic framework (MOF) material portions that are formed by reacting the second metal-containing precursor layer 792 with the second vapor of the second linking compound. The MOF material portions comprise a metal-organic framework material including metal ions or clusters and organic ligands located between neighboring pairs of the metal ions or clusters, and each metal ion or cluster bonded to two or more organic ligands (i.e., linkers). In one embodiment, the thickness of the second metal-containing precursor layer 792 can be selected such that the second MOF dielectric layer 772 fill the entirety of the recess volume formed by vertical recessing of the second pad-level dielectric layer 771. The top surface of the second MOF dielectric layer 772 may be at, or about, the height of the top surfaces of the second bonding pads 788.

Figure 3A:
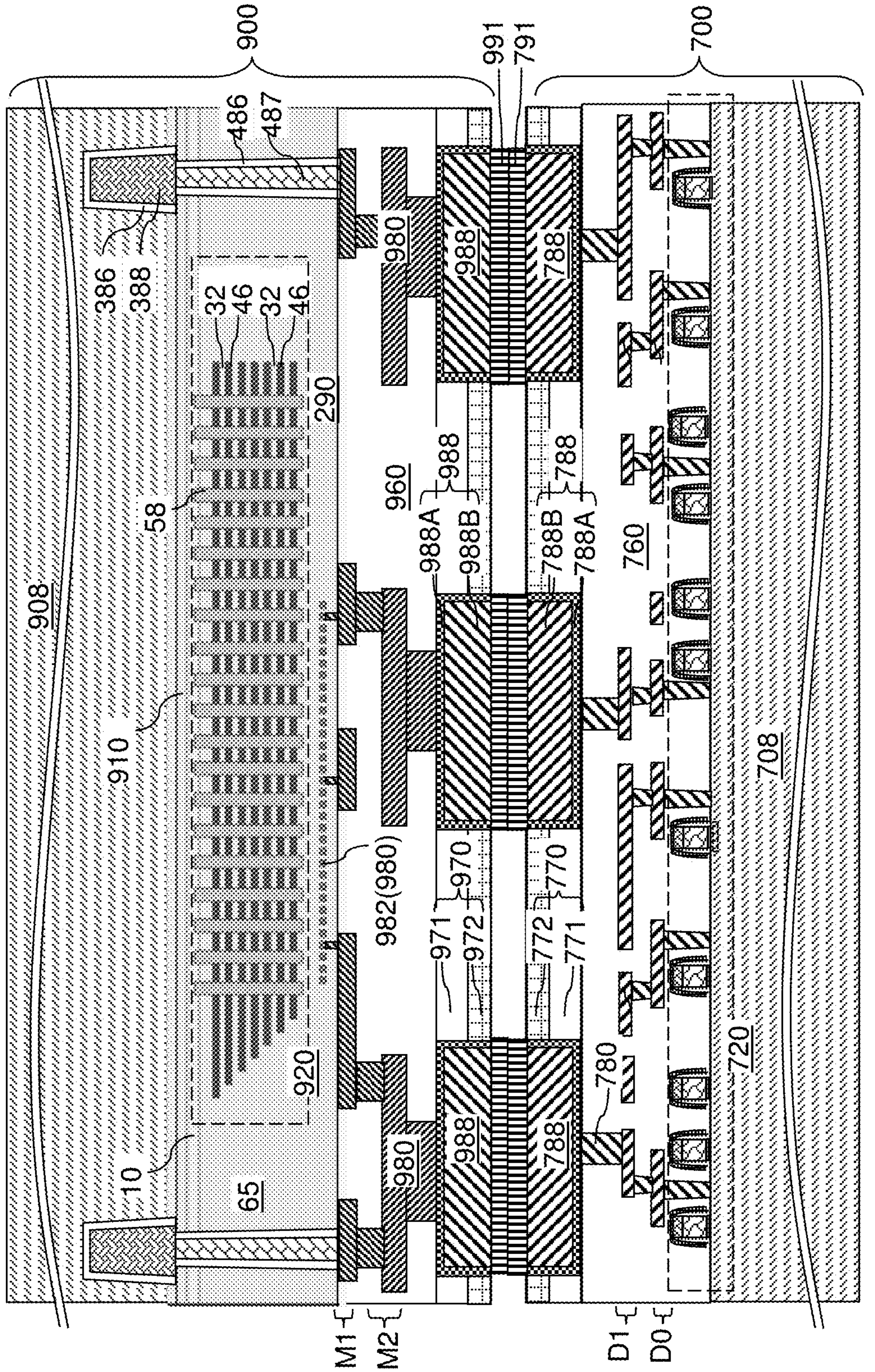
FIG. 3A is a schematic vertical cross-sectional view of a first exemplary structure including the first semiconductor die and the second semiconductor die after disposing the first semiconductor die on the second semiconductor die according to an embodiment of the present disclosure.

Referring to FIG. 3A, the first semiconductor die 900 and the second semiconductor die 700 are oriented such that the first MOF dielectric layer 972 faces the second MOF dielectric layer 772. The second semiconductor die 700 and the first semiconductor die 900 are brought into contact such that a surface of the second MOF dielectric layer 772 contacts a surface of the first MOF dielectric layer 972, and each of the second bonding pads 788 faces, and has an areal overlap in a plan view with, a respective one of the first bonding pads 988. In one embodiment, the pattern of the second bonding pads 788 may be a mirror image of the pattern of the first bonding pads 988 with optional differences in the size of bonding pads between the first semiconductor die 900 and the second semiconductor die 700. In one embodiment, the first bonding pads 988 and the corresponding second bonding pads 788 may have the same size (i.e., lateral width). In another embodiment, the first bonding pads 988 and the corresponding second bonding pads 788 may have different sizes. In one embodiment, areal overlap between each facing pair of a first bonding pad 988 and a second bonding pad 788 may be at least 80%, and/or at least 90%, such as 90 to 100%, of the area of the smaller one of the first bonding pad 988 and the second bonding pad 788.

The first semiconductor die 900 includes a vertical stack of a first pad-level dielectric layer 971 and a first MOF dielectric layer 972. The vertical stack of the first pad-level dielectric layer 971 and the first MOF dielectric layer 972 is herein referred to as a first composite dielectric layer 970. The second semiconductor die 700 includes a vertical stack of a second pad-level dielectric layer 771 and a second MOF dielectric layer 772. The vertical stack of the second pad-level dielectric layer 771 and the second MOF dielectric layer 772 is herein referred to as a second composite dielectric layer 770.

Figure 3B:
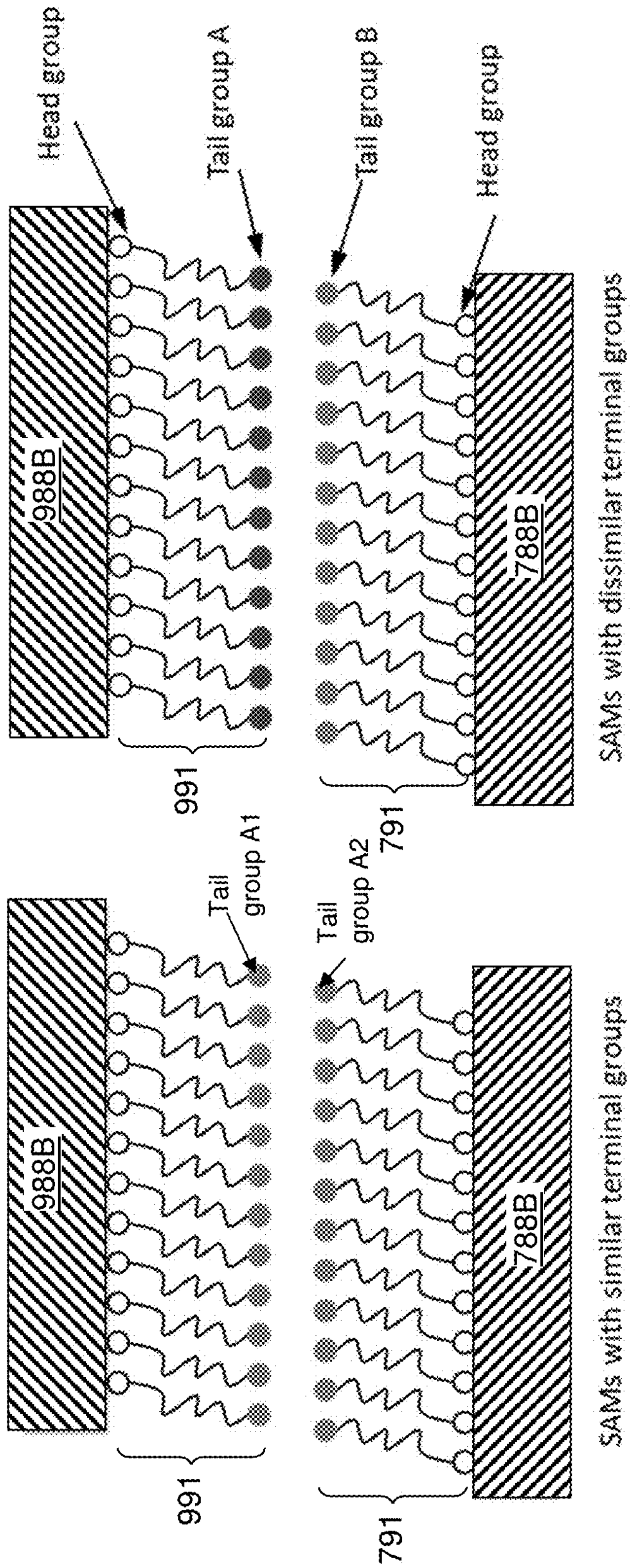
FIG. 3B illustrate configurations of self-assembly material layers that can be employed in the first exemplary structure of FIG. 3A.

FIG. 3B illustrates magnified views of two exemplary configurations, in which a respective mating pair of a first bonding pad 988 and a second bonding pad 788 is shown at the processing step of FIG. 3A. In one embodiment, the first SAM layer 991 and the second SAM layer 791 may include a monolayer of an alkane thiol having a chemical formula of $CH_3(CH_2)_{n-1}SH$. Such an alkane thiol is known to selectively attach to copper surfaces without being attached to silicon oxide surfaces. The first SAM layer 991 may include an alkane thiol compound having a first end (i.e., a first SH head group) with affinity to the material of the first bonding pads 988 and without affinity to the material of the first pad-level dielectric layer 971, and having a second end (i.e., a first tail/terminal/functional group). The second SAM layer 791 may include another alkane thiol compound having a first end (i.e., a second SH head group) with affinity to the material of the second bonding pads 788 and without affinity to the material of the second pad-level dielectric layer 771 and having a second end (i.e., a second tail/terminal/functional group).

In a first configuration, the first SAM material can include a first tail group A1 that suppresses deposition of the material of the first metal-containing precursor layer 992, and the second SAM material can include a second tail group A2 that suppresses deposition of the material of the second metal-containing precursor layer 792. In the first configuration, the first tail group A1 may be the same as the second tail group A2.

In a second configuration, the first SAM material can include a first tail group A that suppresses deposition of the material of the first metal-containing precursor layer 992, and the second SAM material can include a second tail group B that suppresses deposition of the material of the second metal-containing precursor layer 792. In the second configuration, the first tail group A may be different from the second tail group B. Further, the first tail group A and the second tail group B can be selected such that first tail group A can be selectively bonded to the second group B upon alignment of the first bonding pads 988 to the second bonding pads 788. For example, a self-assembly material may include a thiol (e.g., sulfur containing) head group configured to bond to a copper bonding pad, a $CH_2$ backbone, and a methyl ($CH_3$) or a hydroxide tail group configured to bind to another similar or different tail group of the corresponding SAM bonded to the opposing corresponding bonding pad.

Figure 4:
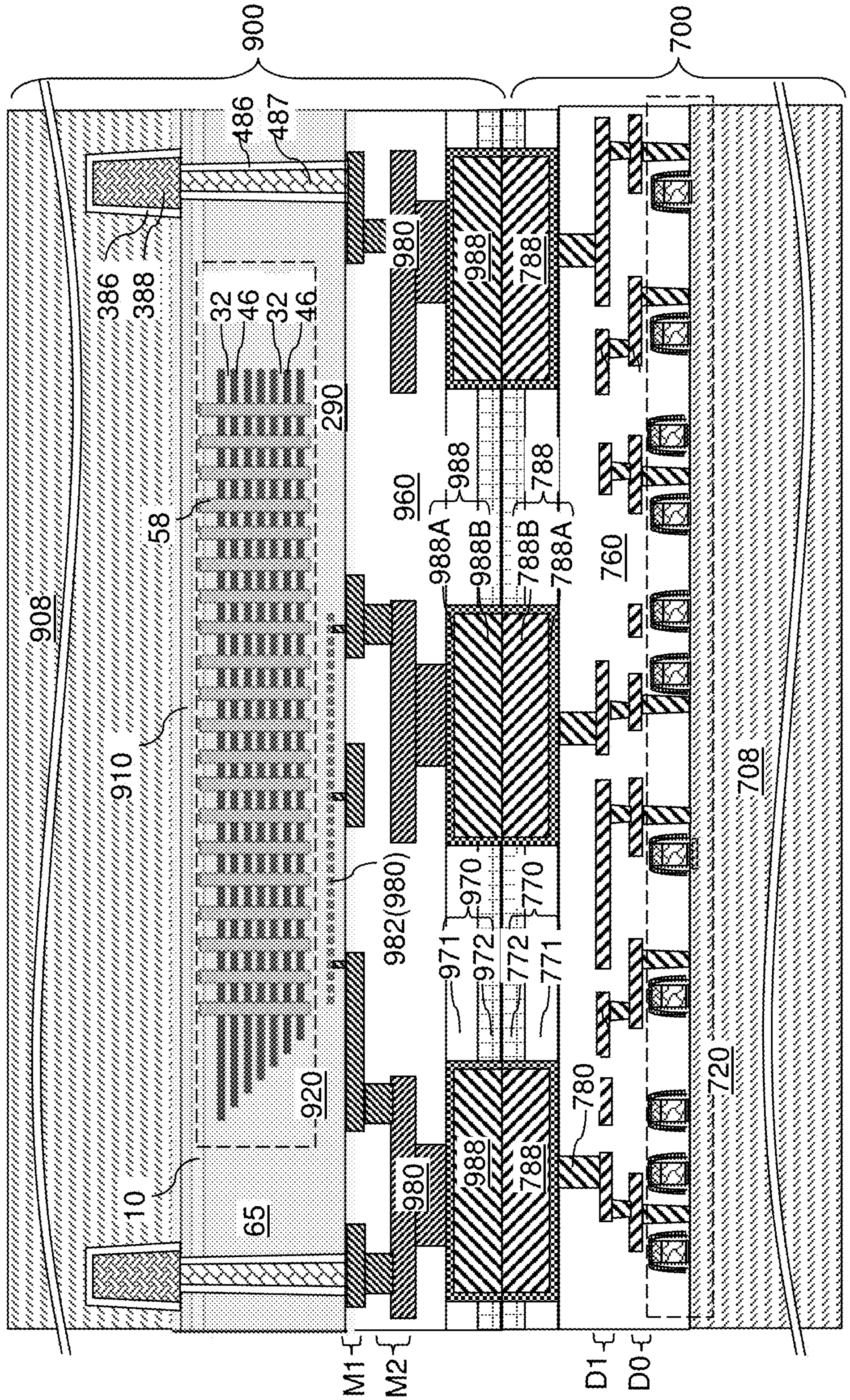
FIG. 4 is a schematic vertical cross-sectional view of the first exemplary structure after bonding the first semiconductor die to the second semiconductor die according to an embodiment of the present disclosure.

Referring to FIG. 4, the second bonding pads 788 may be bonded to the first bonding pads 988 by performing an anneal process that induces metal-to-metal bonding between the second bonding pads 788 and the first bonding pads 988. The anneal process may also optionally induce heterogeneous dielectric bonding between the first MOF dielectric layer 972 and the second MOF dielectric layer 772. The anneal temperature may be selected based on the composition of the second bonding pads 788 and the first bonding pads 988. For example, if the second bonding pads 788 and the first bonding pads 988 include metal fill portions that consist essentially of copper, the anneal temperature may be in a range from 150 degrees Celsius to 400 degrees Celsius, such as from 300 degrees Celsius to 350 degrees Celsius. The molecules of the first SAM layer 991 and the second SAM layer 791 may decompose during the anneal process, and may be evaporated or may be incorporated into the first bonding pads 988 and the second bonding pads 788 as impurity atoms. For example, the first bonding pads 988 and the second bonding pads 788 may include carbon atoms at an interfacial portion thereof. In the case of the first exemplary structure illustrated in FIG. 4, the first bonding pads 988 are bonded to the second bonding pads 788 after formation of the first MOF dielectric layer 972 and after formation of the second MOF dielectric layer 772.

Figure 5:
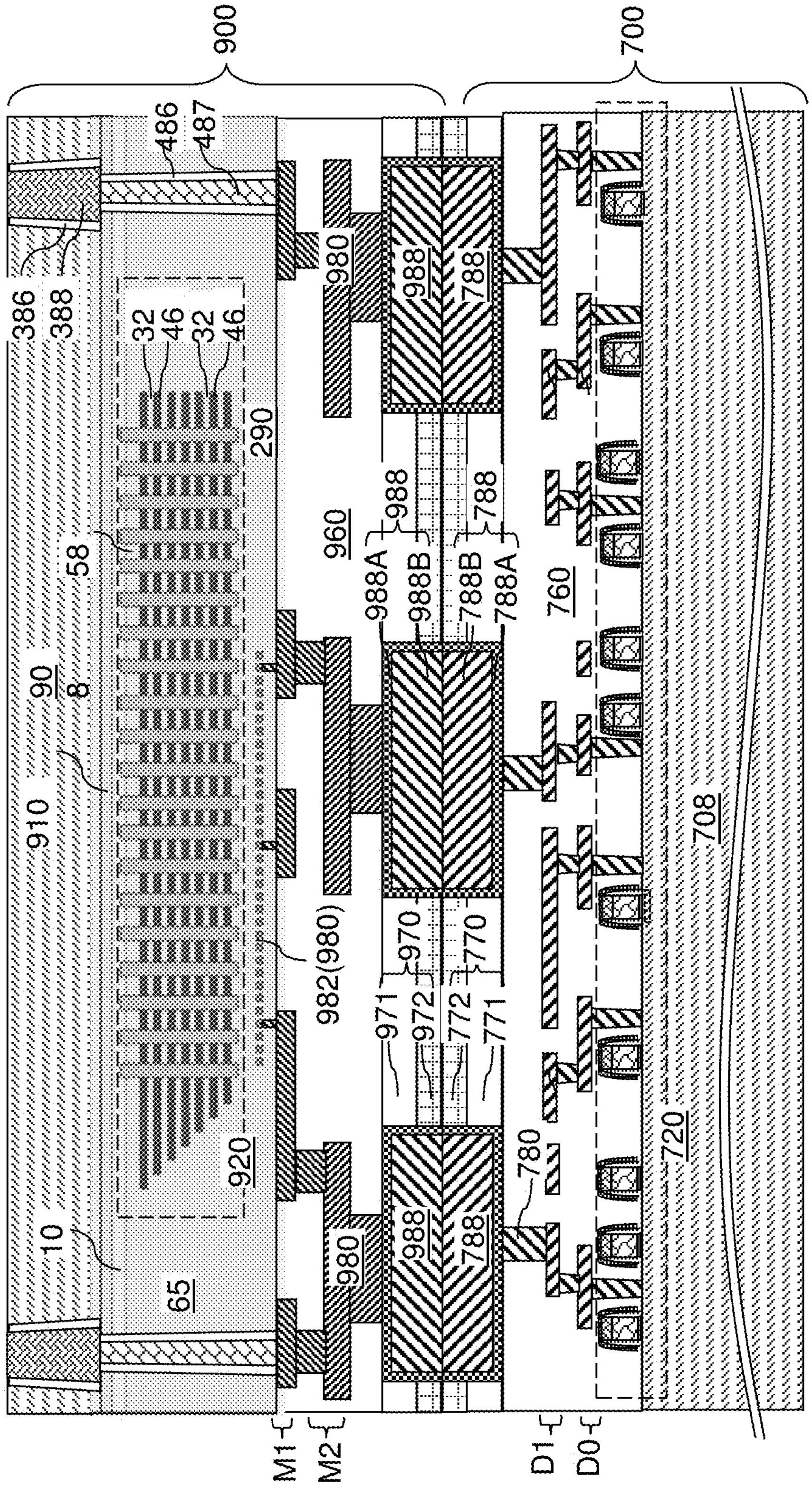
FIG. 5 is a schematic vertical cross-sectional view of the first exemplary structure after thinning the first semiconductor die from the backside according to an embodiment of the present disclosure.

Referring to FIG. 5, the first substrate 908 may be thinned from the backside by grinding, polishing, an anisotropic etch, or an isotropic etch. The thinning process can continue until horizontal portions of the through-substrate liners 386 are removed, and horizontal surfaces of the through-substrate via structures 388 are physically exposed. Generally, end surfaces of the through-substrate via structures 388 can be physically exposed by thinning the backside of the first substrate 908, which may be the substrate of a memory die.

Figure 6:
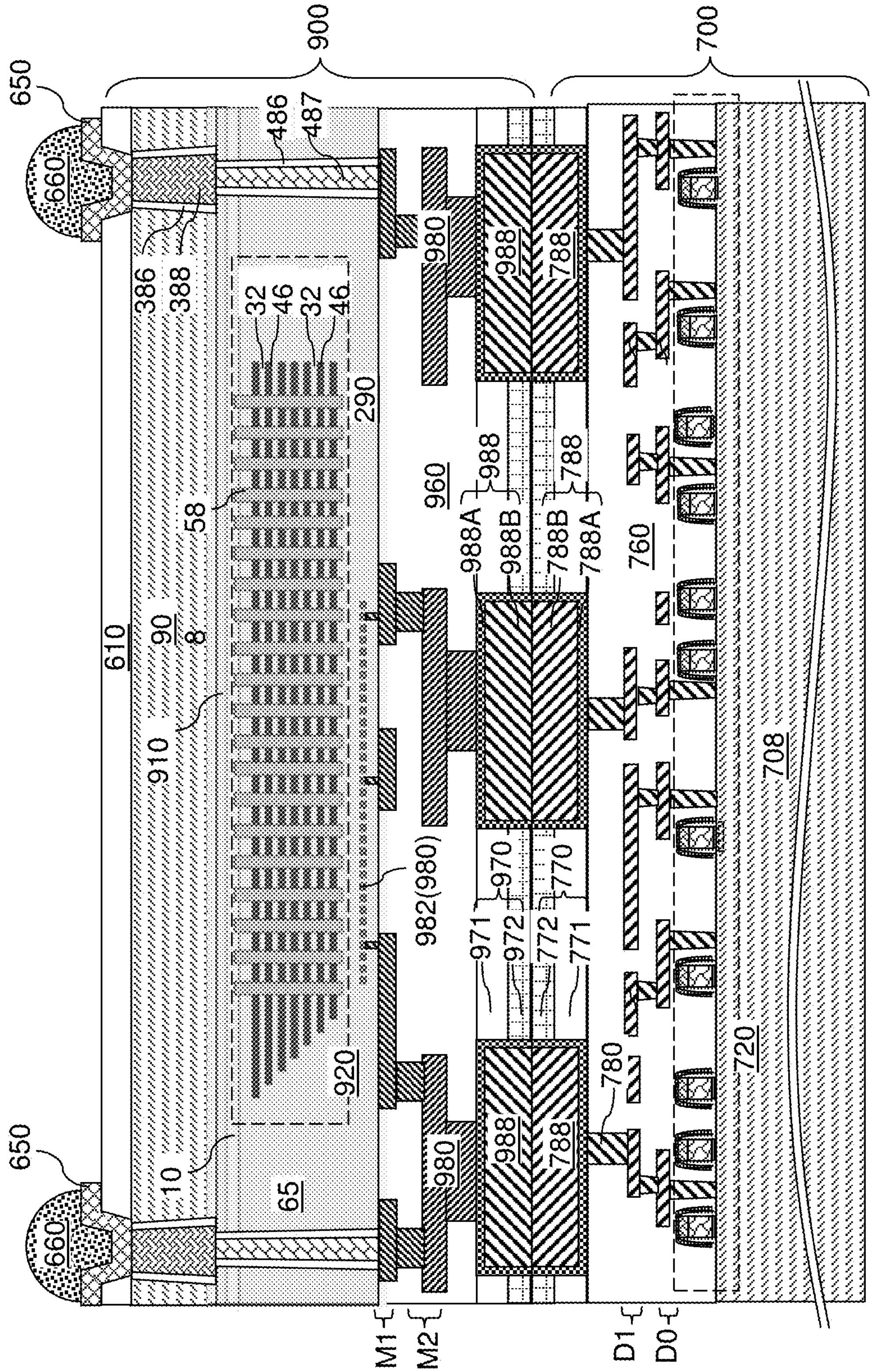
FIG. 6 is a schematic vertical cross-sectional view of the first exemplary structure after formation of a backside insulating layer, external bonding pads, and solder material portions according to an embodiment of the present disclosure.

Referring to FIG. 6, a backside insulating layer 610 may be formed on the backside of the second substrate 708. The backside insulating layer 610 includes an insulating material such as silicon oxide. The thickness of the backside insulating layer 610 can be in a range from 50 nm to 500 nm, although lesser and greater thicknesses can also be employed. A photoresist layer (not shown) may be applied over the backside insulating layer 610, and may be lithographically patterned to form opening over areas of the through-substrate via structures 388. An etch process can be performed to form via cavities through the backside insulating layer 610 underneath each opening in the photoresist layer. A top surface of a through-substrate via structure 388 can be physically exposed at the bottom of each via cavity through the backside insulating layer 610.

At least one metallic material can be deposited into the openings through the backside insulating layer 610 and over the planar surface of the backside insulating layer 610 to form a metallic material layer. The at least one metallic material can include copper, aluminum, ruthenium, cobalt, molybdenum, and/or any other metallic material that may be deposited by physical vapor deposition, chemical vapor deposition, electroplating, vacuum evaporation, or other deposition methods. For example, a metallic nitride liner material (such as TiN, TaN, or WN) may be deposited directly on the physically exposed surfaces of the through-substrate via structures 388, on sidewalls of the openings through the backside insulating layer 610, and over the physically exposed planar surface of the backside insulating layer 610. The thickness of the metallic nitride liner material can be in a range from 10 nm to 100 nm, although lesser and greater thicknesses can also be employed. At least one metallic fill material such as copper or aluminum can be deposited over the metallic nitride liner material. In one embodiment, the at least one metallic fill material can include a stack of a high-electrical-conductivity metal layer (such as a copper layer or an aluminum layer) and an underbump metallurgy (UBM) layer stack for bonding a solder ball thereupon. Exemplary UBM layer stacks include, but are not limited to, an Al/Ni/Au stack, an Al/Ni/Cu stack, a Cu/Ni/Au stack, a Cu/Ni/Pd stack, a Ti/Ni/Au stack, a Ti/Cu/Ni/Au stack, a Ti-W/Cu stack, a Cr/Cu stack, and a Cr/Cu/Ni stack. The thickness of the metallic material layer over the planar horizontal surface of the backside insulating layer 610 can be in a range from 0.5 microns to 10 microns, such as from 1 micron to 5 microns, although lesser and greater thicknesses can also be employed.

The at least one metallic fill material and the metallic material layer can be subsequently patterned to form discrete backside bonding pads 650 contacting a respective one of the through-substrate via structures 388. The backside bonding pads 650 can function as external bonding pads that can be employed to electrically connect various nodes of within the first semiconductor die 900 and the second semiconductor die 700 to external nodes, such as bonding pads on a packaging substrate or C4 bonding pads of another semiconductor die. For example, solder material portions 660 can be formed on the backside bonding pads 650, and a C4 bonding process or a wire bonding process can be performed to electrically connect the backside bonding pads 650 to external electrically active nodes.

Generally, backside bonding pads 650 can be formed on a backside surface of the first semiconductor die 900 (which may be a memory die) that is located on an opposite side of the bonding interface between the first semiconductor die 900 and the second semiconductor die 700. Through-substrate via structures 388 can vertically extend through the first semiconductor die 900, and can provide electrical connection between the backside bonding pads 650 and a subset of the bonding pads (988, 788), which can include input-output bonding pads.

Figure 7A:
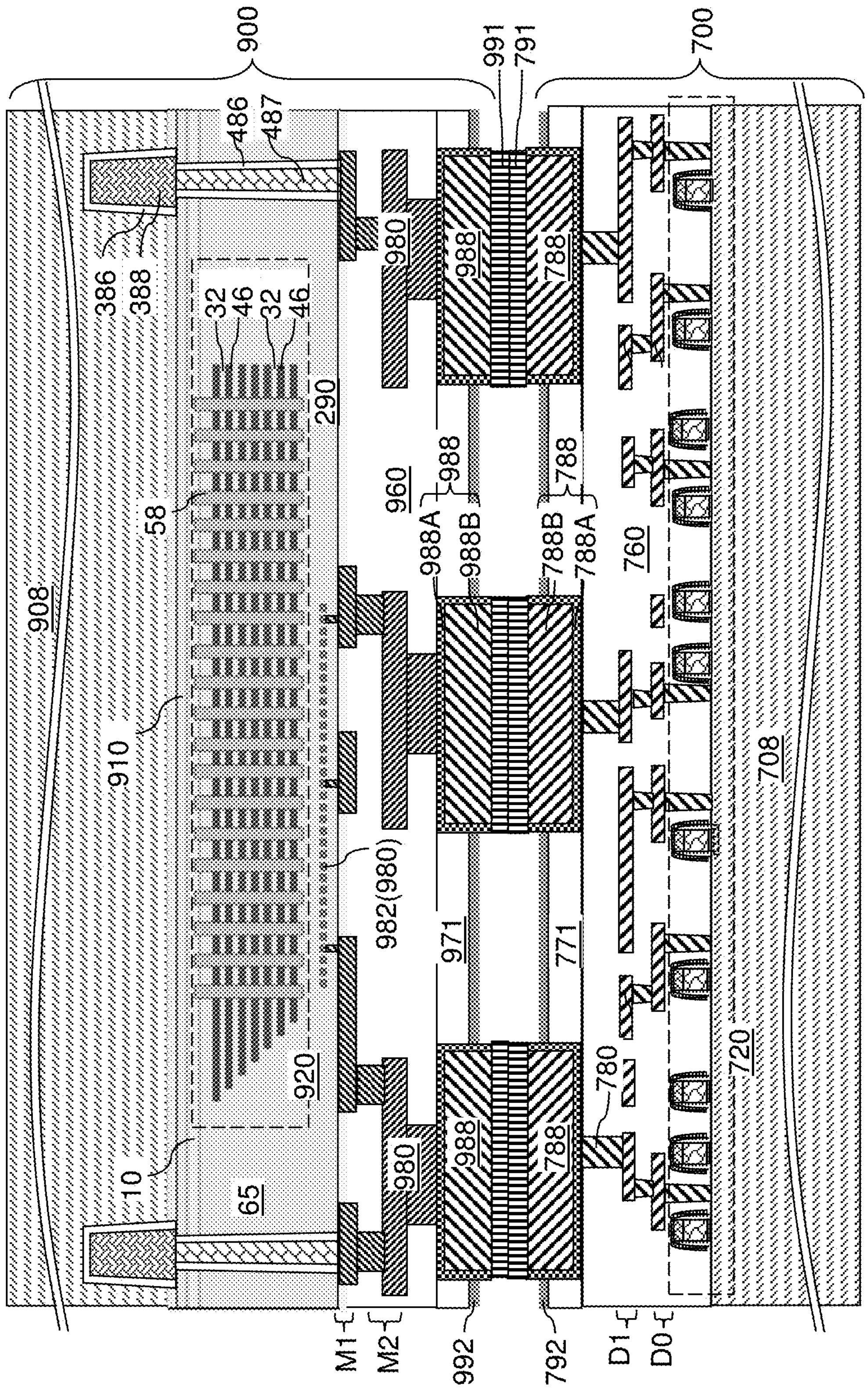
FIG. 7A is a schematic vertical cross-sectional view of a second exemplary structure including the first semiconductor die and the second semiconductor die after disposing the first semiconductor die on the second semiconductor die according to an embodiment of the present disclosure.

Referring to FIG. 7A, a second exemplary structure according to an embodiment of the present disclosure can be formed by disposing the first semiconductor die 900 of FIG. 1G over the second semiconductor die 700 of FIG. 2D. In other words, the processing steps of FIG. 1H and the processing steps of FIG. 2E are omitted before performing the die-to-die alignment step of FIG. 3A. In the second embodiment, SAM layers 791 and 991 are optional and may be omitted.

Figure 7B:
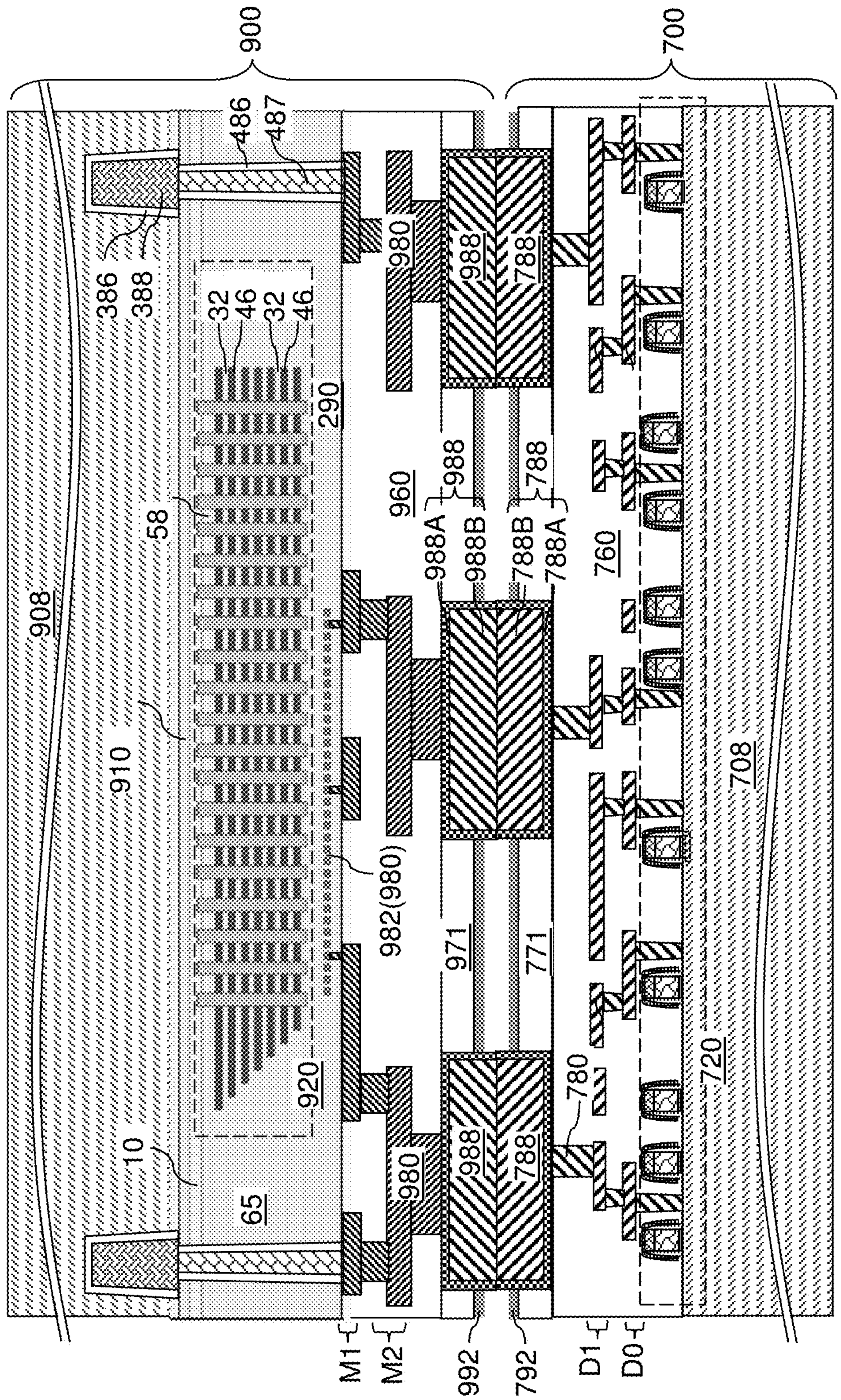
FIG. 7B is a schematic vertical cross-sectional view of the second exemplary structure after bonding the first semiconductor die to the second semiconductor die according to an embodiment of the present disclosure.

Referring to FIG. 7B, the processing steps of FIG. 4 can be performed to induce metal-to-metal bonding between the first bonding pads 988 and the second bonding pads 788. The first metal-containing precursor layer 992 may be spaced from the second metal-containing precursor layer 792 during the bonding process. The anneal temperature may be selected based on the composition of the second bonding pads 788 and the first bonding pads 988. For example, if the second bonding pads 788 and the first bonding pads 988 include metal fill portions that consist essentially of copper, the anneal temperature may be in a range from 150 degrees Celsius to 400 degrees Celsius. The molecules of the first SAM layer 991 and the second SAM layer 791 may decompose during the anneal process, and may be evaporated or may be incorporated into the first bonding pads 988 and the second bonding pads 788 as impurity atoms. For example, the first bonding pads 988 and the second bonding pads 788 may include carbon atoms at an interfacial portion thereof. Each bonded pair of a first bonding pad 988 and a second bonding pad 788 may be laterally surrounded by a continuously extending void.

Figure 7C:
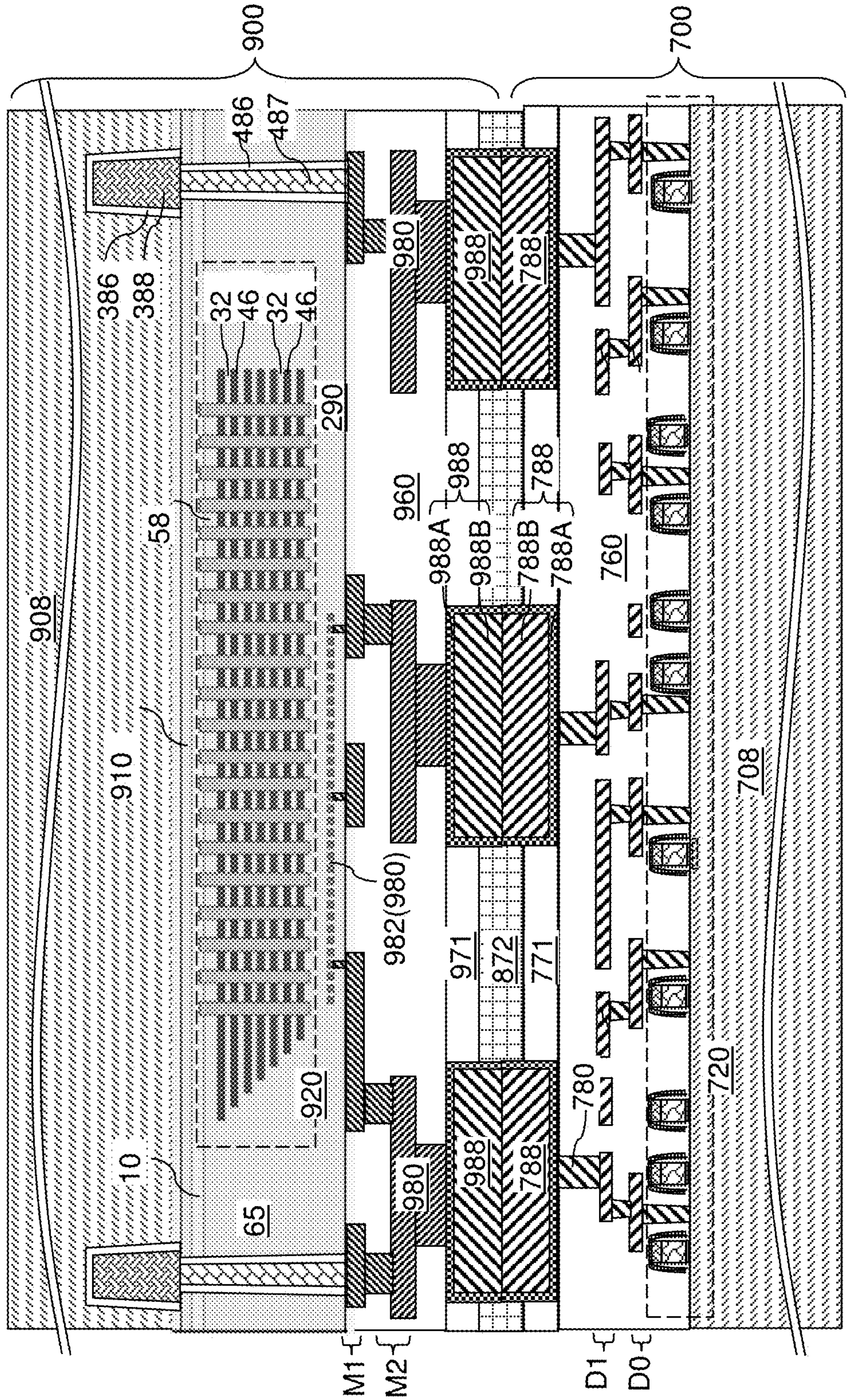
FIG. 7C is a schematic vertical cross-sectional view of the second exemplary structure after formation of a MOF dielectric layer according to an embodiment of the present disclosure.

Referring to FIG. 7C, a common metal-organic framework (MOF) dielectric layer 872 can be formed. For example, the bonded assembly of the first semiconductor die 900 and the second semiconductor die 700 can be placed in a vacuum-tight reaction chamber. An oxidation process can be performed to convert the material of the first metal-containing precursor layer 992 into a metal oxide material in case the first metal-containing precursor layer 992 includes an elemental metal, a metal nitride, or a metal carbide, and to convert the material of the second metal-containing precursor layer 792 into a metal oxide material in case the second metal-containing precursor layer 792 includes an elemental metal, a metal nitride, or a metal carbide. In case the first metal-containing precursor layer 992 and the second metal-containing precursor layer 792 include metal oxide materials, the oxidation process may be omitted.

The first metal-containing precursor layer 992 and the second metal-containing precursor layer 792 can be subsequently reacted with a vapor of at least one linking compound.

The at least one linking compound may be a single linking compound if the first metal-containing precursor layer 992 and the second metal-containing precursor layer 792 comprise a same material or if both the first metal-containing precursor layer 992 and the second metal-containing precursor layer 792 form MOF materials upon exposure to an organic linker. Alternatively, the at least one linking compound may be two different linking compounds that includes a first linking compound that induces MOF material formation from the material of the first metal-containing precursor layer 992 and a second linking compound that induces MOF material formation from the material of the second metal-containing precursor layer 792.

The first metal-containing precursor layer 992 and the second metal-containing precursor layer 792 can be completely consumed during the optional oxidation process and subsequent conversion into the common MOF dielectric layer 872. Various MOF materials can be formed depending on the composition of the first metal-containing precursor layer 992 and the second metal-containing precursor layer 792. The common MOF dielectric layer 872 can include a first sub-layer that includes a first MOF material generated from the first metal-containing precursor layer 992 and a second MOF material generated from the second metal-containing precursor layer 792. The common MOF dielectric layer 872 can laterally surround the first bonding pads 988 and the second bonding pads 788.

In the case of the second exemplary structure illustrated in FIG. 7C, the first bonding pads 988 are bonded to the second bonding pads 788 prior to formation of the common MOF dielectric layer 872. In other words, the common MOF dielectric layer 872 is formed after bonding the first bonding pads 988 to the second bonding pads 788. The common MOF dielectric layer 872 laterally surrounds the second bonding pads 788 and contacts the second pad-level dielectric layer 771. The common MOF dielectric layer 872 can laterally surround, and can contact, each of the first bonding pads 988 and the second bonding pads 788 as a single MOF dielectric layer.

Figure 8A:
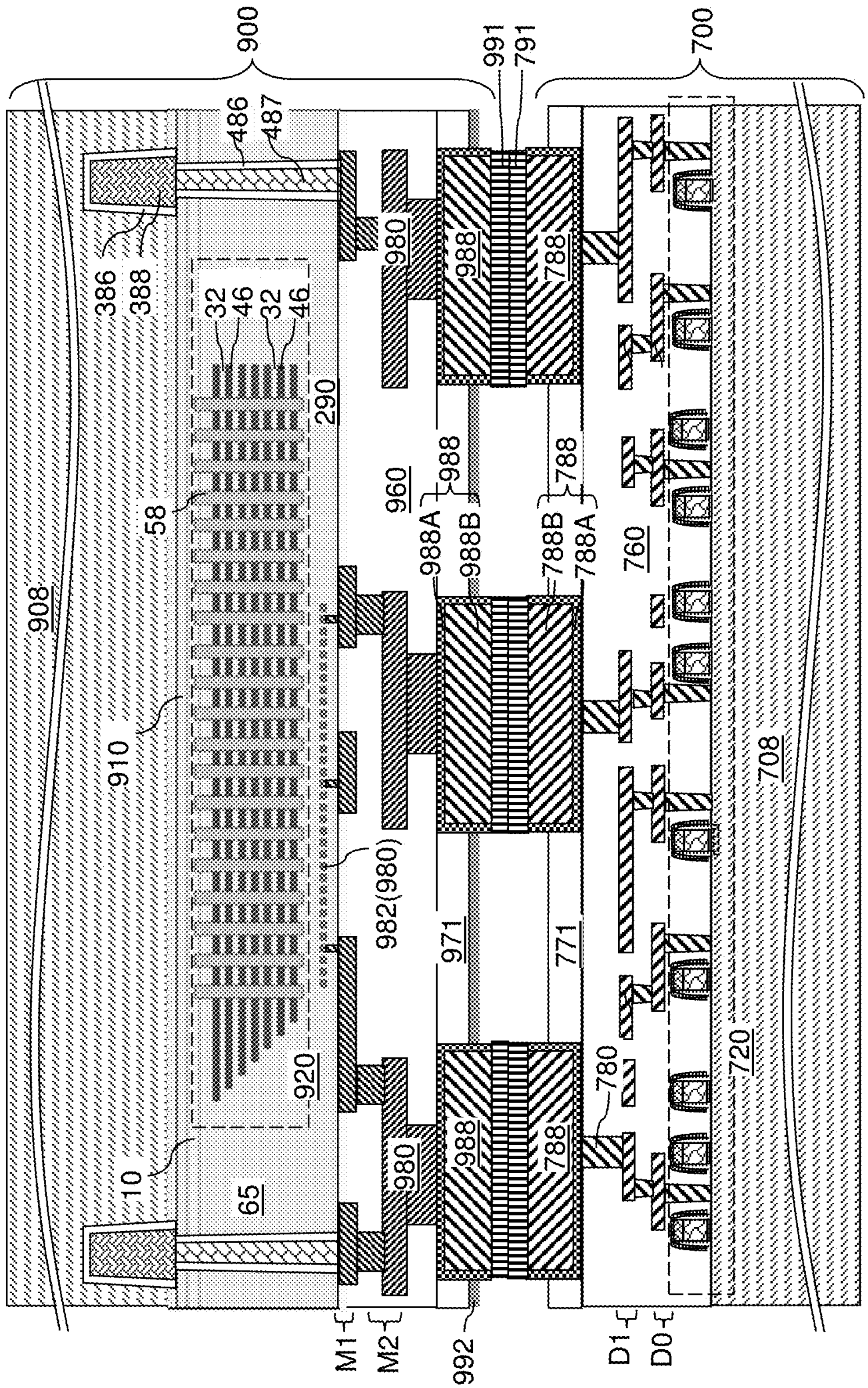
FIG. 8A is a schematic vertical cross-sectional view of a third exemplary structure after bonding the first semiconductor die to the second semiconductor die according to an embodiment of the present disclosure.

Referring to FIG. 8A, a third exemplary structure according to an embodiment of the present disclosure can be formed by disposing the first semiconductor die 900 of FIG. 1G over the second semiconductor die 700 of FIG. 2C. In other words, the processing steps of FIG. 1H and the processing steps of FIGS. 2D and 2E are omitted before performing the die-to-die alignment step of FIG. 3A. In this case, formation of the first and second SAM layers 991, 791 is optional. The thickness of the first metal-containing precursor layer 992 can be adjusted such that a MOF dielectric layer to be subsequently generated from the first metal-containing precursor layer 992 can fill the entire volume of the void between the first pad-level dielectric layer 971 and the second pad-level dielectric layer 771.

Figure 8B:
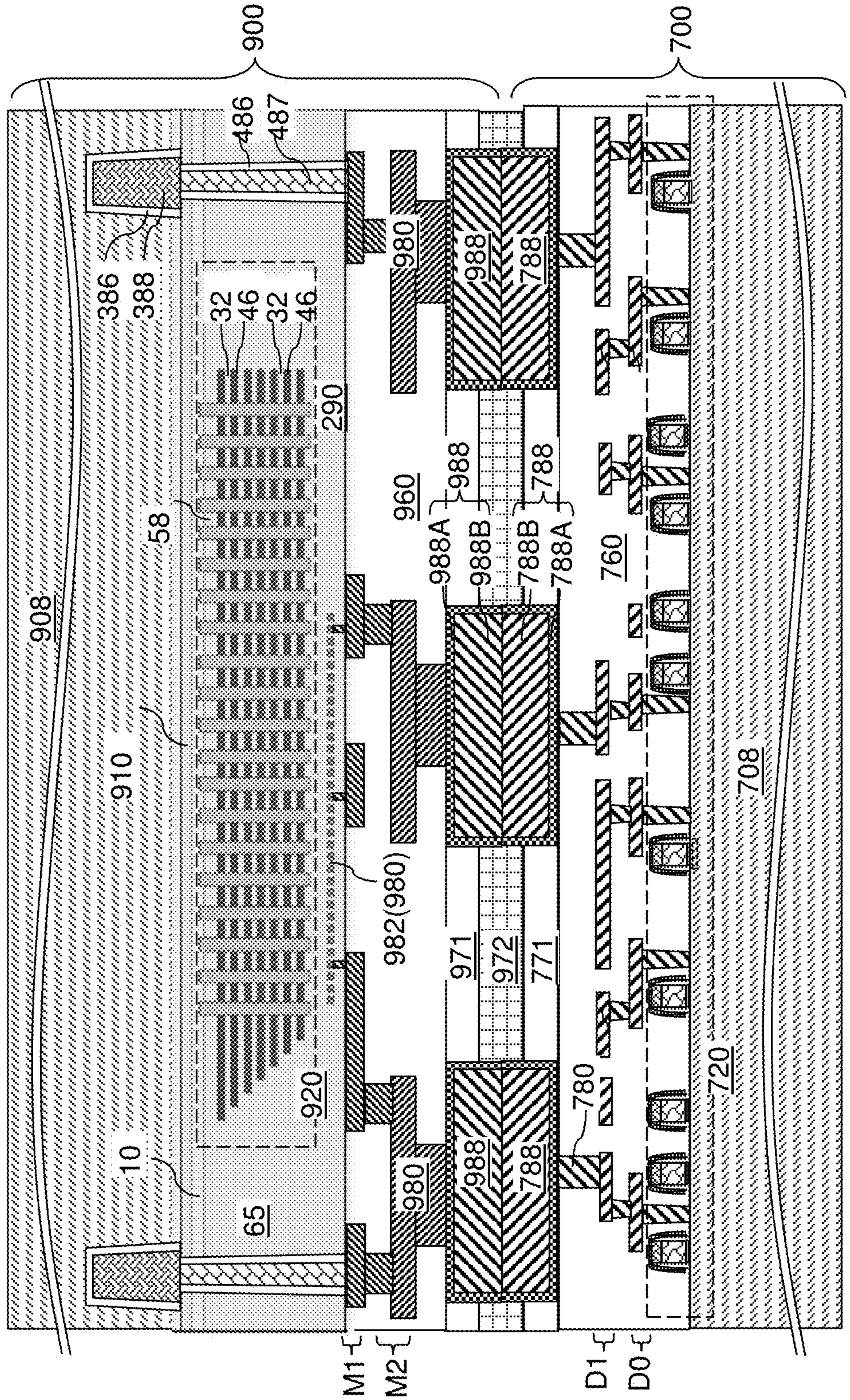
FIG. 8B is a schematic vertical cross-sectional view of the third exemplary structure after formation of a MOF dielectric layer according to an embodiment of the present disclosure.

Referring to FIG. 8B, the processing steps of FIG. 4 can be performed to induce metal-to-metal bonding between the first bonding pads 988 and the second bonding pads 788. The anneal temperature may be selected based on the composition of the second bonding pads 788 and the first bonding pads 988. For example, if the second bonding pads 788 and the first bonding pads 988 include metal fill portions that consist essentially of copper, the anneal temperature may be in a range from 150 degrees Celsius to 400 degrees Celsius. The molecules of the first SAM layer 991 and the second SAM layer 791 (if present) may decompose during the anneal process, and may be evaporated or may be incorporated into the first bonding pads 988 and the second bonding pads 788 as impurity atoms. For example, the first bonding pads 988 and the second bonding pads 788 may include carbon atoms at an interfacial portion thereof. Each bonded pair of a first bonding pad 988 and a second bonding pad 788 may be laterally surrounded by a continuously extending void.

A common MOF dielectric layer 872 can be formed by reacting the first metal-containing precursor layer 992 with a first vapor of a first linking compound. The common MOF dielectric layer 872 can laterally surround the first bonding pads 988 and the second bonding pads 788. For example, a bonded assembly of the first semiconductor die 900 and the second semiconductor die 700 can be placed in a vacuum-tight reaction chamber. An oxidation process can be performed to convert the material of the first metal-containing precursor layer 992 into a metal oxide material in case the first metal-containing precursor layer 992 includes an elemental metal, a metal nitride, or a metal carbide. In case the first metal-containing precursor layer 992 includes a metal oxide material, the oxidation process may be omitted.

The metal oxide material of the first metal-containing precursor layer 992, or the metal oxide material derived from the first metal-containing precursor layer 992, is exposed to the first vapor of the first linking compound (e.g., organic linking compound) that forms a metal-organic framework (MOF) material upon reaction. Any combination of a metallic material for the first metal-containing precursor layer 992 and the first vapor of the first linking compound that is known to form a MOF material may be employed. Generally, the molecular species for the first vapor of the first linking compound can be selected based on the metallic material in the first metal-containing precursor layer 992.

The common MOF dielectric layer 872 can be formed by reaction of the first metal-containing precursor layer 992 and the first vapor of the first linking compound. The first metal-containing precursor layer 992 can be completely consumed during the optional oxidation process and subsequent conversion into the common MOF dielectric layer 872. Various MOF materials can be formed depending on the composition of the first metal-containing precursor layer 992.

The common MOF dielectric layer 872 includes metal-organic framework (MOF) material portions that are formed by reacting the first metal-containing precursor layer 992 with the first vapor of the first linking compound. The MOF material portions comprise a metal-organic framework material including metal ions or clusters and organic ligands located between neighboring pairs of the metal ions or clusters. In one embodiment, the thickness of the first metal-containing precursor layer 992 can be selected such that the common MOF dielectric layer 872 fills the entirety of the void between the first pad-level dielectric layer 971 and the second pad-level dielectric layer 771. The top surface of the common MOF dielectric layer 872 can contact the second pad-level dielectric layer 771. The entirety of the common MOF dielectric layer 872 can have a same material composition throughout.

Figure 9A:
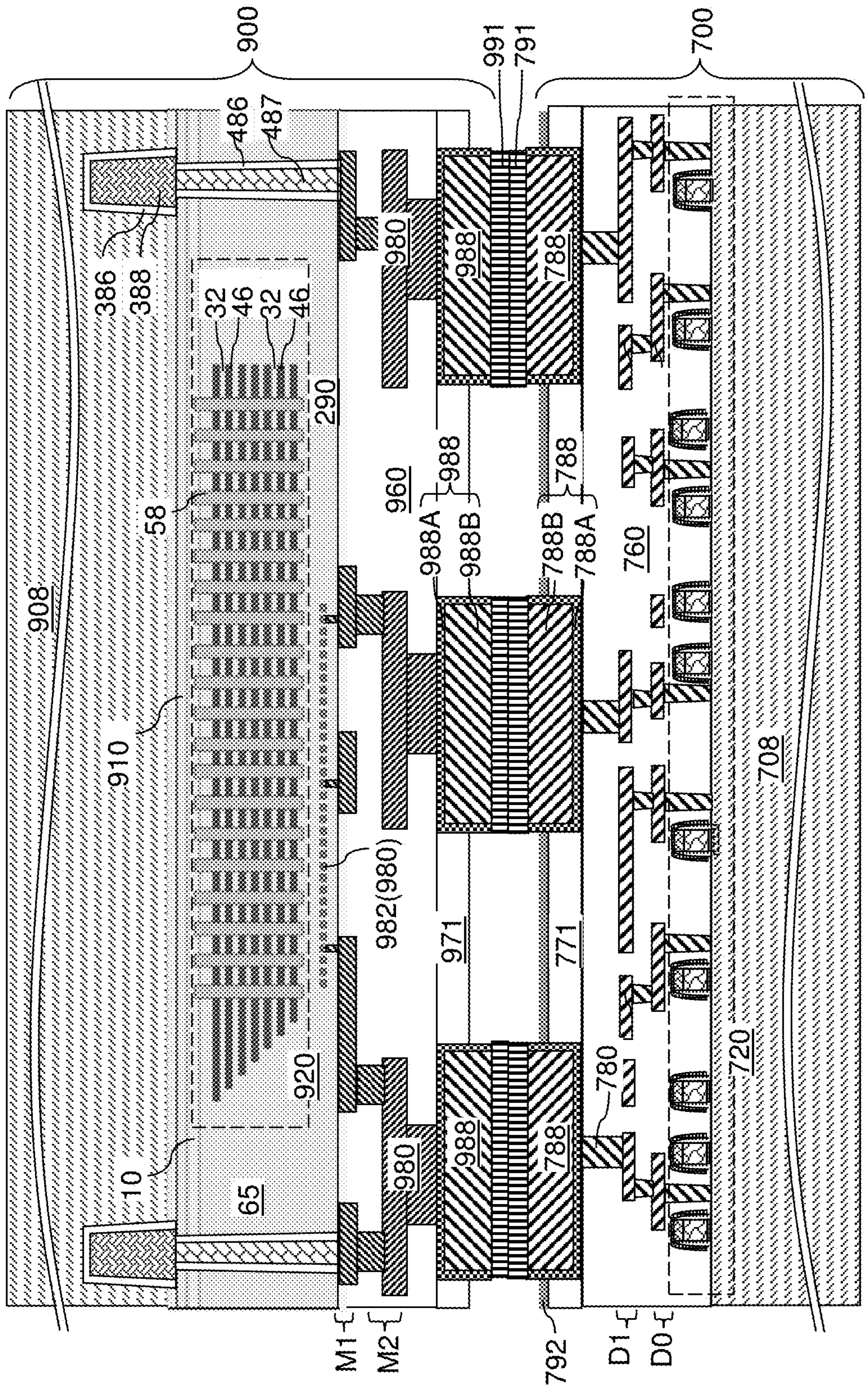
FIG. 9A is a schematic vertical cross-sectional view of a fourth exemplary structure after bonding the first semiconductor die to the second semiconductor die according to an embodiment of the present disclosure.

Referring to FIG. 9A, a fourth exemplary structure according to an embodiment of the present disclosure can be formed by disposing the first semiconductor die 900 of FIG. 1F over the second semiconductor die 700 of FIG. 2D. In other words, the processing steps of FIGS. 1G and 1H and the processing steps of FIG. 2E are omitted before performing the die-to-die alignment step of FIG. 3A. In this case, formation of the first and second SAM layers 991, 771 is optional. The thickness of the second metal-containing precursor layer 792 can be adjusted such that a MOF dielectric layer to be subsequently generated from the second metal-containing precursor layer 792 can fill the entire volume of the void between the first pad-level dielectric layer 971 and the second pad-level dielectric layer 771.

Figure 9B:
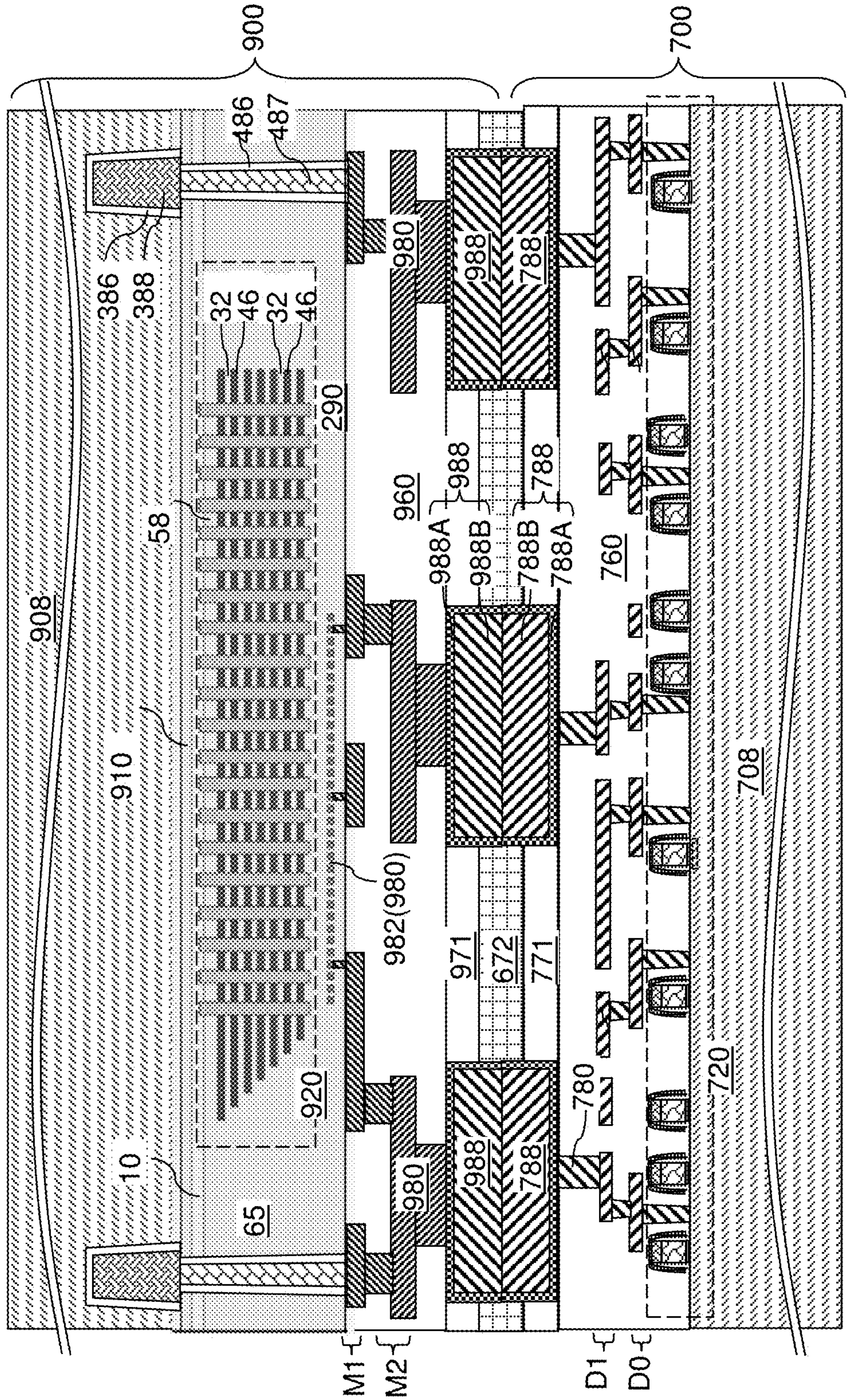
FIG. 9B is a schematic vertical cross-sectional view of the fourth exemplary structure after formation of a MOF dielectric layer according to an embodiment of the present disclosure.

Referring to FIG. 9B, the processing steps of FIG. 4 can be performed to induce metal-to-metal bonding between the first bonding pads 988 and the second bonding pads 788. The anneal temperature may be selected based on the composition of the second bonding pads 788 and the first bonding pads 988. For example, if the second bonding pads 788 and the first bonding pads 988 include metal fill portions that consist essentially of copper, the anneal temperature may be in a range from 150 degrees Celsius to 400 degrees Celsius. The molecules of the first SAM layer 991 (if present) and the second SAM layer 791 (if present) may decompose during the anneal process, and may be evaporated or may be incorporated into the first bonding pads 988 and the second bonding pads 788 as impurity atoms. For example, the first bonding pads 988 and the second bonding pads 788 may include carbon atoms at an interfacial portion thereof. Each bonded pair of a first bonding pad 988 and a second bonding pad 788 may be laterally surrounded by a continuously extending void.

A common MOF dielectric layer 872 can be formed by reacting the second metal-containing precursor layer 792 with a vapor of a linking compound. The common MOF dielectric layer 872 can laterally surround the first bonding pads 988 and the second bonding pads 788. For example, the first semiconductor die 900 can be placed in a vacuum-tight reaction chamber. An oxidation process can be performed to convert the material of the second metal-containing precursor layer 792 into a metal oxide material in case the second metal-containing precursor layer 792 includes an elemental metal, a metal nitride, or a metal carbide. In case the second metal-containing precursor layer 792 includes a metal oxide material, the oxidation process may be omitted.

The metal oxide material of the second metal-containing precursor layer 792, or the metal oxide material derived from the second metal-containing precursor layer 792, is exposed to the first vapor of the first linking compound (e.g., organic linking compound) that forms a metal-organic framework (MOF) material upon reaction. Any combination of a metallic material for the second metal-containing precursor layer 792 and the vapor of the linking compound that is known to form a MOF material may be employed. Generally, the molecular species for the first vapor of the first linking compound can be selected based on the metallic material in the second metal-containing precursor layer 792.

The common MOF dielectric layer 872 can be formed by reaction of the second metal-containing precursor layer 792 and the vapor of the linking compound. The second metal-containing precursor layer 792 can be completely consumed during the optional oxidation process and subsequent conversion into the common MOF dielectric layer 872. Various MOF materials can be formed depending on the composition of the second metal-containing precursor layer 792.

The common MOF dielectric layer 872 includes metal-organic framework (MOF) material portions that are formed by reacting the second metal-containing precursor layer 792 with the vapor of the linking compound. The MOF material portions comprise a metal-organic framework material including metal ions or clusters and organic ligands located between neighboring pairs of the metal ions or clusters. In one embodiment, the thickness of the second metal-containing precursor layer 792 can be selected such that the common MOF dielectric layer 872 fills the entirety of the void between the first pad-level dielectric layer 971 and the second pad-level dielectric layer 771. The top surface of the common MOF dielectric layer 872 can contact the first pad-level dielectric layer 971. The entirety of the common MOF dielectric layer 872 can have a same material composition throughout.

Referring to all drawings and according to various embodiments, a bonded assembly is provided, which comprises: a first semiconductor die 900 comprising a first substrate 908, first semiconductor devices 920, and first bonding pads 988 that are electrically connected to a respective node of the first semiconductor devices 920; a second semiconductor die 700 comprising a second substrate 708, second semiconductor devices 720, and second bonding pads 788 that are electrically connected to a respective node of the second semiconductor devices 720 and bonded to a respective one of the first bonding pads 988; and at least one metal-organic framework (MOF) dielectric layer {(972, 772) or 872} that laterally surrounds at least one of the first bonding pads 988 and the second bonding pads 788.

In one embodiment, the first semiconductor die 900 comprises a first pad-level dielectric layer 971 laterally surrounding and contacting proximal portions of sidewalls of the first bonding pads 988 that are proximal to the first substrate 908; and the at least one MOF dielectric layer {(972, 772), or 872} laterally surrounds and contacts distal portions of the first bonding pads 988 that are distal from the first substrate 908.

In one embodiment, the first pad-level dielectric layer 971 comprises a material selected from undoped silicate glass, a doped silicate glass, organosilicate glass, silicon nitride, or a dielectric metal oxide.

In one embodiment, the second semiconductor die 700 comprises a second pad-level dielectric layer 771 laterally surrounding and contacting proximal portions of sidewalls of the second bonding pads 788 that are proximal to the second substrate 708; and the at least one MOF dielectric layer {(972, 772) or 872} laterally surrounds and contacts distal portions of the second bonding pads 788 that are distal from the second substrate 708.

In one embodiment, the at least one MOF dielectric layer (972, 772) comprises: a first MOF dielectric layer 972 laterally surrounding and contacting the first bonding pads 988; and a second MOF dielectric layer 772 laterally surrounding and contacting the second bonding pads 788. In one embodiment, a horizontal interface between the first MOF dielectric layer 972 and the second MOF dielectric layer 772 is located within a same horizontal plane as interfaces between mating pairs of the first bonding pads 988 and the second bonding pads 788.

In one embodiment, the at least one MOF dielectric layer 872 consists of a common single MOF dielectric layer that laterally surrounds and contacts each of the first bonding pads 988 and the second bonding pads 788.

In one embodiment, each of the first bonding pads 988 comprises: a metallic liner 988A contacting the at least one MOF layer {(972, 772) or 872}; and a metallic fill material portion 988B that is laterally surrounded by the metallic liner 988A and laterally spaced from the at least one MOF layer {(972, 772) or 872}. In one embodiment, the metallic liner 908A comprises a metallic nitride material; and the metallic fill material portion 988B comprises copper.

In one embodiment, the at least one MOF layer {(972, 772) or 872} comprises at least one metallic element that is not present in the first bonding pads 988 and the second bonding pads 788.

In one embodiment, one of the first semiconductor die 900 and the second semiconductor die 700 comprises a memory die including a three-dimensional array of memory elements; and another of the first semiconductor die 900 and the second semiconductor die 700 comprise a logic die including a logic circuit configured to control operation of the three-dimensional array of memory elements.

While the present disclosure is described employing an embodiment in which the first semiconductor die 900 comprises a memory die and the second semiconductor die 700 comprises a logic die, the embodiments of the present disclosure can be practiced in any pair of semiconductor dies including any type of semiconductor devices therein. All such variations are expressly contemplated herein.

In prior art bonded assemblies, voids tend to occur at the bonding interfaces due to the height difference between the bonding pads and the surrounding pad-level dielectric layer. If the bonding pads protrude above the pad-level dielectric layer, then voids tend to occur between the opposing pad-level dielectric layers of bonded die. If the bonding pads are recessed below the pad-level dielectric layer, then the voids tend to occur at the edges of the bonding pads. The structures and methods of the embodiments of the present disclosure can be employed to provide a bonded assembly of a first semiconductor die 900 and a second semiconductor die 700 including bonded pairs of bonding pads (988, 788) that are laterally surrounded by at least one MOF bonding dielectric layer {(972, 772) or 872}. The at least one MOF bonding dielectric layer has a controlled thickness which may reduce or eliminate voids at the interface between the two die by reducing or avoiding protruding or recessed bonding pads. Furthermore, the at least one MOF bonding dielectric reduces or eliminates copper diffusion from the bonding pads into the bonding dielectric.

FIGS. 10A-10H are sequential schematic vertical cross-sectional views of a first semiconductor die for forming a first configuration of a fifth exemplary structure according to a fifth embodiment of the present disclosure.

Figure 10A:
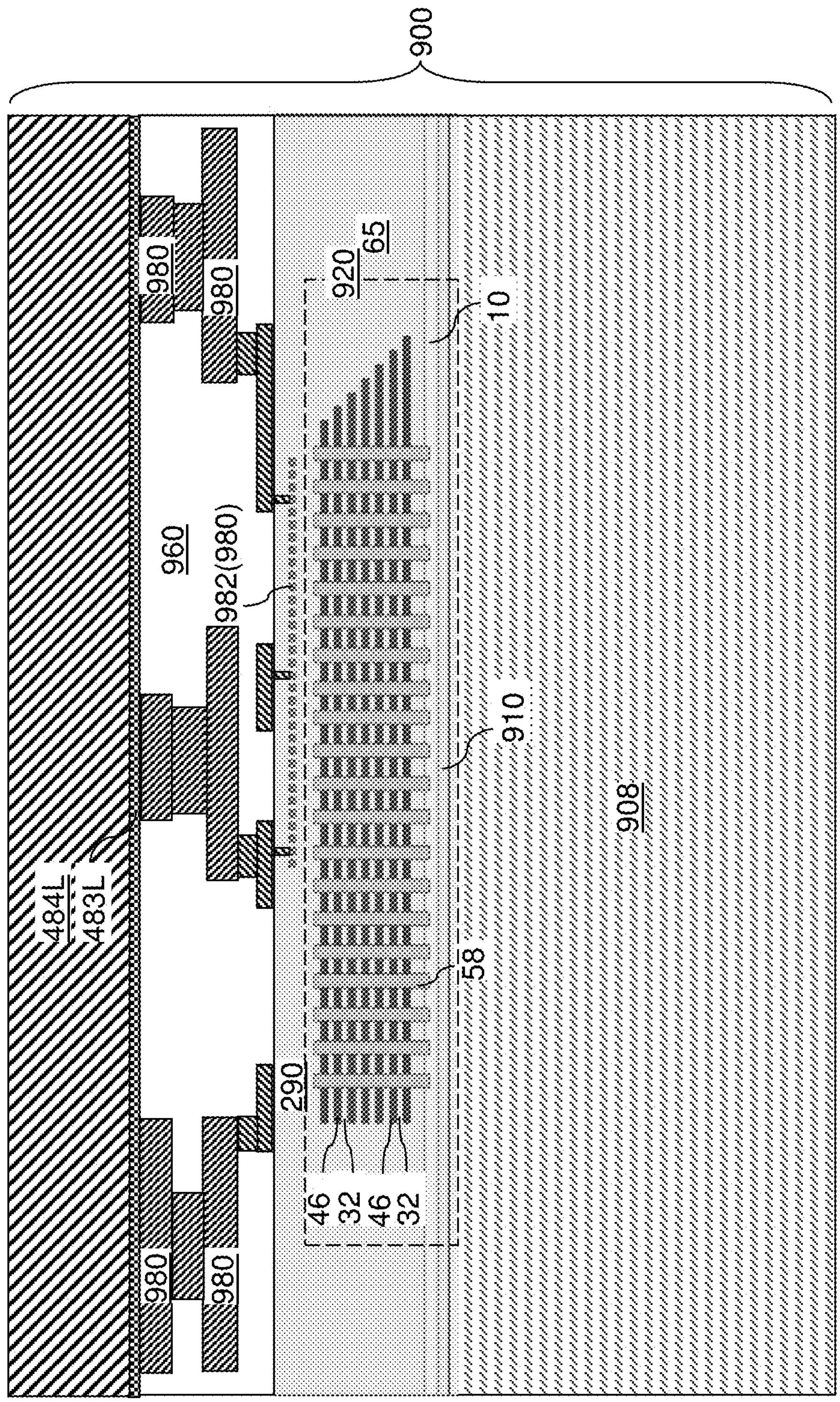
FIGS. 10A-10H are sequential schematic vertical cross-sectional views of a first semiconductor die for forming a first configuration of a fifth exemplary structure according to a fifth embodiment of the present disclosure.

Referring to FIG. 10A, the first semiconductor die 900 according to the fifth embodiment of the present disclosure may be derived from the first semiconductor die of the second exemplary structure as illustrated in FIG. 1A by omitting formation of the first pad-level dielectric layer 971. In one embodiment, the sizes of the first metal interconnect structures 980 may be modified so that the physically exposed areas of the first metal interconnect structures 980 are smaller than the areas of first bonding pads to be subsequently formed thereupon.

A first metallic adhesion liner layer 483L can be optionally deposited as a blanket (unpatterned) layer over the topmost first dielectric material layer 960 and the physically exposed surfaces of the first metal interconnect structures 980. The first metallic adhesion liner layer 483L is an optional structure, and may, or may not be employed. In case the topmost first dielectric material layer 960L includes a dielectric material providing high adhesion strength to metallic materials (such as silicon nitride or a silicon carbide nitride), the first metallic adhesion liner layer 483L may be omitted. The first metallic adhesion liner layer 483L may include a metallic nitride material such as TiN, TaN, or WN, a metallic carbide material such as TiC, TaC, or WC, or a metal or an intermetallic alloy that can provide enhanced adhesion for a first metal layer 464L that is subsequently deposited thereupon. The first metallic adhesion liner layer 483L may be deposited, for example, by physical vapor deposition or chemical vapor deposition. The thickness of the first metallic adhesion liner layer 483L can be in a range from 3 nm to 100 nm, such as from 10 nm to 30 nm, although lesser and greater thicknesses may also be employed.

A first metal layer 484L can be deposited on the first metallic adhesion liner layer 483L, or on the physically exposed top surfaces of the first metal interconnect structures 980 and the topmost first dielectric material layer 960. The first metal layer 484L includes a bondable metallic material that can form metal-to-metal bonding. In one embodiment, the first metal layer 484L includes, and/or consists essentially of, a metal or a metal alloy, such as copper, nickel, cobalt, ruthenium or their alloys. The first metal layer 484L can be deposited by physical vapor deposition and/or electroplating. The thickness of the first metal layer 484L can be in a range from 100 nm to 1,000 nm, such as 200 nm to 500 nm, although lesser and greater thicknesses may also be employed.

Figure 10B:
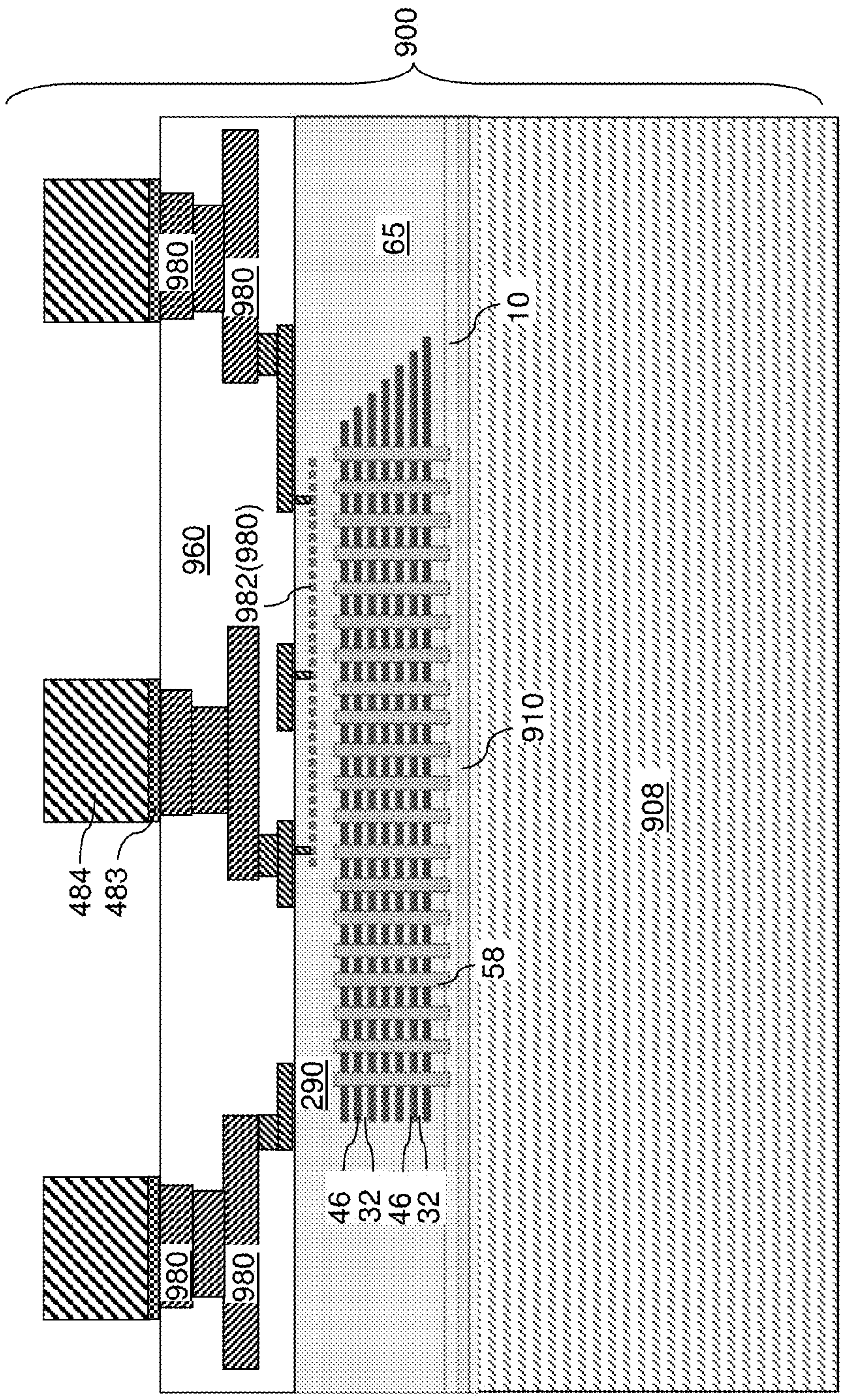

Referring to FIG. 10B, a photoresist layer (not shown) can be applied over the first metal layer 484L, and can be lithographically patterned into discrete photoresist material portions. An anisotropic etch process can be performed to etch unmasked portions of the first metal layer 484L and the first metallic adhesion liner layer 483L (if present) that are not masked by the patterned portions of the photoresist layer. The first metal layer 484L and the first metallic adhesion liner layer 483L can be patterned into vertical stacks of a first metallic adhesion liner 483 and a first metallic plate 484. In one embodiment, each of the first metallic adhesion liners 483 may have the same horizontal cross-sectional shape as a horizontal cross-sectional shape of a respective overlying one of the first metallic plates 484. In one embodiment, sidewalls of each first metallic adhesion liner 483 may be vertically coincident with sidewalls of a respective overlying first metallic plate 484. In one embodiment, the sidewalls of the metallic adhesion liners 483 and the sidewalls of the first metallic plates 484 may be vertical.

In one embodiment, all surfaces of the first metal interconnect structures 980 that are located at the horizontal plane including the topmost surface of the first dielectric material layers 980 can be covered by, and may be contacted by, a respective one of the first metallic adhesion liners 483 and the first metallic plates 484. The first metallic plates 484 can be electrically connected to a respective node of the first semiconductor devices through the first metal interconnect structures 980. The optional first metallic adhesion liners 483 and the first metallic plates 484 are components of first bonding pads.

Figure 10C:
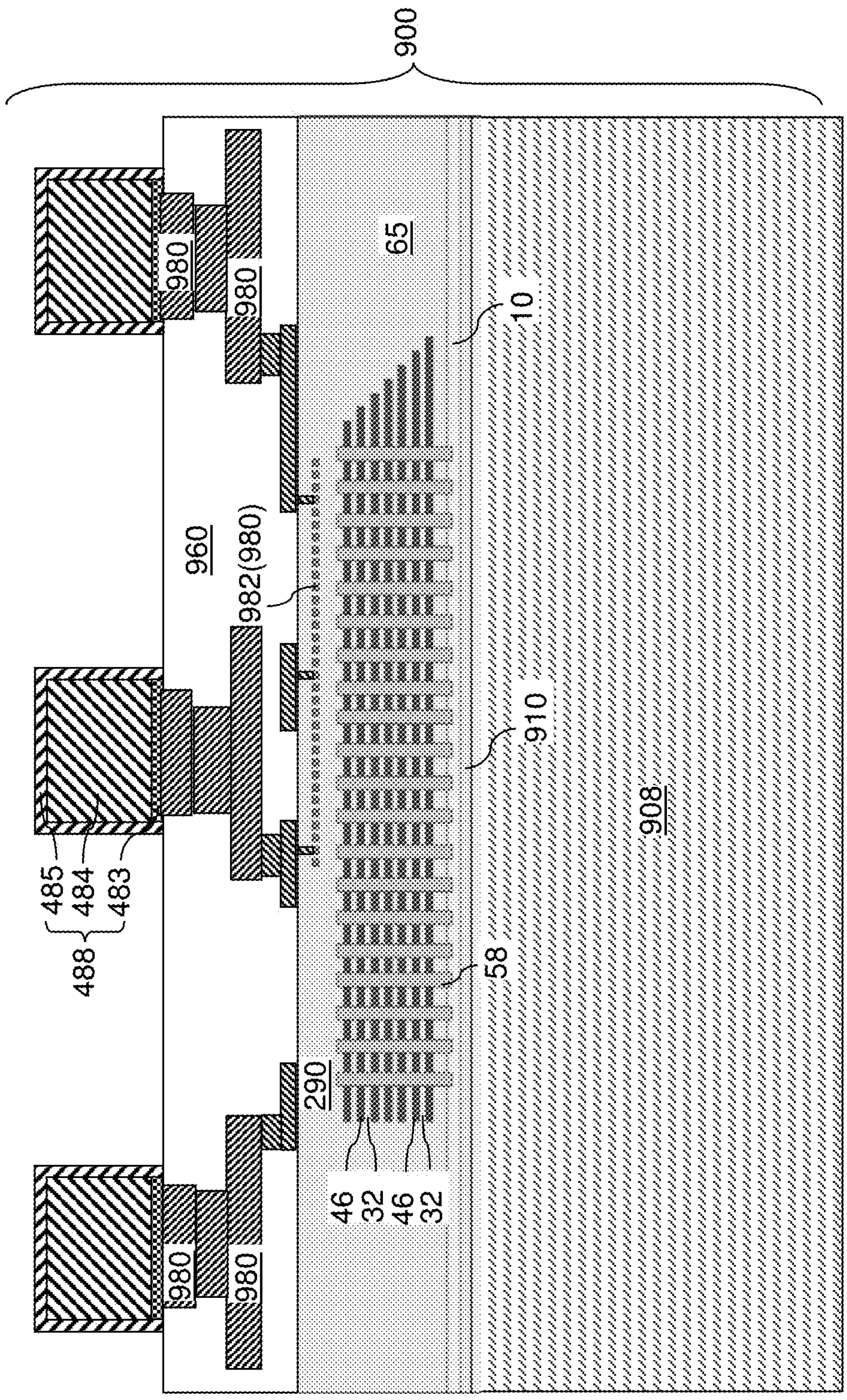

Referring to FIG. 10C and according to an embodiment of the present disclosure, first metallic capping layers 485 may be optionally deposited on physically exposed metallic surfaces of the optional first metallic adhesion liners 483 and the first metallic plates 484. The first metallic caping layers 485 may include a metal that reduces and/or suppresses electromigration (such as cobalt or a cobalt tungsten alloy) and/or may include a metal that suppresses oxidation of the material of the first metallic plates 484 (such as titanium, palladium, platinum, etc.). The first metallic capping layers 485 can be grown from physically exposed metallic surfaces of the optional first metallic adhesion liners 483 and the first metallic plates 484 by performing a selective deposition process that deposits a first metallic capping material while suppressing growth of the first metallic capping material from dielectric surfaces such as the physically exposed surfaces of the first dielectric material layers 960. The selective deposition process may comprise an electroplating process or an area selective chemical vapor deposition process that grows the first metallic capping material only from the metallic surfaces of the optional first metallic adhesion liners 483 and the first metallic plates 484 while suppressing growth of the first metallic capping material from the dielectric surfaces of the first dielectric material layers 960.

Each of the first metallic capping layers 485 can be deposited on a top surface and sidewalls of a respective one of the first metallic plates 484 and sidewalls of a respective one of the first metallic adhesion liners 483. Each continuous set of an optional first metallic adhesion liner 483, a first metallic plate 484, and an optional first metallic capping liner 485 constitutes a first bonding pad 488. Each first bonding pad 488 may have a width of 100 nm to 300 nm, and the first bonding pad pitch may be 1,000 nm or less, such as 500 nm or less, for example 100 nm to 300 nm. In one embodiment, each of the first bonding pads 488 comprises a combination of a first metallic plate 484 and a first metallic capping layer 485. In one embodiment, each of the first metallic capping liners 485 comprises a horizontally-extending portion contacting the distal planar surface of a respective one of the first metallic plates 484 and a tubular portion contacting the sidewalls of the respective one of the first metallic plates 484 and having a same thickness as the horizontally-extending portion. The distal planar surface is more distal from the first substrate 908 than the sidewall surfaces of the first metallic plate are from the first substrate.

Figure 10D:
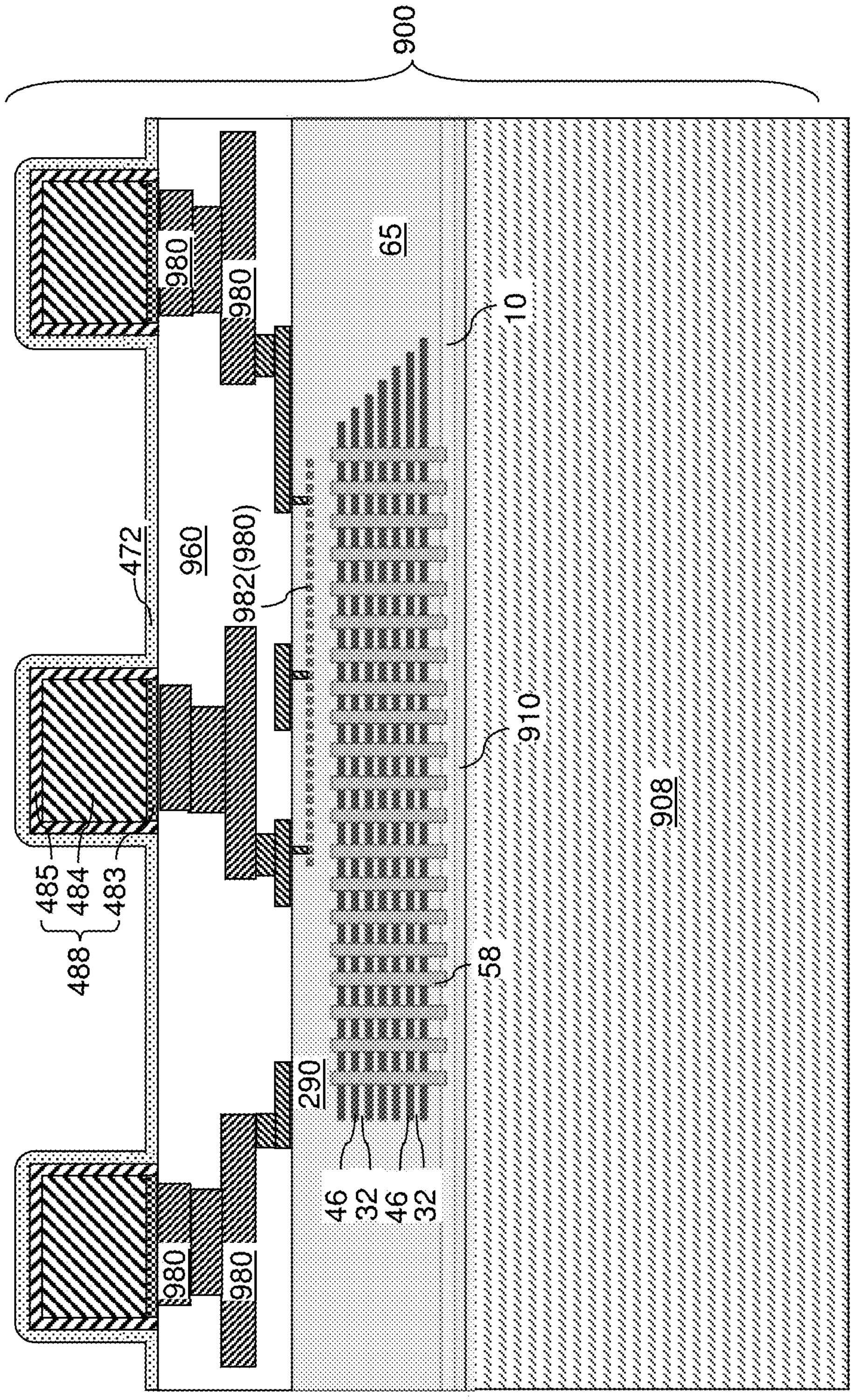

Referring to FIG. 10D, a first dielectric liner 472 can be deposited on physically exposed surfaces of the first bonding pads 488, for example, by a conformal deposition process such as a chemical vapor deposition process. The first dielectric liner 472 comprises a dielectric material such as silicon oxide, silicon nitride, silicon oxynitride, silicon carbide nitride, or a dielectric metal oxide (such as aluminum oxide, hafnium oxide, titanium oxide, yttrium oxide, or lanthanum oxide). The first dielectric liner 472 may be employed as a diffusion barrier layer or as an adhesion promoter layer for a low dielectric constant material, such as a MOF dielectric to be subsequently deposited. The thickness of the first dielectric liner 472 may be in a range from 1 nm to 40 nm, such as from 2 nm to 10 nm, although lesser and greater thicknesses may also be employed. Portions of the first dielectric liner 472 located adjacent to top edges of the first bonding pads 488 may have convex surfaces. A vertical distance between the horizontally-extending portion of the first dielectric liner 472 and the first substrate 908 may be less than, or may be equal to, a vertical distance between each of the first bonding pads and the first substrate. In one embodiment, each of the vertically-extending portions of the first dielectric liner 472 comprises a straight outer sidewall segment that vertically extends parallel to a sidewall of a respective one of the first bonding pads 488 and a convex outer sidewall segment that is adjoined to a distal end of the straight outer sidewall segment.

Figure 10E:
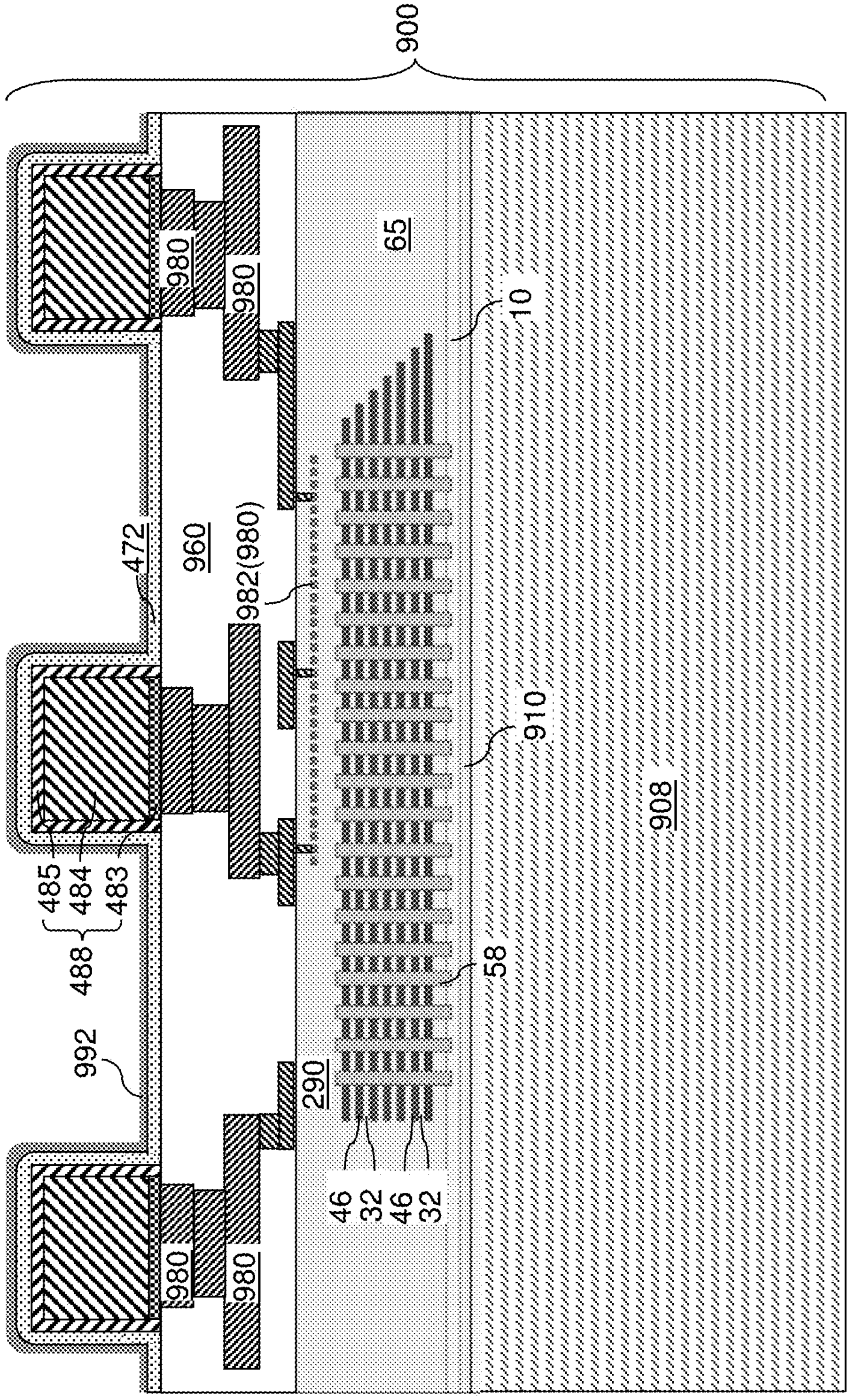
Figure 10F:
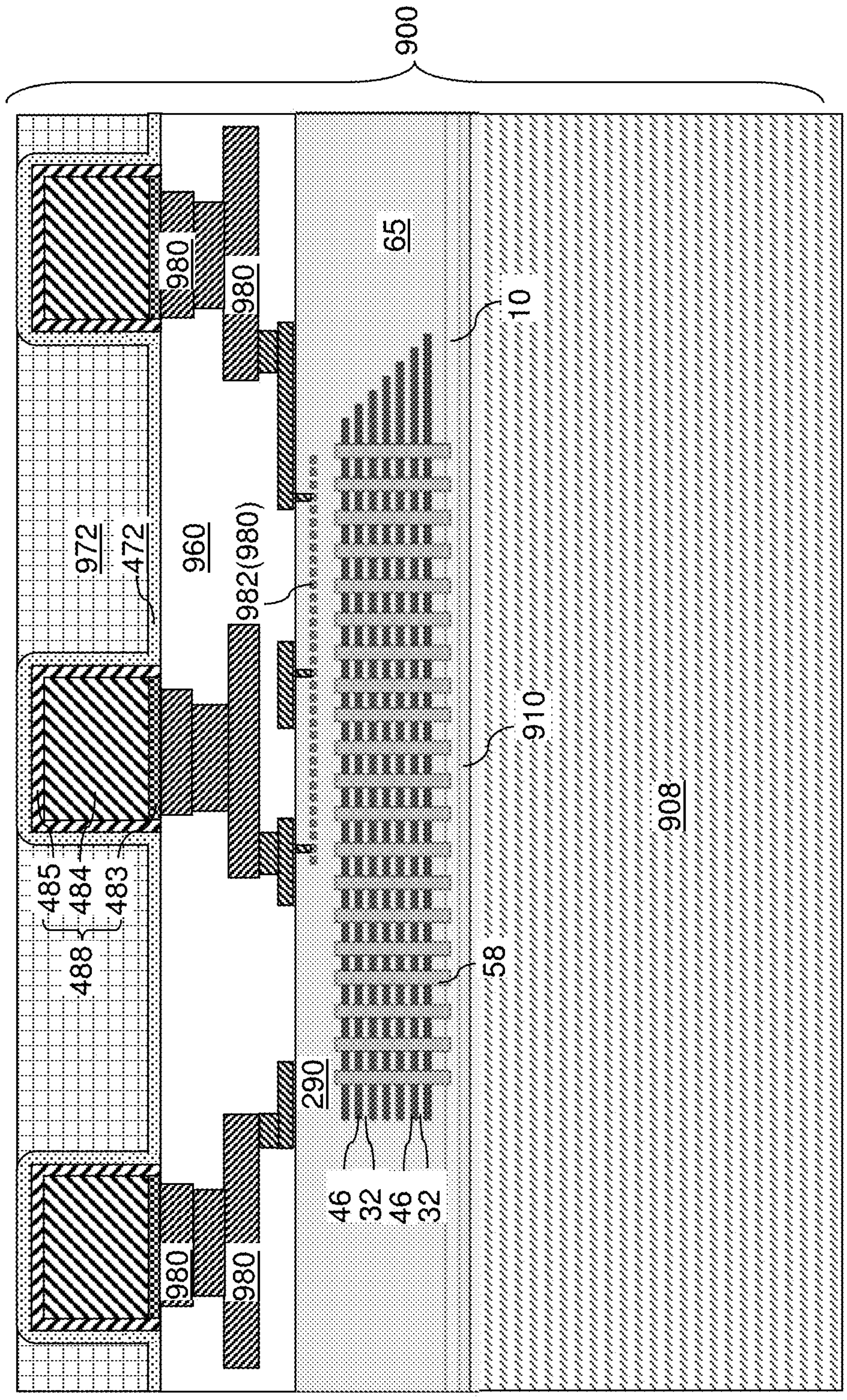

Referring to FIG. 10E, a first low dielectric constant ("low-k") dielectric layer 972 is formed between the first bonding pads 488. The first low-k dielectric layer 972 may be be formed on the optional first dielectric liner 472 or on the surfaces of the first bonding pads 488 and the physically exposed portions of the topmost surface of the first dielectric material layers 980. The first low-k dielectric layer 972 may have a dielectric constant of 2.6 or less, such as a range from 1.7 to 2.6, such as from 1.8 to 2.5.

In one embodiment, the first low-k dielectric layer 972 is an organosilicate glass layer. The organosilicate glass layer may be deposited by chemical vapor deposition such as plasma-enhanced chemical vapor deposition (PECVD) or spin coating (e.g., to form a spin-on glass). The organosilicate glass layer includes Si, C, O, H, and optionally N. The organosilicate glass may comprise any organosilicate glass material known in the art, and may comprise, for example, a nonporous organosilicate glass material or a mesoporous organosilicate glass material.

In another embodiment, the first low-k dielectric layer 972 is metal-organic framework (MOF) material. The MOF material may be formed by depositing a metal-containing precursor layer between the first bonding pads 488. The metal-containing precursor layer includes a metal-containing precursor material that forms MOF material upon exposure to a vapor of a linking compound (i.e., a linker precursor). The metal-containing precursor layer can be formed by any conformal deposition of the metal-containing precursor material. In one embodiment, the metal-containing precursor layer may have the same material composition and the same thickness range as the described above. A MOF first low-k dielectric layer 972 can be formed by reacting the metal-containing precursor layer with a first vapor of a first linking compound.

If the first low-k dielectric layer 972 is formed by a self-planarizing process, such as spin coating, then the top surface of the first low-k dielectric layer 972 may be located at or below the horizontal plane including the top surfaces of the first bonding pads 488. Alternatively, the first low-k dielectric layer 972 may be etched back after deposition such that the top surface of the first low-k dielectric layer 972 may be located at or below the horizontal plane including the top surfaces of the first bonding pads 488.

Figure 10G:
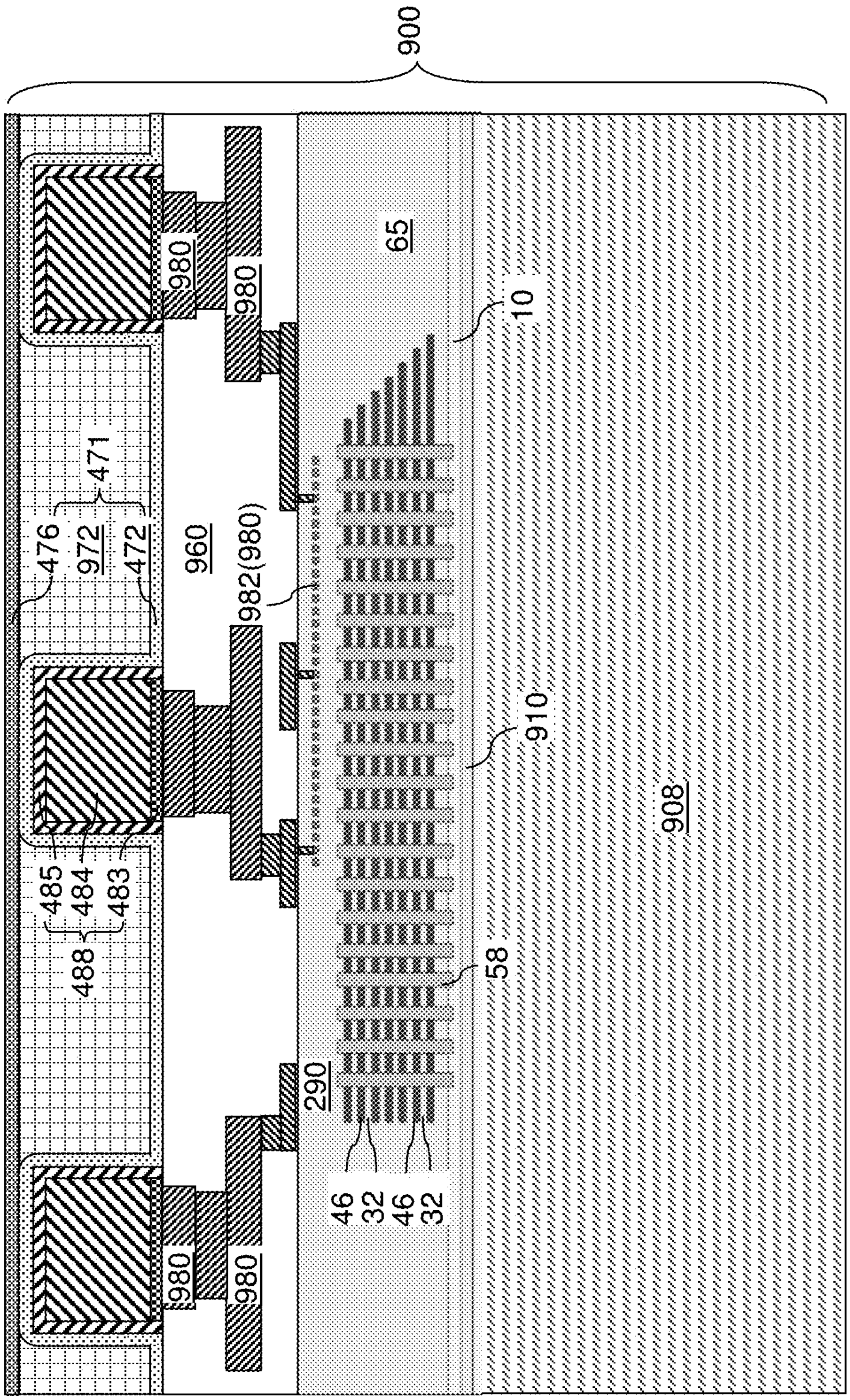

Referring to FIG. 10G, a first dielectric capping layer 476 can be optionally formed over the first bonding pads 488 and over a planar top surface of the first low-k dielectric layer 972. The first dielectric capping layer 476 may comprise a bondable dielectric material that can provide dielectric-to-dielectric bonding such as undoped silicate glass or a doped silicate glass. Alternatively, the first dielectric capping layer 476 may comprise a diffusion barrier material such as silicon nitride or silicon carbide nitride. The first dielectric capping layer 476 may be deposited by chemical vapor deposition. The thickness of the first dielectric capping layer 476 may be in a range from 10 nm to 100 nm, such as from 15 nm to 50 nm, although lesser and greater thicknesses may also be employed. The combination of the optional first dielectric liner 472, the first low-k dielectric layer 972, and the first dielectric capping layer 476 comprises a first pad-level dielectric layer 471.

Figure 10H:
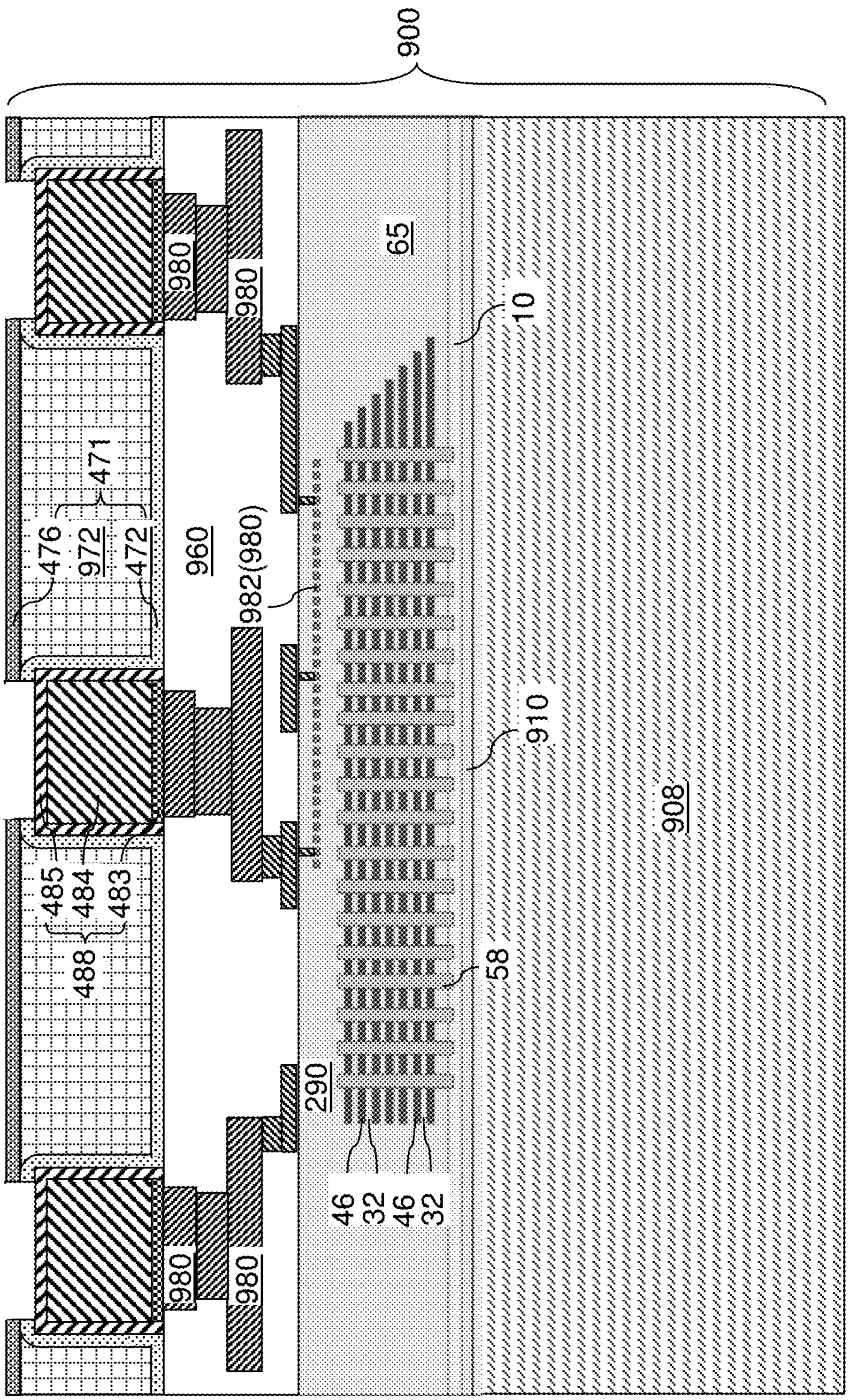

Referring to FIG. 10H, in case the optional first dielectric liner 472 and/or the optional first dielectric capping layer 476 are employed, a photoresist layer (not shown) can be applied over the first dielectric capping layer 476, and can be lithographically patterned to form an array of openings therethrough. Each opening in the photoresist layer can be formed above a top surface of a respective one of the first bonding pads 488. In one embodiment, sidewalls of each opening in the photoresist layer may be laterally offset inward from vertical planes including the sidewalls of a respective underlying first bonding pad 488. The lateral offset distance between the sidewalls of each opening and the sidewalls of the respective underlying first bonding pad 488 may be in a range from 5 nm to 50 nm, such as from 10 nm to 30 nm, although lesser and greater lateral offset distances may also be employed.

At least one etch process can be subsequently performed to remove unmasked portions of the first dielectric capping layer 476 and the optional first dielectric liner 472 from underneath the openings in the photoresist layer. A top surface of a first bonding pad 488 can be physically exposed underneath each opening in the photoresist layer. Generally, openings can be formed through the first dielectric capping layer 476 and/or through the first dielectric liner 472 over areas of the first bonding pads 488. At least the center region of the top surface of each first bonding pad 488 can be physically exposed underneath the openings through the first dielectric capping layer 476 and the first dielectric liner 472. In case both the first dielectric liner 472 and the first dielectric capping layer 476 are present, sidewalls of the openings through the first dielectric liner 472 can be vertically coincident with the sidewalls of the first dielectric capping layer 476.

In a conventional die bonding scheme, chemical mechanical polishing (CMP) may induce voids in the bonding pads, such as voids located in the top and/or bottom pad sidewalls. Without wishing to be bound by a particular theory, it is believed that such voids occur mainly due to galvanic corrosion and etching rate difference of copper and barrier materials of the bonding pads during the CMP step. After bonding, these voids accumulate at one side of the bonding pad, leading to device failure. Furthermore, electro-migration with the stress current flowing up (electron wind flowing down) may exacerbate this void problem. The copper in the top pad may be driven down by electron wind, such that the copper moves down and then moves laterally in the bottom pad. The empty volume at the bonding interface is filled up with the moved copper, while the voids may migrate to the bonding interface and then move up. The voids may accumulate at the bottom of the top pad and create open interconnection. The void accumulation issue could be worse for finer pitch bonding pads having a pitch of 500 nm or less because the sidewall/pad area is reduced. Therefore, it becomes easier for material diffusion along sidewall to accumulate void.

In contrast, in the present embodiment of the present disclosure, the metal (e.g., copper) layer 484L deposition precedes the dielectric material deposition, and the metal layer 484L may be patterned into the plates 484 by direct metal etching. Therefore, the CMP process may be omitted during formation of the bonding pads 488. Since the CMP process is omitted, the voids are reduced or eliminated, which improves the device reliability and improves electromigration performance. In the present embodiment, there is no need to deposit copper into openings in a dielectric layer. Therefore, the adhesion layer 483 is an optional layer and may be omitted to simplify the process. For some dielectrics, such as SiCN and SiN, no barrier layer for the copper plates 484 are needed in this case. Likewise, a liner between the copper plates 484 and the dielectric is optional and may be omitted to simplify the process. The use of a low-k material between the bonding pads 488 reduce the capacitance between adjacent bonding pads 488.

Figure 11:
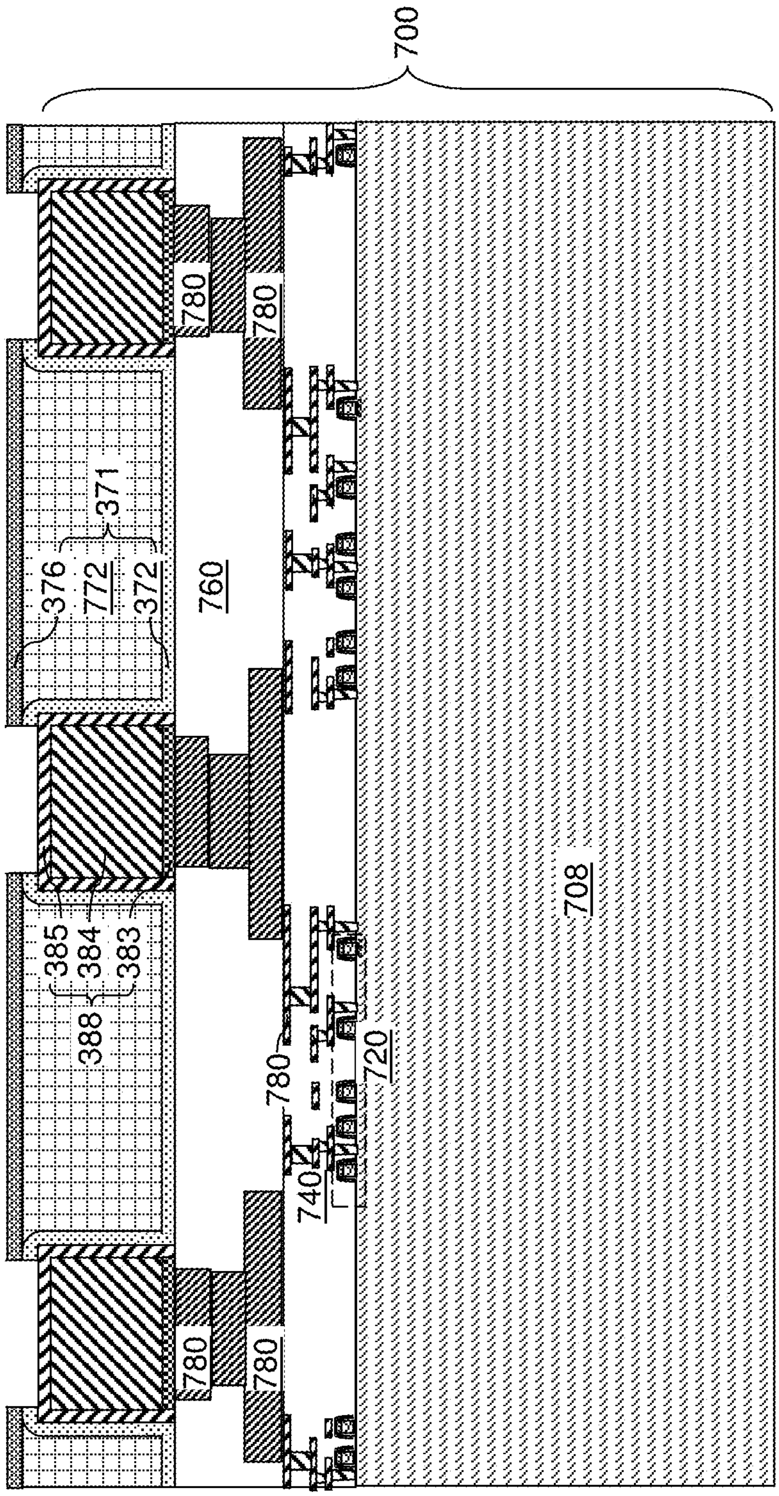
FIG. 11 is a schematic vertical cross-sectional view of a first configuration of a second semiconductor die for forming the fifth exemplary structure according to the fifth embodiment of the present disclosure.

Referring to FIG. 11, a first configuration of a second semiconductor die 700 for forming the fifth exemplary structure according to the fifth embodiment of the present disclosure is illustrated. The second semiconductor die 700 can be derived from the second semiconductor die 700 of FIG. 2A by omitting formation of the second pad-level dielectric layer 771 and the second bonding pads 788, and by forming a second pad-level dielectric layer 371 and second bonding pads 388. The sizes of the second metal interconnect structures 780 may be modified so that the areas of the topmost surfaces of the second metal interconnect structures 780 are smaller than the areas of second bonding pads 388 that are formed thereupon. The second pad-level dielectric layer 771 is replaced with a second pad-level dielectric layer 371, and the second bonding pads 778 are replaced with second bonding pads 388. The second low-k dielectric layer 772 is a low-k organosilicate glass or MOF layer having a dielectric constant of 2.6 or less, such as a range from 1.7 to 2.6, such as from 1.8 to 2.5.

Generally, the second pad-level dielectric layer 371 of the second semiconductor die 700 can be formed by performing a set of processing steps for forming the first pad-level dielectric layer 471 with any needed changes. The second bonding pads 388 of the second semiconductor die 700 can be formed by performing a set of processing steps for forming the first bonding pads 488 with any needed changes. Generally, each component within the second bonding pads 388 may have any material composition that may be employed for the corresponding component within the first bonding pads 488 as described above. Each component within the second pad-level dielectric layer 371 may have any material composition that may be employed for the corresponding component within the first pad-level dielectric layer 471 as described above. Each component within the second bonding pads 388 may have the same thickness range as the thickness range that may be employed for the corresponding component within the first bonding pads 488 as described above. Each component within the second pad-level dielectric layer 371 may have the same thickness range as the thickness range that may be employed for the corresponding component within the first pad-level dielectric layer 471 as described above. Each continuous set of an optional second metallic adhesion liner 383, a second metallic plate 384, and an optional second metallic capping liner 385 constitutes a second bonding pad 388. The combination of the optional second dielectric liner 372, the second low-k dielectric layer 772, and the second dielectric capping layer 376 comprises a second pad-level dielectric layer 371. A second semiconductor die 700 comprising a second substrate 708, second semiconductor devices 720, and second bonding pads 388 that are electrically connected to a respective node of the second semiconductor devices 720 and laterally surrounded by a second pad-level dielectric layer 371.

Figure 12:
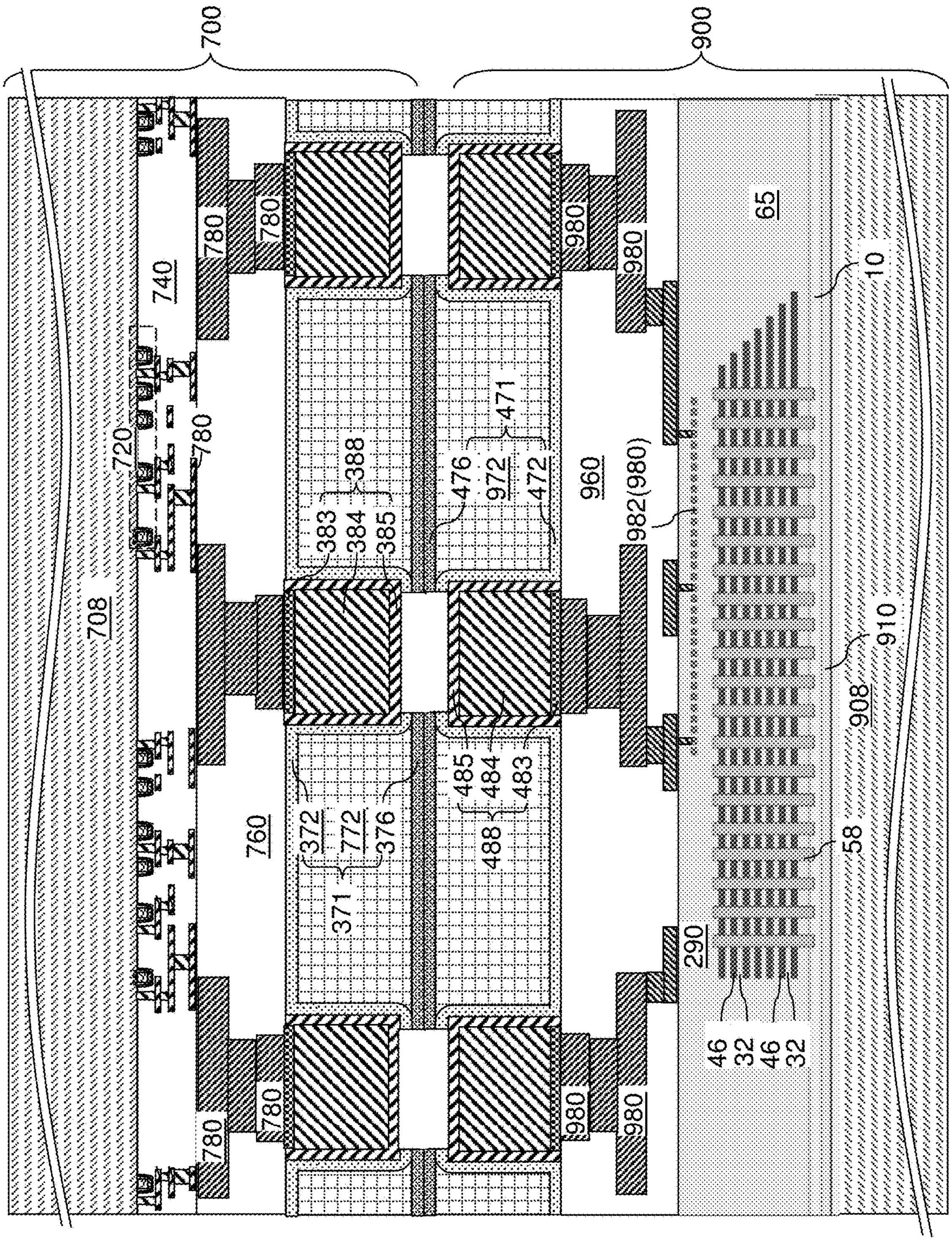
FIG. 12 is a vertical cross-sectional view of the first configuration of the fifth exemplary structure after the first semiconductor die and the second semiconductor die are aligned for bonding according to the fifth embodiment of the present disclosure.

Referring to FIG. 12, the first semiconductor die 900 and the second semiconductor die 700 can be aligned for bonding by bringing the distal horizontal surface of the first pad-level dielectric layer 471 into contact with the distal horizontal surface of the second pad-level dielectric layer 371 such that each first bonding pad 488 has an areal overlap with a respective one of the second bonding pads 388 in a plan view, i.e., in a view along a direction that is perpendicular to the top surface of the first substrate 908. In one embodiment, at least one of the optional first dielectric liner 472 and/or the optional first dielectric capping layer 476 may be present in the first semiconductor die 900, and/or at least one of the optional second dielectric liner 372 and/or the optional second dielectric capping layer 376 may be present within the second semiconductor die 700. In this case, each mating pair of a first bonding pad 488 and a second bonding pad 388 faces each other through an opening or openings in the optional first dielectric liner 472, the optional first dielectric capping layer 476, the optional second dielectric liner 372, and/or the optional second dielectric capping layer 376.

Figure 13A:
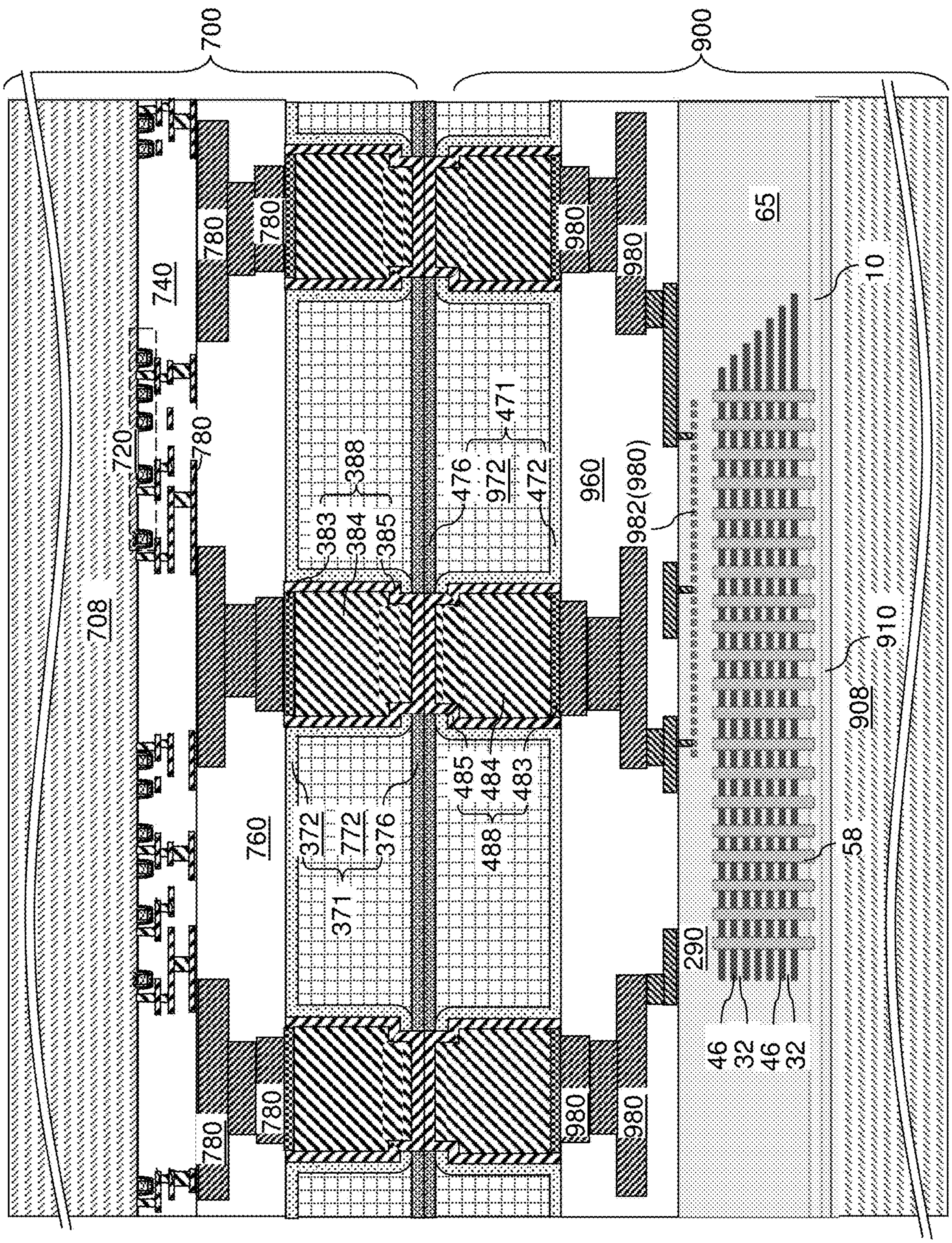
FIG. 13A is a vertical cross-sectional view of the first configuration of the fifth exemplary structure after bonding the second semiconductor die to the first semiconductor die according to the fifth embodiment of the present disclosure.

Referring to FIG. 13A, an anneal process can be performed to anneal the first semiconductor die 900 and the second semiconductor die 700 while the first bonding pads 488 face the second bonding pads 388 and while the first semiconductor die 900 contacts the second semiconductor die 700. If the optional first dielectric liner 472 and/or the optional first dielectric capping layer 476 is present, the first bonding pads 488 thermally expand during the anneal process and fill volumes of the openings through the optional first dielectric liner 472 and/or the optional first dielectric capping layer 476 during the anneal process. If the optional second dielectric liner 372 and/or the optional second dielectric capping layer 376 is present, the second bonding pads 388 thermally expand during the anneal process and fill volumes of the openings through the optional second dielectric liner 372 and/or the optional second dielectric capping layer 376 during the anneal process.

Each mating pair of the first bonding pad 488 and the second bonding pad 388 contact each other, and diffusion of metal atoms occur at interfaces between the mating pairs of the first bonding pads 488 and the second bonding pads 388. Grain growth of the material of the first bonding pads 488 and the second bonding pads 388 occur across the bonding interfaces between the first bonding pads 488 and the second bonding pads 388, and metal-to-metal bonding occurs between each mating pair of the first bonding pads 488 and the second bonding pads 388. In one embodiment, the first metallic capping liner 485 of each of the first bonding pads 488 may comprise a horizontal surface that directly contacts, and provides metal-to-metal bonding with, a horizontal surface of a respective one of the second bonding pads 388. In one embodiment, the second metallic capping liner 385 of each of the second bonding pads 388 may comprise a horizontal surface that directly contacts, and provides metal-to-metal bonding with, a horizontal surface of a respective one of the first bonding pads 488. In one embodiment, the first metallic capping liners 485 may be bonded to a respective one of the second metallic capping liners 385.

Generally, the fifth exemplary structure can include a bonded assembly, which can comprise: a first semiconductor die 900 comprising a first substrate 908, first semiconductor devices 920, and first bonding pads 488 that are electrically connected to a respective node of the first semiconductor devices 920 and laterally surrounded by a first pad-level dielectric layer 471, wherein the first pad-level dielectric layer 471 comprises a first low-k dielectric layer 972 having a dielectric constant of 2.6 or less; and a second semiconductor die 700 comprising a second substrate 708, second semiconductor devices 720, and second bonding pads 388 that are electrically connected to a respective node of the second semiconductor devices 720 and laterally surrounded by a second pad-level dielectric layer 371, wherein each of the second bonding pads 388 is bonded to a respective one of the first bonding pads 488.

In one embodiment, each of the first bonding pads 488 comprises a first metallic plate 484 and a first metallic capping liner 485 contacting a distal planar surface and sidewall surfaces of the first metallic plate 484, the distal planar surface being more distal from the first substrate 908 than the sidewall surfaces of the first metallic plate 484 are from the first substrate 908. Each of the first metallic capping liners 485 comprises a horizontal surface that directly contacts, and provides metal-to-metal bonding with, a horizontal surface of a respective one of the second bonding pads 388. In one embodiment, each of the first metallic capping liners 385 comprises a horizontally-extending portion contacting the distal planar surface of a respective one of the first metallic plates 484 and a tubular portion contacting the sidewalls of the respective one of the first metallic plates 488 and having a same thickness (as measured laterally) as the horizontally-extending portion.

In one embodiment, the first semiconductor die 900 further comprises a first dielectric capping layer contacting a distal horizontal surface of the first low-k dielectric layer, wherein the first bonding pads vertically extend through openings in the first dielectric capping layer 476 and contact sidewalls of the openings in the first dielectric capping layer 476. In one embodiment, the second semiconductor die 700 comprises: a second low-k dielectric layer 772 having a dielectric constant of 2.6 or less laterally surrounding the second bonding pads 388; and a second dielectric capping layer 376 located on the second low-k dielectric layer 772 and contacting the first dielectric capping layer 476, wherein the second bonding pads 388 vertically extend through openings in the second dielectric capping layer 376 and contact sidewalls of the openings in the second dielectric capping layer 376. In one embodiment, the first low-k dielectric layer and the second low-k dielectric layer have a dielectric constant of 1.7 to 2.6.

In one embodiment, the first pad-level dielectric layer 471 further comprises a first dielectric liner 472 comprising vertically-extending portions that laterally surround, and contact, a respective one of the first bonding pads 488 and a horizontally-extending portion adjoined to proximal ends of the vertically-extending. In one embodiment, a vertical distance between the horizontally-extending portion of the first dielectric liner 472 and the first substrate 908 is less than, or is equal to, a vertical distance between each of the first bonding pads 488 and the first substrate 908.

In one embodiment, each of the vertically-extending portions of the first dielectric liner 472 comprises a straight outer sidewall segment that vertically extends parallel to a sidewall of a respective one of the first bonding pads 488 and a convex outer sidewall segment that is adjoined to a distal end of the straight outer sidewall segment and contacts a concave surface segment of the first low-k dielectric layer 972.

Generally, the thicknesses of the optional first dielectric liner 472, the optional first dielectric capping layer 476, the optional second dielectric liner 372, and the optional second dielectric capping layer 376 can be selected such that the volume of each opening through the optional first dielectric liner 472, the optional first dielectric capping layer 476, the optional second dielectric liner 372, and the optional second dielectric capping layer 376 is filled with a respective bonded pair of a first bonding pads 488 and a second bonding pad 388.

Figure 13B:
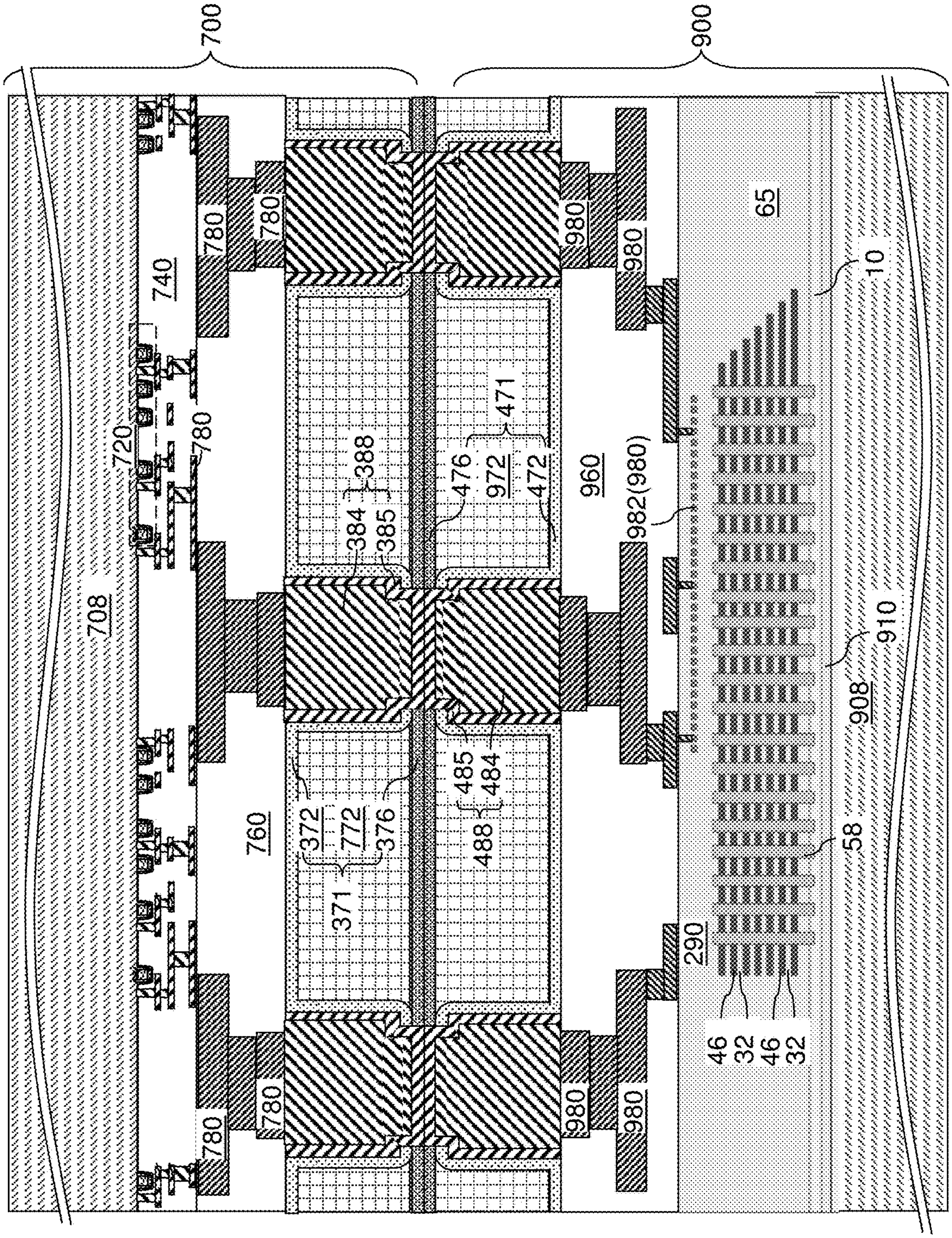
FIG. 13B is a vertical cross-sectional view of a second configuration of the fifth exemplary structure after bonding the second semiconductor die to the first semiconductor die according to the fifth embodiment of the present disclosure.

Referring to FIG. 13B, a second configuration of the fifth exemplary structure can be derived from the first configuration of the fifth exemplary structure illustrated in FIG. 13A by omitting formation of the first metallic adhesion liners 483 and/or by omitting formation of the second metallic adhesion liners 383.

Figure 14:
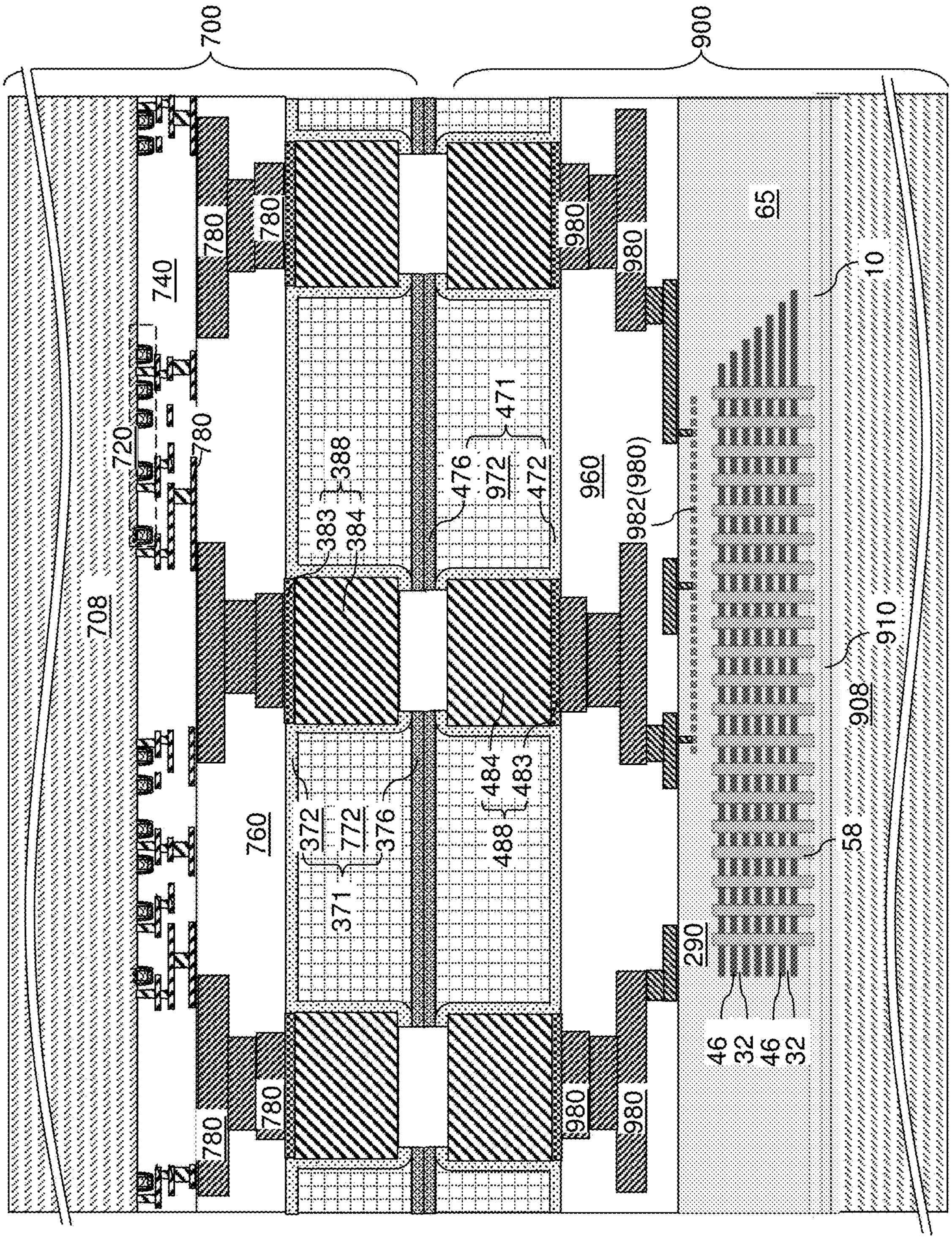
FIG. 14 is a vertical cross-sectional view of a third configuration of the fifth exemplary structure after the first semiconductor die and the second semiconductor die are aligned for bonding according to the fifth embodiment of the present disclosure.

Referring to FIG. 14, a third configuration of the fifth exemplary structure is illustrated after the first semiconductor die 900 and the second semiconductor die 700 are aligned for bonding. The third configuration of the fifth exemplary structure can be derived from the first configuration or the second configuration of the fifth exemplary structure by omitting formation of the first metallic capping layers 485 and/or by omitting formation of the second metallic capping layers 385.

Figure 15A:
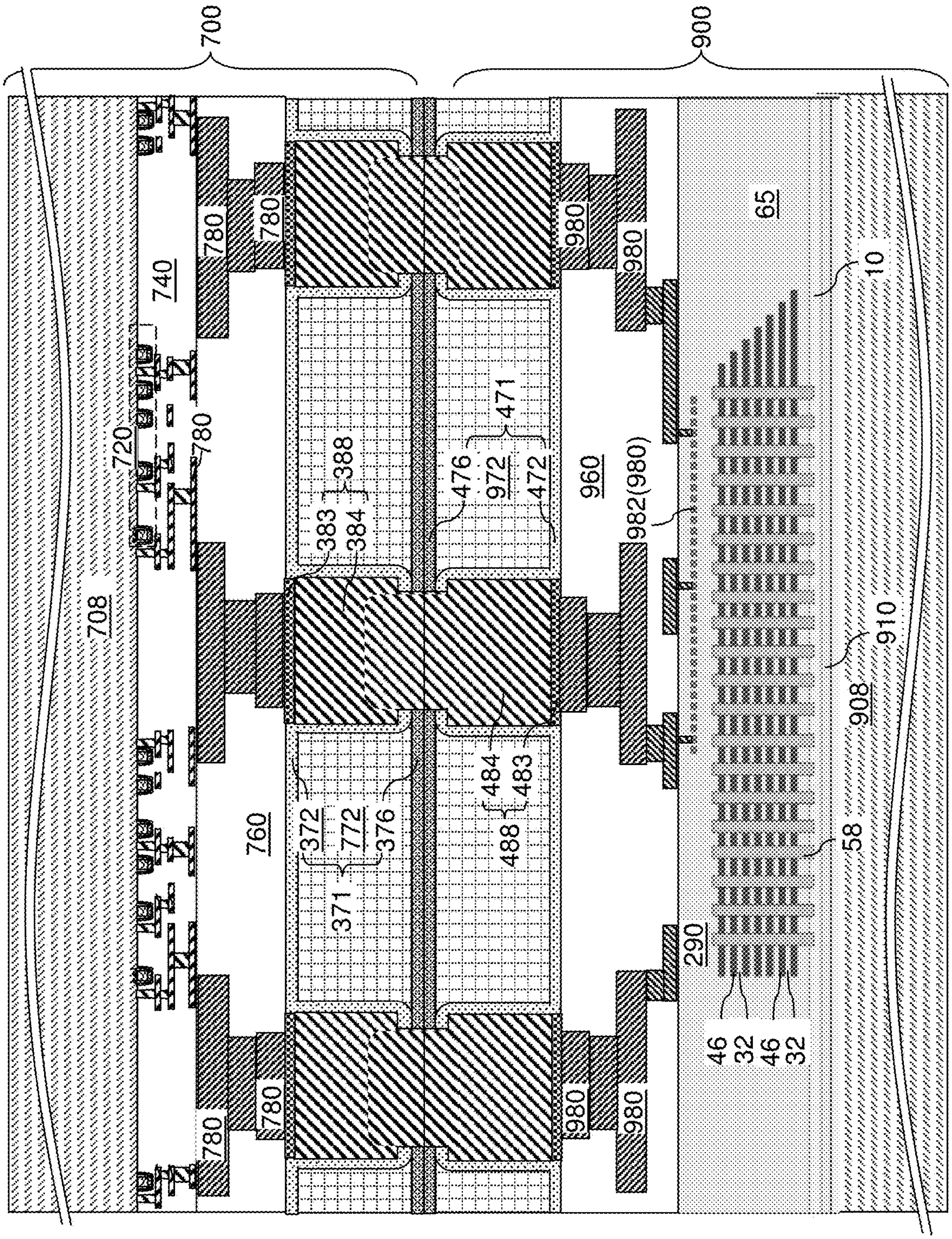
FIG. 15A is a vertical cross-sectional view of the third configuration of the fifth exemplary structure after bonding the second semiconductor die to the first semiconductor die according to the fifth embodiment of the present disclosure.

Referring to FIG. 15A, the third configuration of the fifth exemplary structure is illustrated after bonding the second semiconductor die 700 to the first semiconductor die 900. In this case, the first metal plates 484 are directed bonded to a respective one of the second metal pads 388, and/or the second metal plates 384 are bonded to a respective one of the first metal pads 488. In one embodiment, the first metal plates 484 may be bonded to a respective one of the second metal plates 384.

Figure 15B:
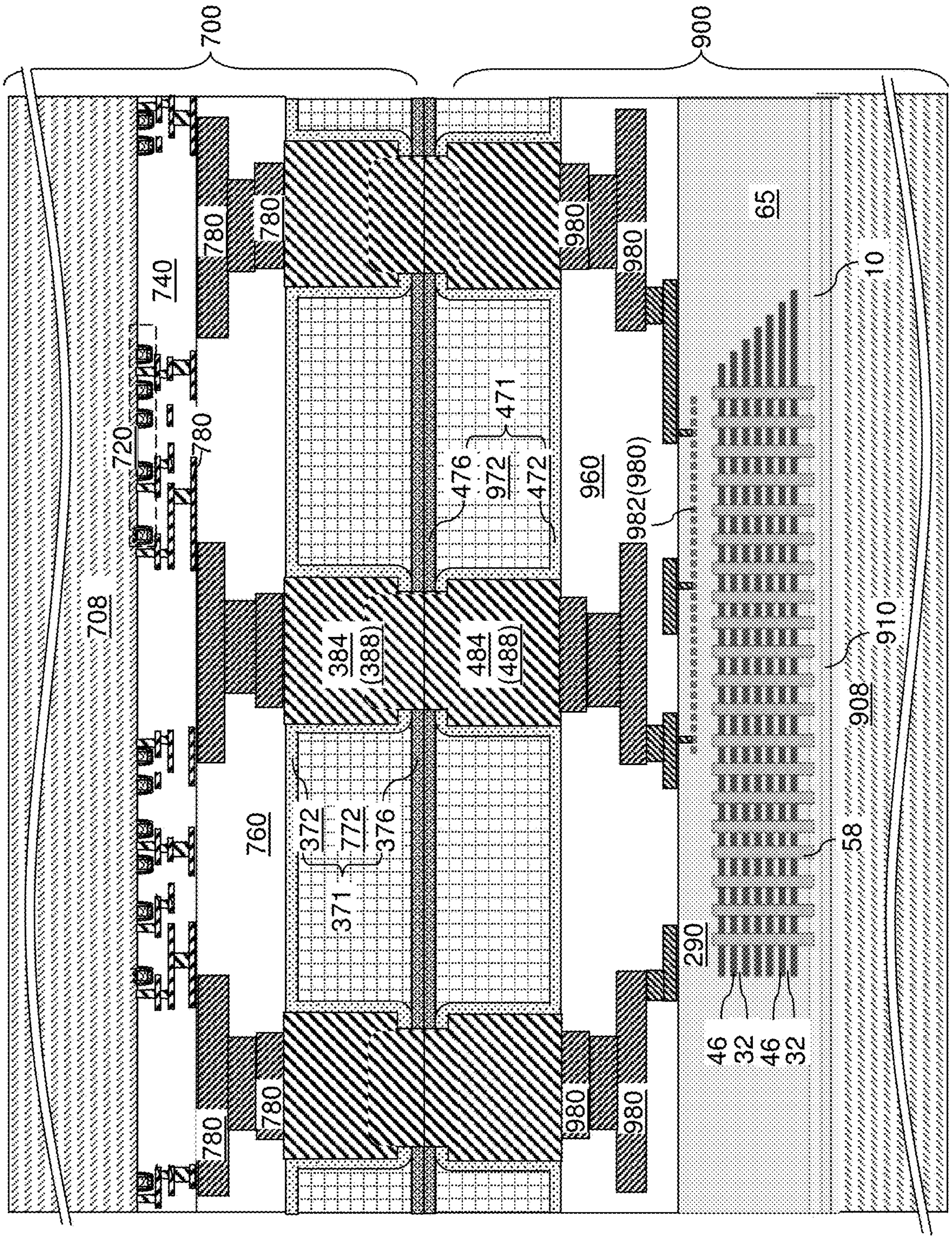
FIG. 15B is a vertical cross-sectional view of a fourth configuration of the fifth exemplary structure after bonding the second semiconductor die to the first semiconductor die according to the fifth embodiment of the present disclosure.

Referring to FIG. 15B, a fourth configuration of the fifth exemplary structure may be derived from the third configuration of the fifth exemplary structure illustrated in FIG. 15A by omitting formation of the first metallic adhesion liners 483 and/or by omitting formation of the second metallic adhesion liners 383.

Figure 16:
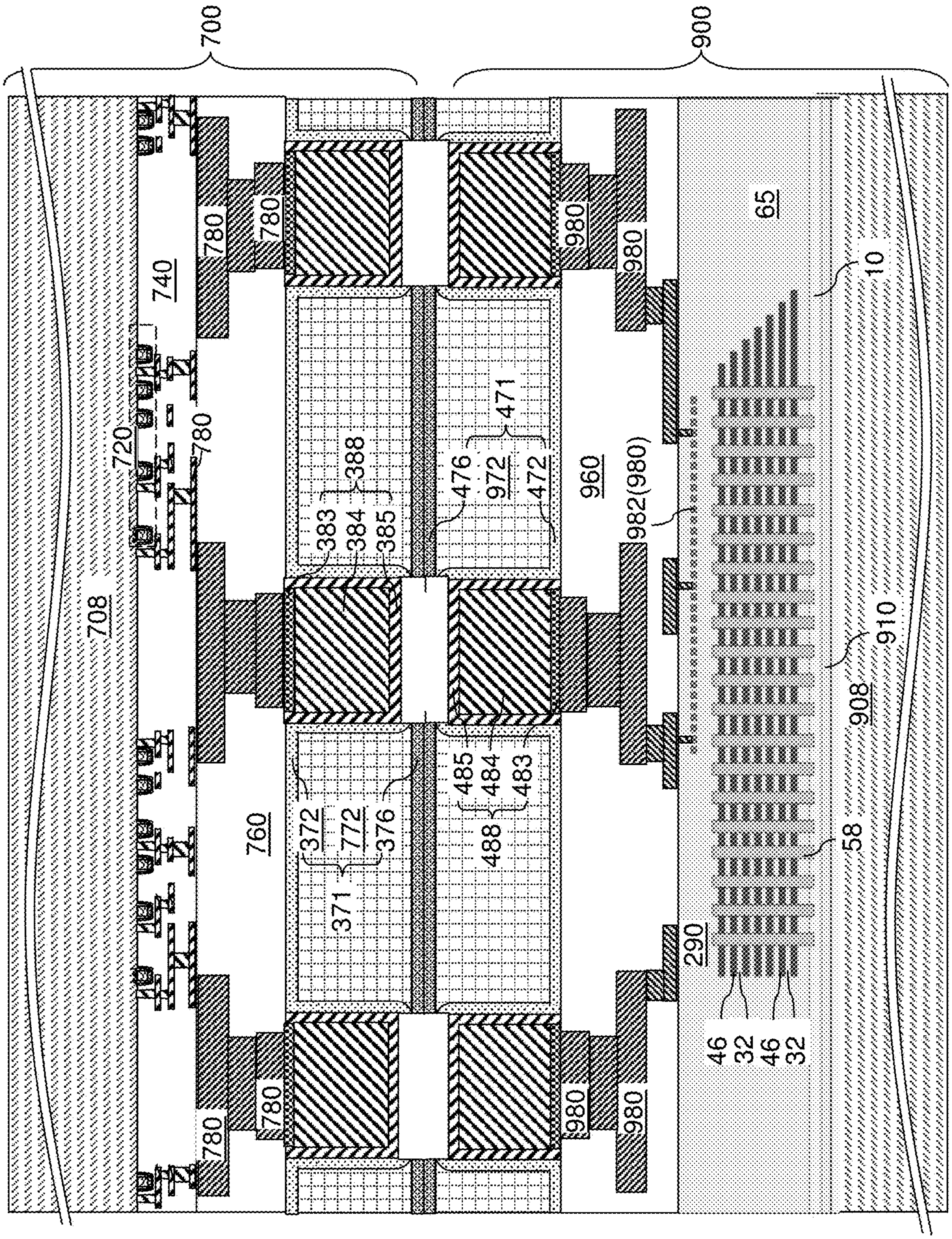
FIG. 16 is a vertical cross-sectional view of a fifth configuration of the fifth exemplary structure after the first semiconductor die and the second semiconductor die are aligned for bonding according to the fifth embodiment of the present disclosure.

Referring to FIG. 16 is a vertical cross-sectional view of a fifth configuration of the fifth exemplary structure is illustrated after the first semiconductor die 900 and the second semiconductor die 700 are aligned for bonding. The fifth configuration of the fifth exemplary structure can be derived from the first configurations of the fifth exemplary structure by increasing the size of the openings through the first dielectric liner 472 and/or through the first dielectric capping layer 476 such that the entire top surface of at least one, or each, of the first bonding pads 488 is physically exposed, and/or by increasing the size of the openings through the second dielectric liner 372 and/or through the second dielectric capping layer 376 such that the entire top surface of at least one, or each, of the second bonding pads 388 is physically exposed.

Figure 17A:
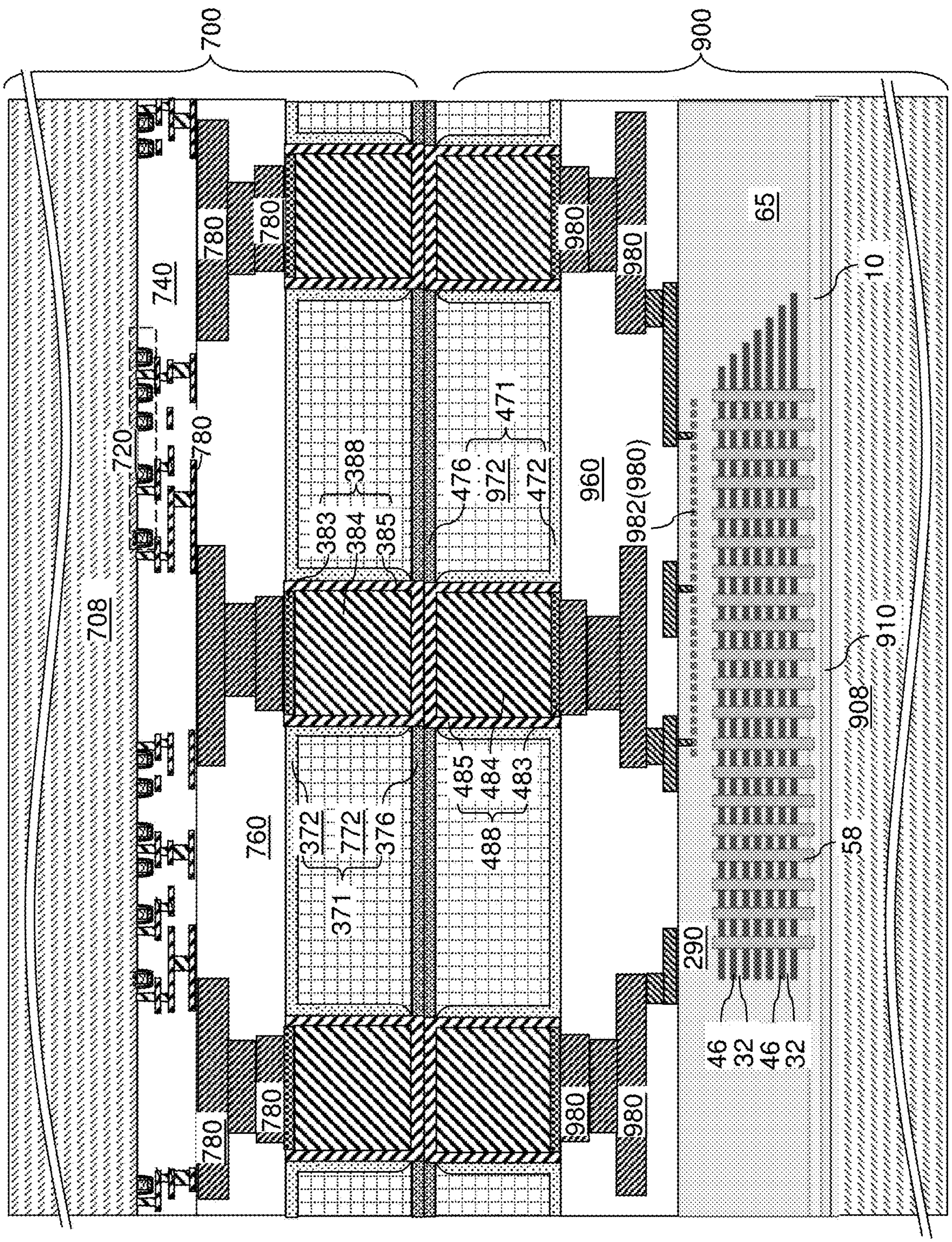
FIG. 17A is a vertical cross-sectional view of the fifth configuration of the fifth exemplary structure after bonding the second semiconductor die to the first semiconductor die according to the fifth embodiment of the present disclosure.

Referring to FIG. 17A, the fifth configuration of the fifth exemplary structure is illustrated after bonding the second semiconductor die 700 to the first semiconductor die 900.

Figure 17B:
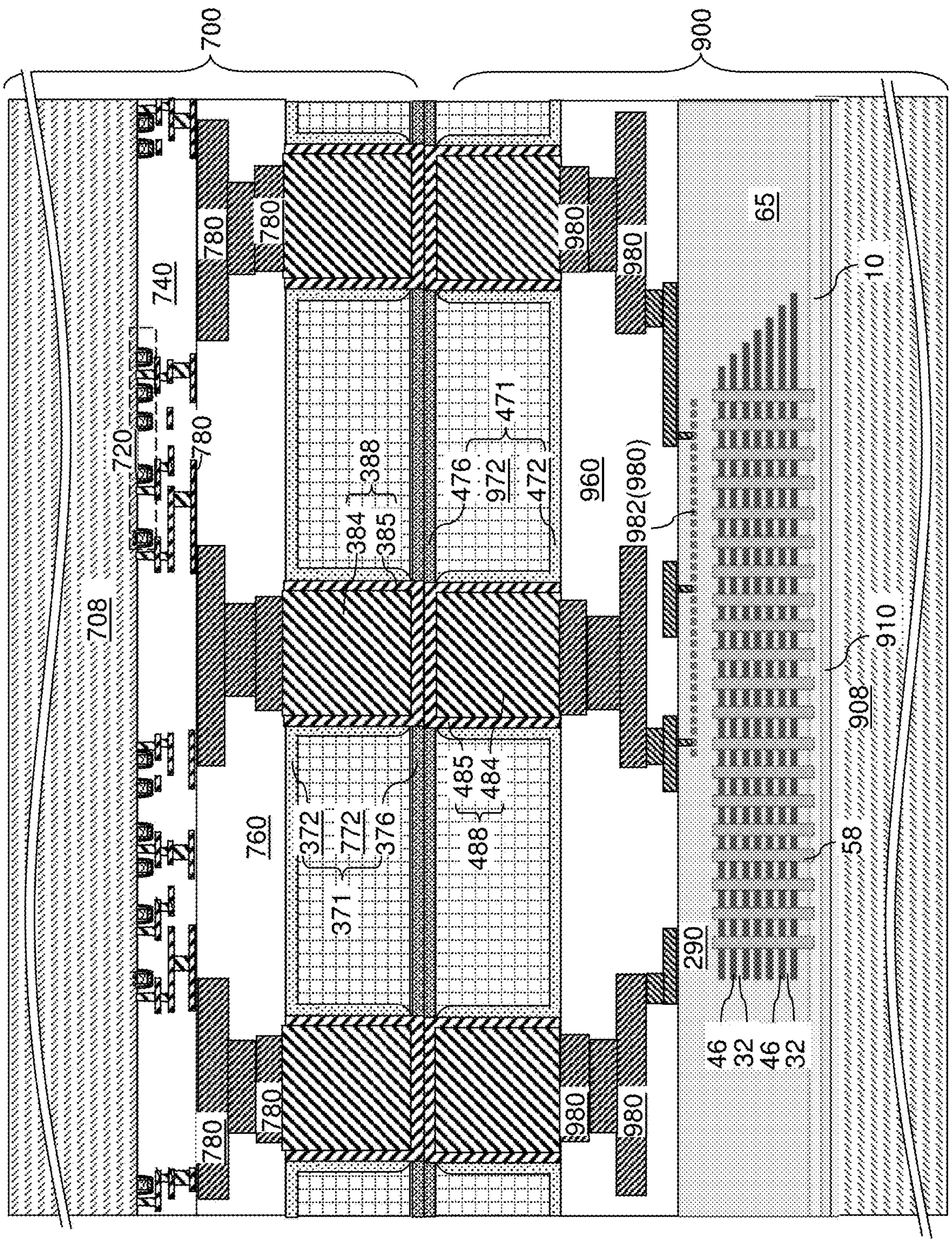
FIG. 17B is a vertical cross-sectional view of a sixth configuration of the fifth exemplary structure after bonding the second semiconductor die to the first semiconductor die according to the fifth embodiment of the present disclosure.

Referring to FIG. 17B, a sixth configuration of the fifth exemplary structure can be derived from the second configuration of the fifth exemplary structure by increasing the size of the openings through the first dielectric liner 472 and/or through the first dielectric capping layer 476 such that the entire top surface of at least one, or each, of the first bonding pads 488 is physically exposed prior to bonding, and/or by increasing the size of the openings through the second dielectric liner 372 and/or through the second dielectric capping layer 376 such that the entire top surface of at least one, or each, of the second bonding pads 388 is physically exposed prior to bonding.

Figure 18:
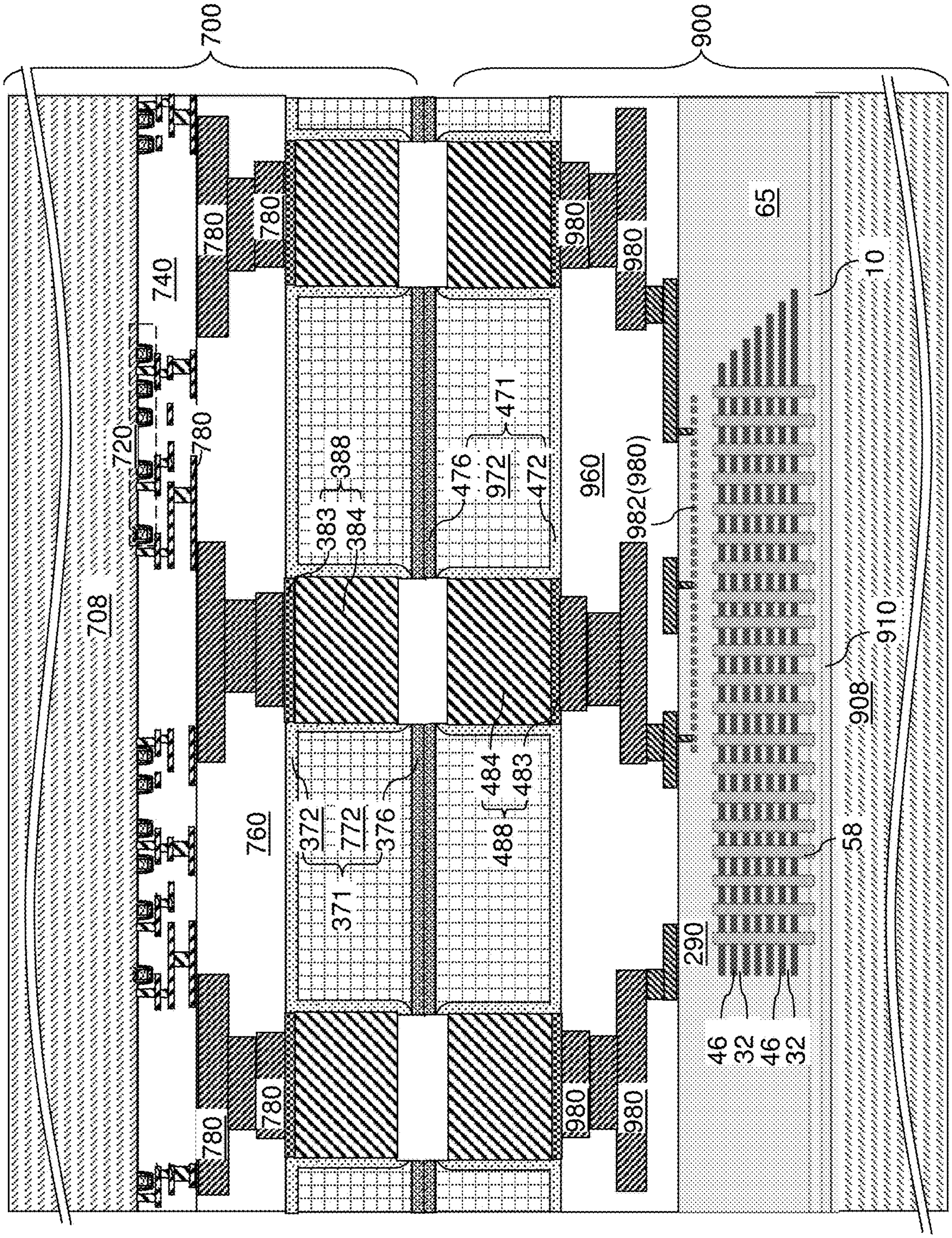
FIG. 18 is a vertical cross-sectional view of a seventh configuration of the fifth exemplary structure after the first semiconductor die and the second semiconductor die are aligned for bonding according to the fifth embodiment of the present disclosure.

Referring to FIG. 18 is a vertical cross-sectional view of a seventh configuration of the fifth exemplary structure is illustrated after the first semiconductor die 900 and the second semiconductor die 700 are aligned for bonding. The seventh configuration of the fifth exemplary structure can be derived from the third configuration of the fifth exemplary structure by increasing the size of the openings through the first dielectric liner 472 and/or through the first dielectric capping layer 476 such that the entire top surface of at least one, or each, of the first bonding pads 488 is physically exposed, and/or by increasing the size of the openings through the second dielectric liner 372 and/or through the second dielectric capping layer 376 such that the entire top surface of at least one, or each, of the second bonding pads 388 is physically exposed.

Figure 19A:
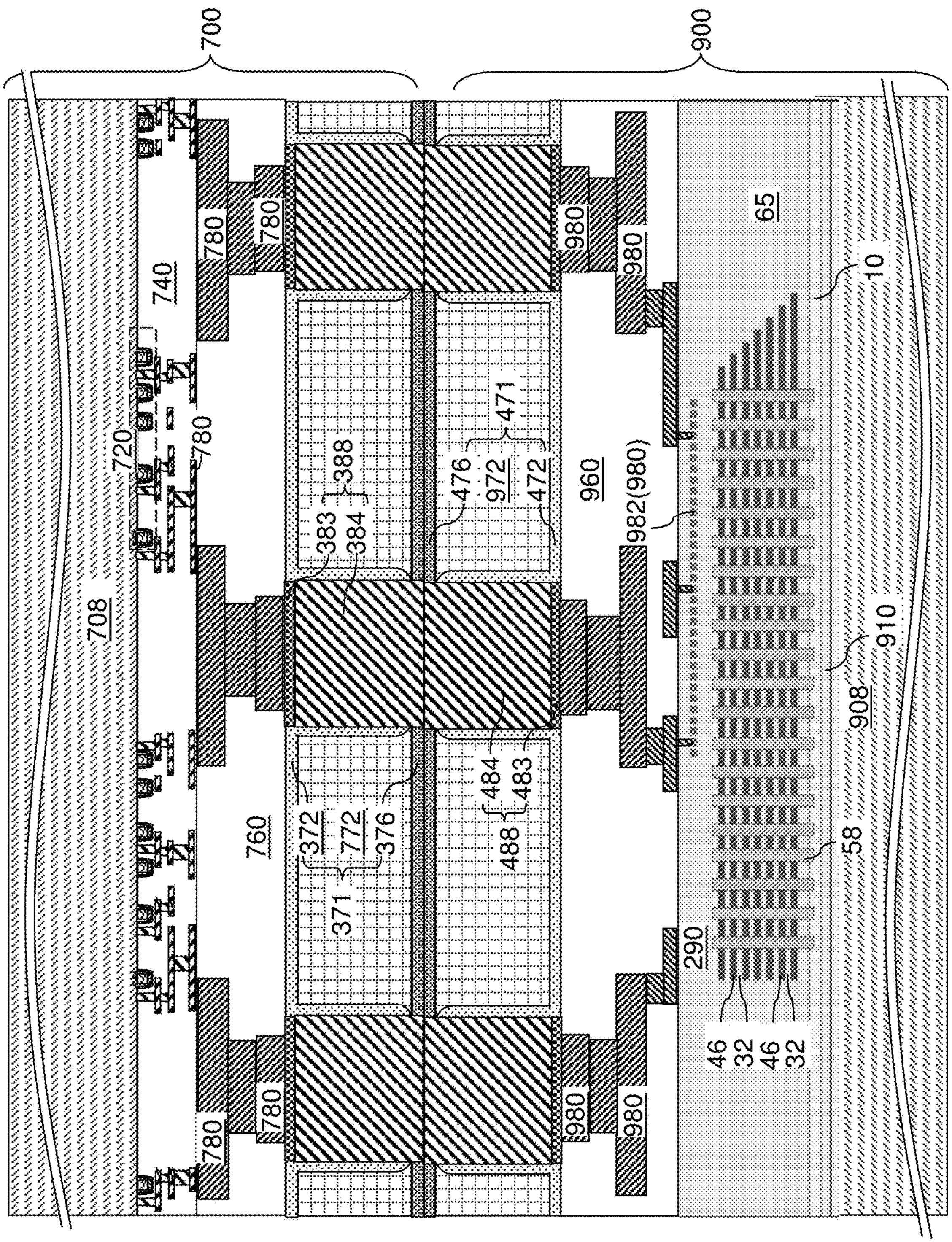
FIG. 19A is a vertical cross-sectional view of the seventh configuration of the fifth exemplary structure after bonding the second semiconductor die to the first semiconductor die according to the fifth embodiment of the present disclosure.

Referring to FIG. 19A, the seventh configuration of the fifth exemplary structure is illustrated after bonding the second semiconductor die 700 to the first semiconductor die 900.

Figure 19B:
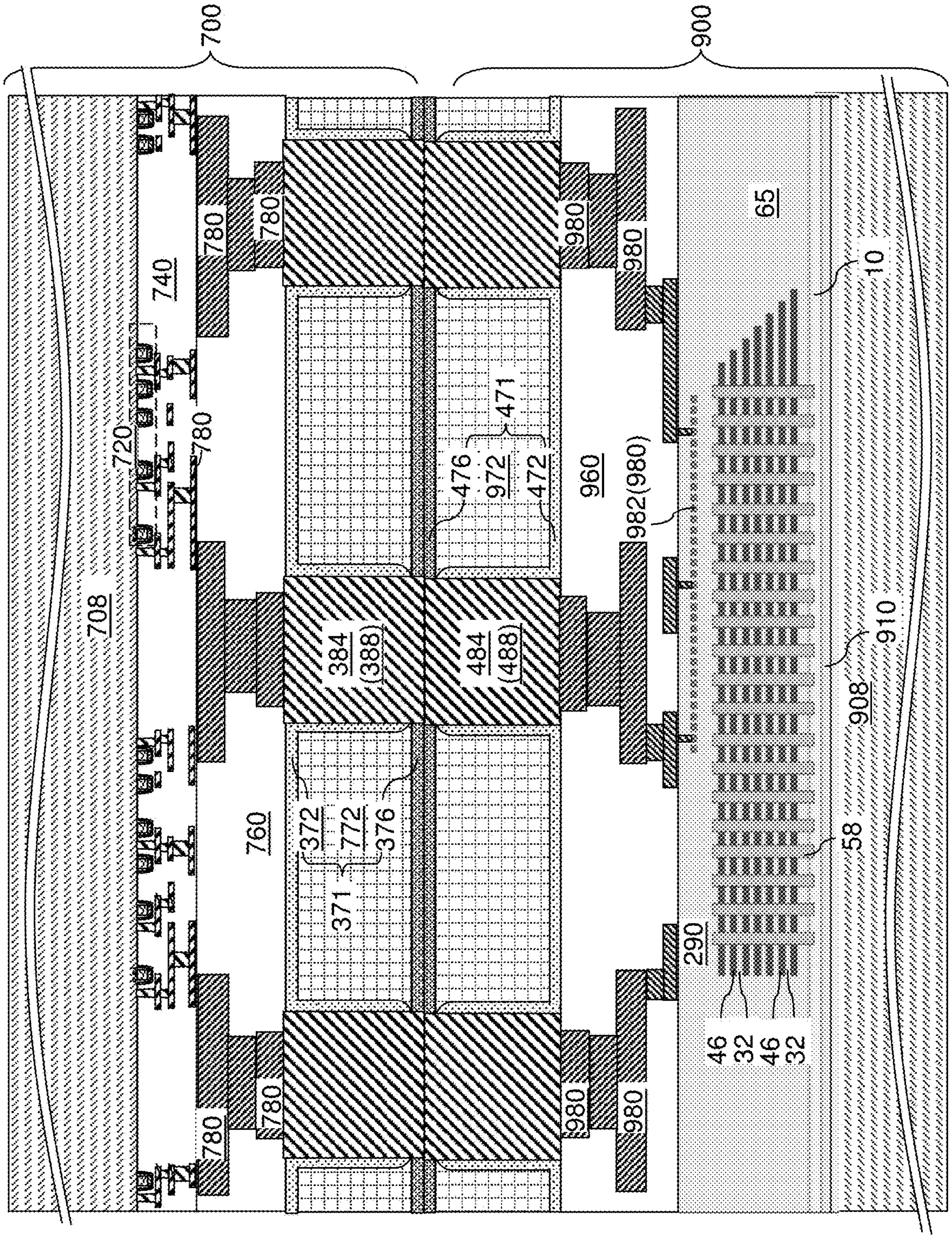
FIG. 19B is a vertical cross-sectional view of an eighth configuration of the fifth exemplary structure after bonding the second semiconductor die to the first semiconductor die according to the fifth embodiment of the present disclosure.

Referring to FIG. 19B, an eighth configuration of the fifth exemplary structure can be derived from the fourth configuration of the fifth exemplary structure by increasing the size of the openings through the first dielectric liner 472 and/or through the first dielectric capping layer 476 such that the entire top surface of at least one, or each, of the first bonding pads 488 is physically exposed prior to bonding, and/or by increasing the size of the openings through the second dielectric liner 372 and/or through the second dielectric capping layer 376 such that the entire top surface of at least one, or each, of the second bonding pads 388 is physically exposed prior to bonding.

Figure 20:
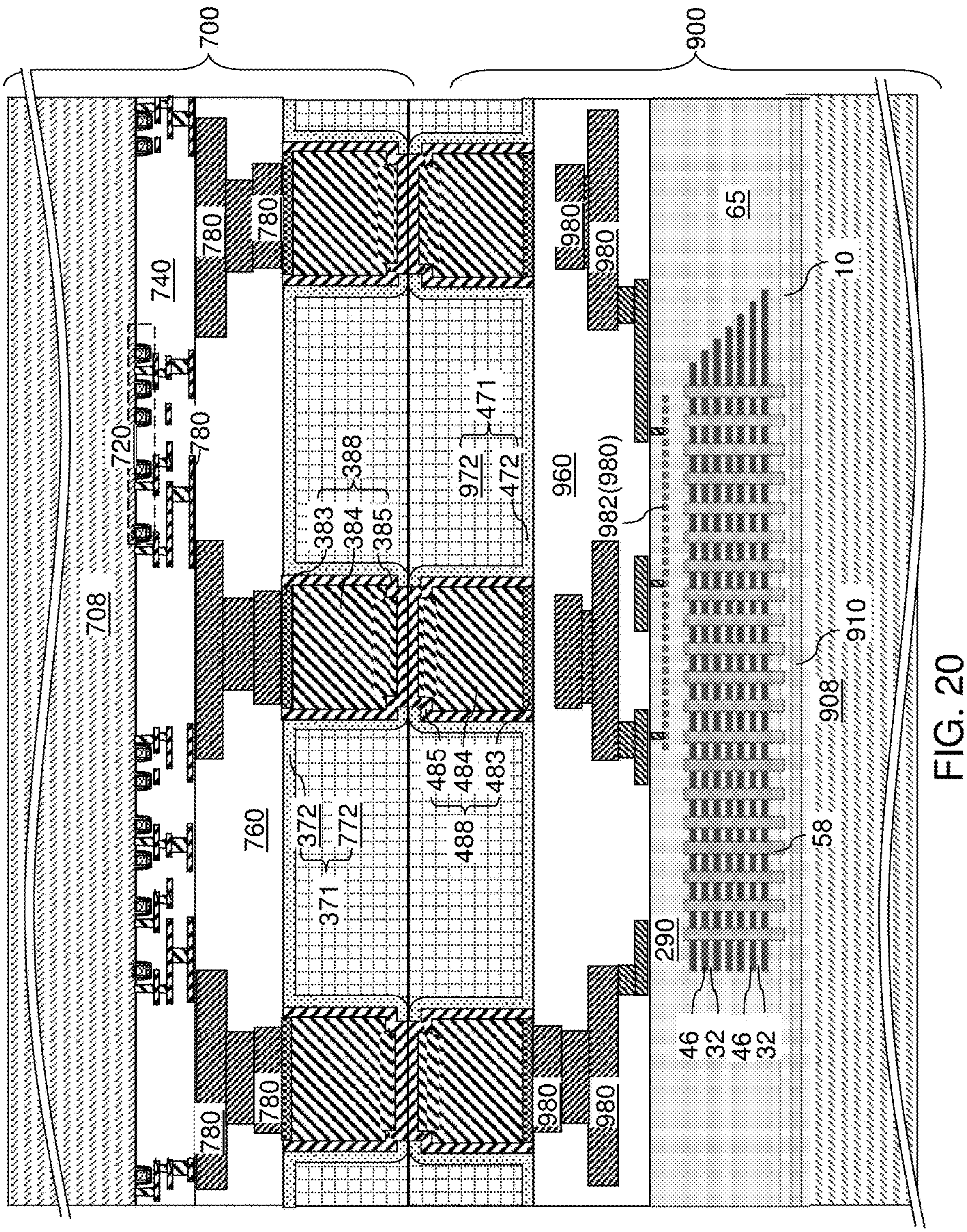
FIG. 20 is a vertical cross-sectional view of a ninth configuration of the fifth exemplary structure after the first semiconductor die and the second semiconductor die are aligned for bonding according to the fifth embodiment of the present disclosure.

Referring to FIG. 20, a ninth configuration of the fifth exemplary structure can be derived from the first configuration or the fifth configuration of the fifth exemplary structure by omitting formation of the first dielectric capping layer 476 and/or the second dielectric capping layer 376. The first low-k dielectric layer 972 may contact the second semiconductor die 700 and/or the second low-k dielectric layer 772 may contact the first semiconductor die 900. In one embodiment, the first low-k dielectric layer 972 may contact the second low-k dielectric layer 772.

Figure 21:
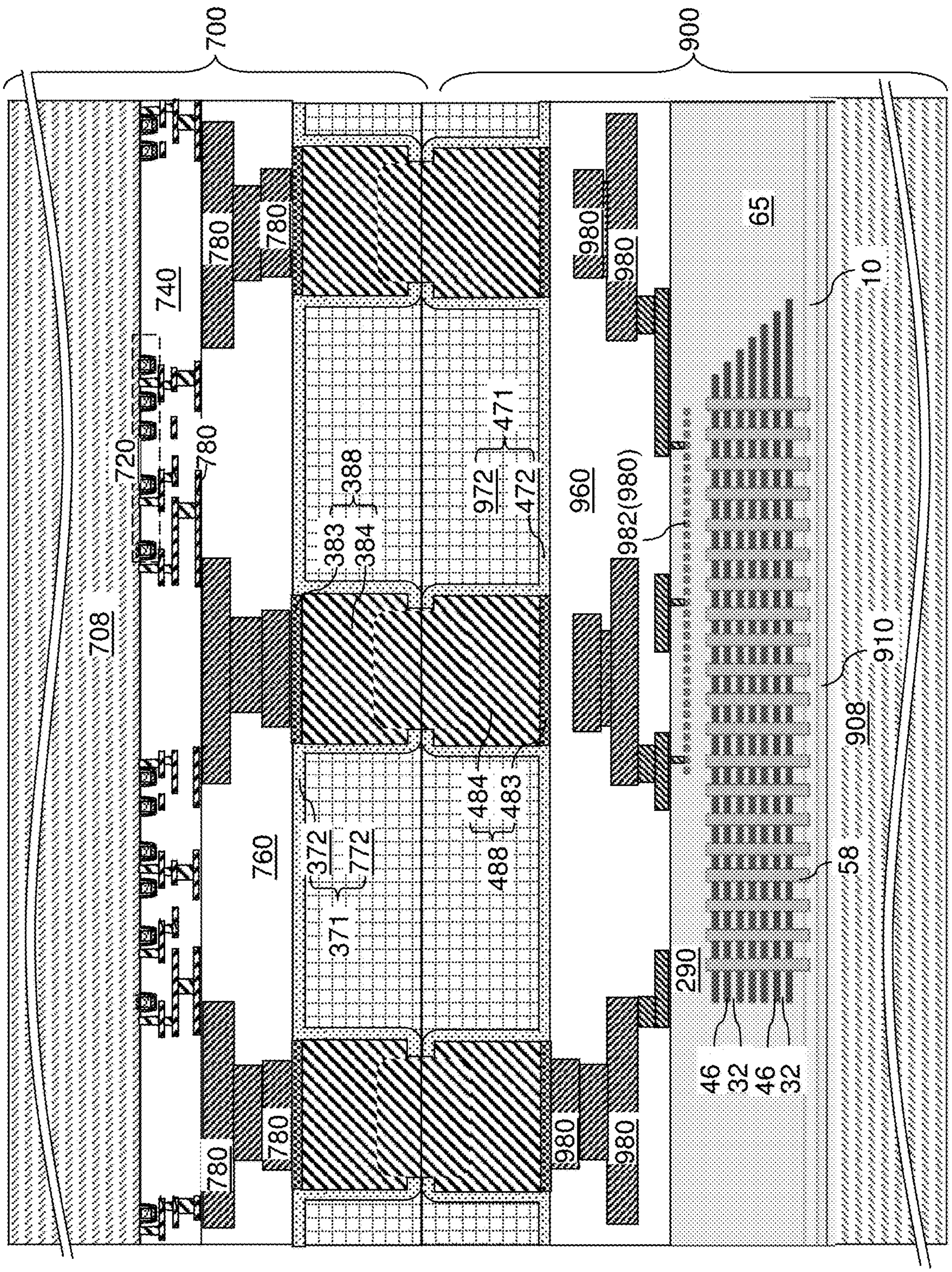
FIG. 21 is a vertical cross-sectional view of a tenth configuration of the fifth exemplary structure after the first semiconductor die and the second semiconductor die are aligned for bonding according to the fifth embodiment of the present disclosure.

Referring to FIG. 21, a tenth configuration of the fifth exemplary structure can be derived from the second configuration or the sixth configuration of the fifth exemplary structure by omitting formation of the first dielectric capping layer 476 and/or the second dielectric capping layer 376. The first low-k dielectric layer 972 may contact the second semiconductor die 700 and/or the second low-k dielectric layer 772 may contact the first semiconductor die 900. In one embodiment, the first low-k dielectric layer 972 may contact the second low-k dielectric layer 772.

Figure 22:
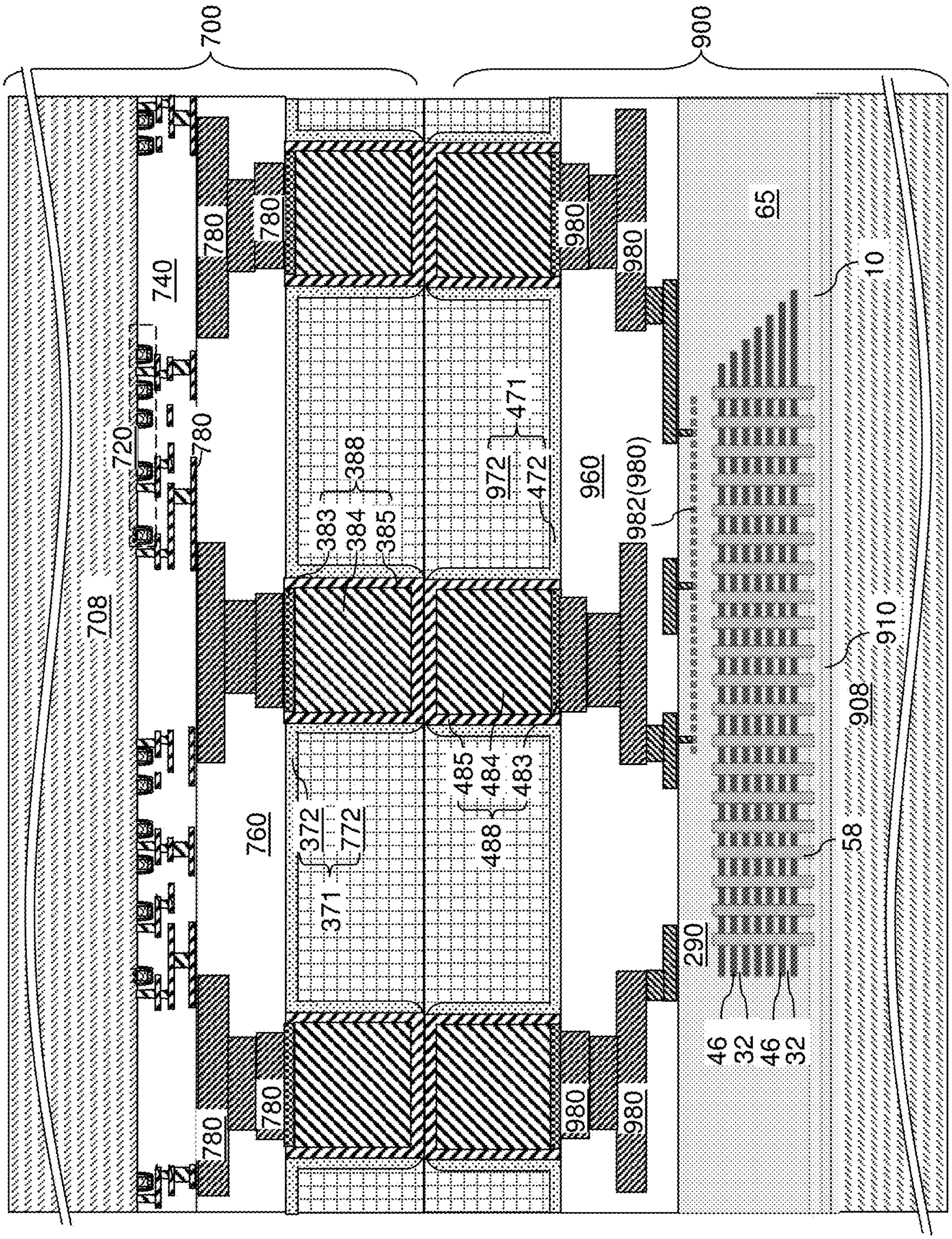
FIG. 22 is a vertical cross-sectional view of an eleventh configuration of the fifth exemplary structure after the first semiconductor die and the second semiconductor die are aligned for bonding according to the fifth embodiment of the present disclosure.

Referring to FIG. 22, an eleventh configuration of the fifth exemplary structure can be derived from the third configuration or the seventh configuration of the fifth exemplary structure by omitting formation of the first dielectric capping layer 476 and/or the second dielectric capping layer 376. The first low-k dielectric layer 972 may contact the second semiconductor die 700 and/or the second low-k dielectric layer 772 may contact the first semiconductor die 900. In one embodiment, the first low-k dielectric layer 972 may contact the second low-k dielectric layer 772.

Figure 23:
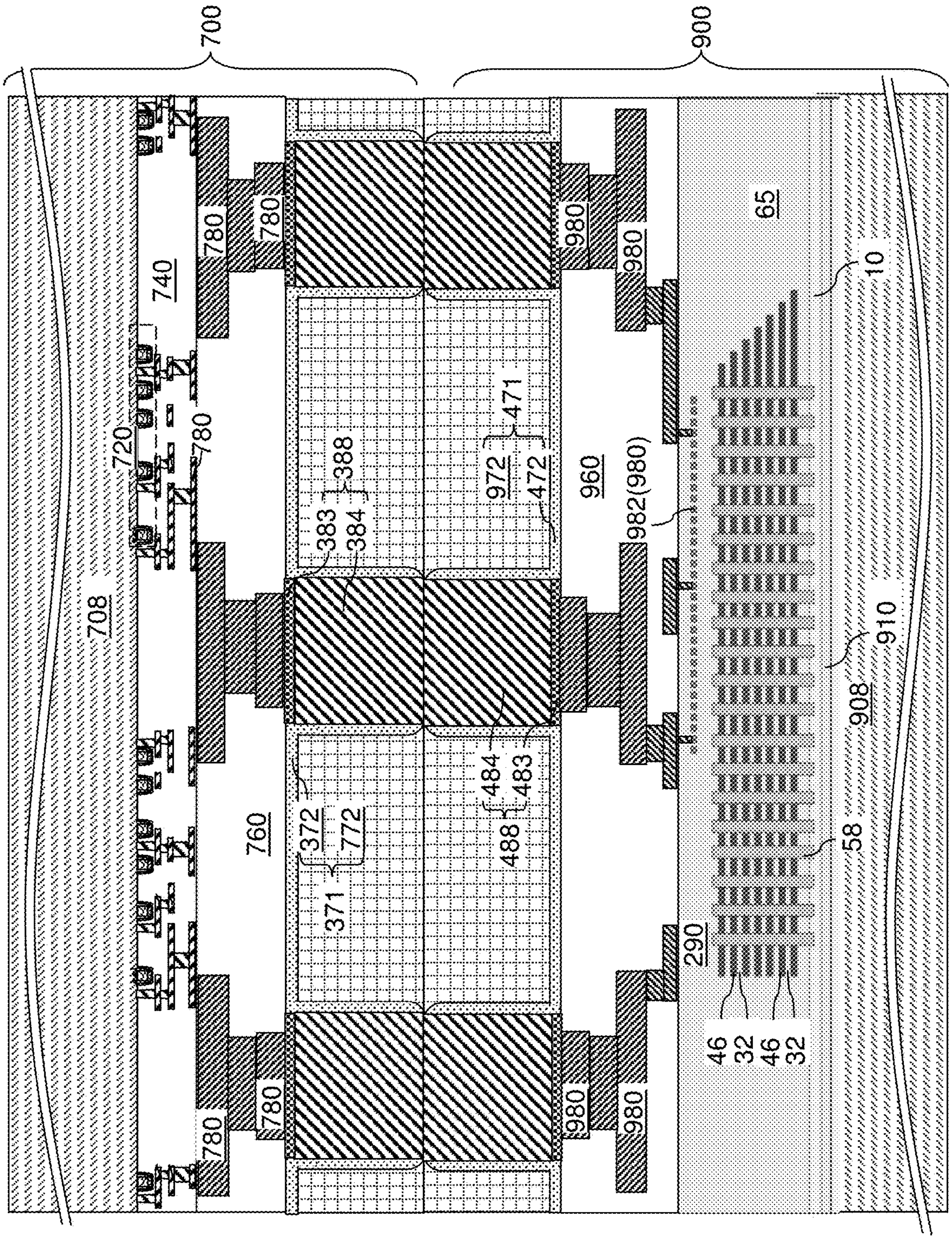
FIG. 23 is a vertical cross-sectional view of a twelfth configuration of the fifth exemplary structure after the first semiconductor die and the second semiconductor die are aligned for bonding according to the fifth embodiment of the present disclosure.

Referring to FIG. 23, a twelfth configuration of the fifth exemplary structure can be derived from the fourth configuration or the eighth configuration of the fifth exemplary structure by omitting formation of the first dielectric capping layer 476 and/or the second dielectric capping layer 376. The first low-k dielectric layer 972 may contact the second semiconductor die 700 and/or the second low-k dielectric layer 772 may contact the first semiconductor die 900. In one embodiment, the first low-k dielectric layer 972 may contact the second low-k dielectric layer 772.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly, comprising:

a first semiconductor die comprising a first substrate, first semiconductor devices, and first bonding pads that are electrically connected to a respective node of the first semiconductor devices and laterally surrounded by a first pad-level dielectric layer, wherein the first pad-level dielectric layer comprises a first low-k dielectric layer comprising a dielectric material having a dielectric constant of 2.6 or less; and a second semiconductor die comprising a second substrate, second semiconductor devices, and second bonding pads that are electrically connected to a respective node of the second semiconductor devices and laterally surrounded by a second pad-level dielectric layer, wherein each of the second bonding pads is bonded to a respective one of the first bonding pads;

wherein the first pad-level dielectric layer further comprises a first dielectric liner comprising vertically-extending portions that laterally surround, and contact, a respective one of the first bonding pads and a horizontally-extending portion adjoined to proximal ends of the vertically-extending portions;

wherein a vertical distance between the horizontally-extending portion of the first dielectric liner and the first substrate is less than or is equal to a vertical distance between each of the first bonding pads and the first substrate; and wherein each of the vertically-extending portions of the first dielectric liner comprises a straight outer sidewall segment that vertically extends parallel to a sidewall of a respective one of the first bonding pads and a convex outer sidewall segment that is adjoined to a distal end of the straight outer sidewall segment and contacts a concave surface segment of the first low-k dielectric layer.

2. The bonded assembly of claim 1, wherein the first low-k dielectric layer comprises a first metal-organic framework (MOF) dielectric material.

3. The bonded assembly of claim 1, wherein the first low-k dielectric layer comprises a non-porous organosilicate glass material or a porous organosilicate glass material.

4. The bonded assembly of claim 1, wherein:

each of the first bonding pads comprises a first metallic plate and a first metallic capping liner contacting a distal planar surface and sidewall surfaces of the first metallic plate, the distal planar surface being more distal from the first substrate than the sidewall surfaces of the first metallic plate are from the first substrate; and each of the first metallic capping liners comprises a horizontal surface that directly contacts and provides metal-to-metal bonding with a horizontal surface of a respective one of the second bonding pads.

5. The bonded assembly of claim 4, wherein each of the first metallic capping liners further comprises a horizontally-extending portion contacting the distal planar surface of a respective one of the first metallic plates and a tubular portion contacting the sidewalls of the respective one of the first metallic plates and having a same thickness as the horizontally-extending portion.

6. The bonded assembly of claim 1, wherein the first semiconductor die comprises a first dielectric capping layer contacting a distal horizontal surface of the first low-k dielectric layer, and wherein the first bonding pads vertically extend through openings in the first dielectric capping layer and contact sidewalls of the openings in the first dielectric capping layer.

7. The bonded assembly of claim 6, wherein the second semiconductor die further comprises:

a second low-k dielectric layer laterally surrounding the second bonding pads and comprising a dielectric material having a dielectric constant of 2.6 or less and selected from a metal-organic framework (MOF) material, a nonporous organosilicate glass material, or a porous organosilicate glass material; and a second dielectric capping layer located on the second low-k dielectric layer and contacting the first dielectric capping layer, wherein the second bonding pads vertically extend through openings in the second dielectric capping layer and contact sidewalls of the openings in the second dielectric capping layer.

8. The bonded assembly of claim 7, wherein the second dielectric capping layer is bonded to the first dielectric capping layer by dielectric-to-dielectric bonding.

9. The bonded assembly of claim 7, wherein the first low-k dielectric layer and the second low-k dielectric layer have a dielectric constant of 1.7 to 2.6.

10. The bonded assembly of claim 1, wherein the first semiconductor devices comprise a three-dimensional memory device and the second semiconductor devices comprise a peripheral circuit for the three-dimensional memory device.

* * * * *